(12) United States Patent
Ueda et al.

(10) Patent No.: US 6,847,071 B2
(45) Date of Patent: Jan. 25, 2005

(54) SEMICONDUCTOR DEVICE

(75) Inventors: Michihito Ueda, Takatsuki (JP); Kenji Toyoda, Osaka (JP); Kiyoyuki Morita, Yawata (JP); Takashi Ohtsuka, Toyonaka (JP)

(73) Assignee: Matsushita Electric Industrial Co., LTD., Osaka (JP)

( * ) Notice: Subject to any disclaimer, the term of this patent is extended or adjusted under 35 U.S.C. 154(b) by 0 days.

(21) Appl. No.: 10/161,696

(22) Filed: Jun. 5, 2002

(65) Prior Publication Data
US 2002/0185690 A1 Dec. 12, 2002

(30) Foreign Application Priority Data

| Jun. 6, 2001 | (JP) | 2001-170583 |
| Jul. 23, 2001 | (JP) | 2001-221131 |
| Sep. 26, 2001 | (JP) | 2001-293793 |
| Oct. 29, 2001 | (JP) | 2001-330438 |

(51) Int. Cl.[7] ............... H01L 27/108; H01L 29/76; H01L 29/94; H01L 31/119
(52) U.S. Cl. ............ 257/295; 257/296; 257/532
(58) Field of Search ............ 257/295–310, 257/532; 438/253–254, 3

(56) References Cited

U.S. PATENT DOCUMENTS

| 5,220,202 A | 6/1993 | Isono et al. |
| 5,276,651 A | 1/1994 | Sakamoto |
| 5,498,888 A | 3/1996 | Ozawa |
| 5,621,336 A * | 4/1997 | Shibata et al. .......... 326/36 |
| 5,923,184 A | 7/1999 | Ooms et al. |
| 6,456,992 B1 | 9/2002 | Shibata et al. |

FOREIGN PATENT DOCUMENTS

| EP | 0 566 739 | 10/1993 |
| EP | 0 584 844 | 3/1994 |
| EP | 07106528 | 4/1995 |
| JP | 05-335506 | 12/1993 |
| JP | 06-125049 | 5/1994 |
| JP | 06-275790 | 9/1994 |
| JP | 07-106528 | 4/1995 |
| WO | WO 95/26570 | 10/1995 |
| WO | WO 96/30855 | 10/1996 |

* cited by examiner

Primary Examiner—Cuong Nguyen
(74) Attorney, Agent, or Firm—McDermott, Will & Emery

(57) ABSTRACT

In an electric potential generating device, a source of an N type MIS transistor is mutually connected to that of a P type MIS transistor and also connected to an output terminal. A drain of an N type MIS transistor 54 is connected to a power supply voltage supply portion for supplying power supply voltage VDD, and a drain of the P type MIS transistor is connected to a ground. In addition, a substrate potential of the N type MIS transistor is a ground voltage VSS, and that of a P type MIS transistor 56 is the power supply voltage VDD. Thus, it is constituted as a source follower circuit for taking output out of the source. It is possible, by utilizing this electric potential generating device, to obtain a logic transformation circuit for stably switching between NOR operation and NAND operation.

13 Claims, 42 Drawing Sheets

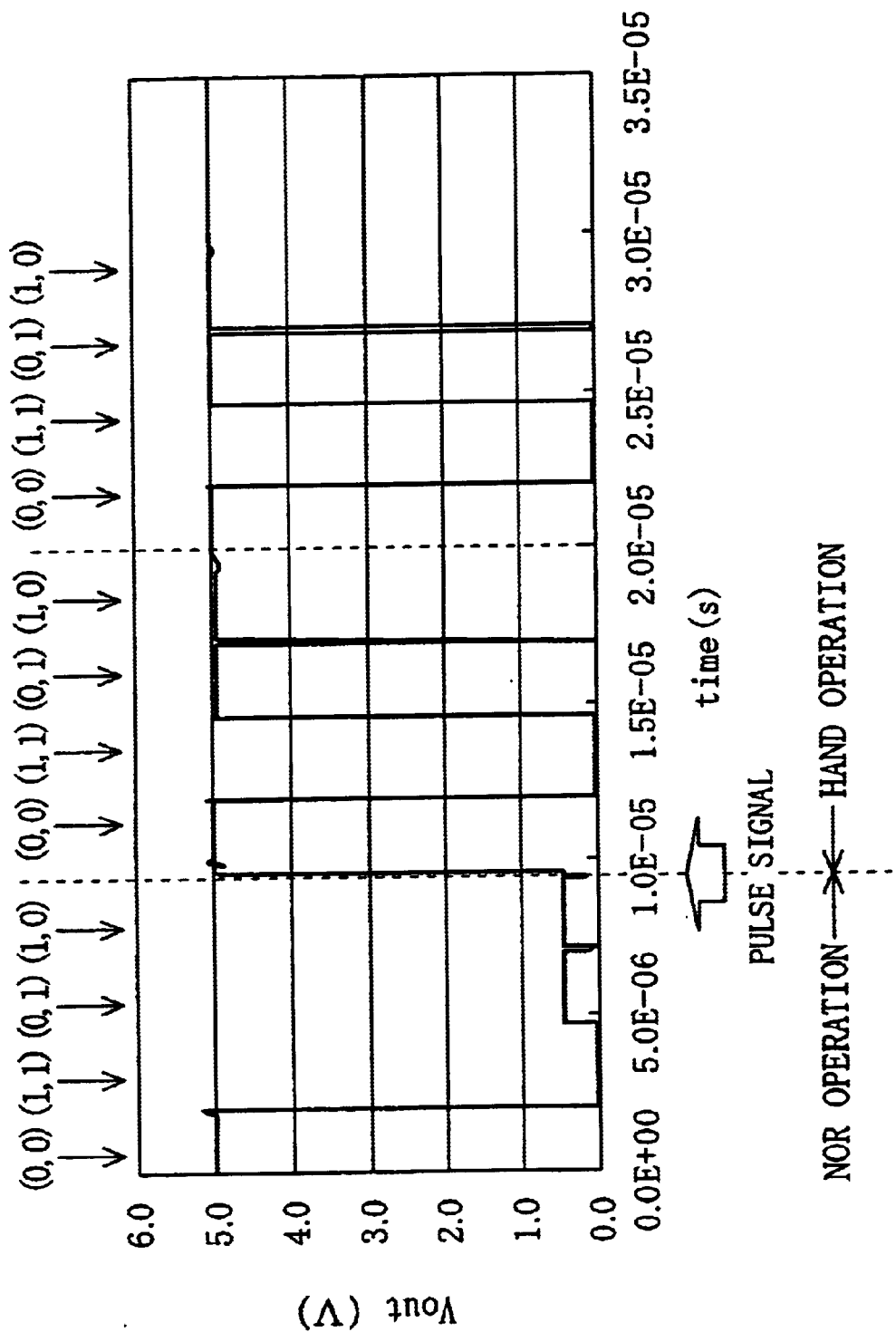

FIG. 41 PRIOR ART

| INPUT | | CHARGE AMOUNT | | | | OUTPUT |
|---|---|---|---|---|---|---|
| X1 | X2 | X1 | X2 | CR | $\phi F$ | Y |
| "0" | "0" | 0 | 0 | $-Q_0/2$ | $-Q_0/2$ | "1" |
| "0" | "1" | 0 | $Q_0$ | $-Q_0/2$ | $Q_0/2$ | "0" |
| "1" | "0" | $Q_0$ | 0 | $-Q_0/2$ | $Q_0/2$ | "0" |
| "1" | "1" | $Q_0$ | $Q_0$ | $-Q_0/2$ | $3Q_0/2$ | "0" |

FIG. 42 PRIOR ART

| INPUT | | CHARGE AMOUNT | | | | OUTPUT |
|---|---|---|---|---|---|---|
| X1 | X2 | X1 | X2 | CR | $\phi F$ | Y |
| "0" | "0" | 0 | 0 | $-3Q_0/2$ | $-3Q_0/2$ | "1" |
| "0" | "1" | 0 | $Q_0$ | $-3Q_0/2$ | $-Q_0/2$ | "1" |
| "1" | "0" | $Q_0$ | 0 | $-3Q_0/2$ | $-Q_0/2$ | "1" |
| "1" | "1" | $Q_0$ | $Q_0$ | $-3Q_0/2$ | $Q_0/2$ | "0" |

PULSE SIGNAL

SEMICONDUCTOR DEVICE

BACKGROUND OF THE INVENTION

The present invention relates to a semiconductor device, and in particular to the semiconductor device for functioning as a neuron element, an electric potential generating device, a logic transformation circuit and so on which are elements of an artificial neural network.

Semiconductor integrated circuit technologies have made remarkable progress in recent years, and various high-performance logical integrated circuits have been developed in addition to mere memory devices. However, it may also be said that these logical circuits have not made progress as to logic since the advent of LSI in that operation is performed by using a binary signal. While a current integrated circuit is capable of performing simple numerical calculation at a very high speed as to such binary operation, it has a disadvantage that the operation rather easy for a human being such as pattern recognition or image processing takes an enormous amount of time.

On the other hand, there is an ongoing research wherein, as the element capable of performing at a high speed this operation not suited to the LSI in the past, attempts are made to develop a computer for operating like brains of a living creature, that is, a neuro-computer. This neuro-computer has a structure in which a large number of neuron elements are connected like a neural network.

The neuron elements in the past were mostly manufactured with a CMIS device, and in that case, there is no learning ability of changing the operation of the circuit by learning. For instance, in Japanese Patent No. 3122756 specification, there is a description of a MIS type neuron element having a large number of input portions placed for capacity coupling to a gate electrode of MISFET. While this performs the operation of adding a product of signal strength and coupling strength of each of a plurality of input terminals by the number of the input portions by utilizing the capacity coupling, there is no function of storing operation results as a learning effect.

As opposed to it, in recent years, a proposal has been made, which is related to a first past example for implementing the learning ability by using residual polarization of a ferroelectric. For instance, in Japanese Patent No. 2929909 specification, there is a description that all the capacitive dielectric films of the input portions are comprised of the ferroelectric in the MIS type neuron element having a plurality of input portions placed for capacity coupling to the gate electrode of the MISFET. In addition, in Japanese Patent No. 2942088 specification, there is a description of the element of which gate dielectric film of the MISFET on an output side is comprised of the ferroelectric in the MIS type neuron element having a plurality of input portions placed for capacity coupling to a gate electrode of the MISFET.

In addition, the LSI is making very rapid progress, and a transistor is increasingly rendered finer and more highly integrated. However, it is becoming difficult to improve yields because of the finer transistor and enormous chip area. In addition, as a circuit scale has become very large-scale and the system LSI of flexible production is mainstream, design thereof requires considerable personnel and time. For this reason, it is no longer easy to shorten a development period. To solve such a problem, a reconfigurable circuit is receiving attention. The reconfigurable circuit is a circuit capable of rewriting in conjunction with change in circuit specifications after manufacturing the LSI. As an example thereof, an FPGA (Field Programmable Gate Array) or a CPLD (Complex Programmable Logic Device) can be named. These are capable of implementing a changeable logic circuit by combining basic logical blocks in multiple stages. To be more specific, in this FPGA/CPLD, a switch element and a multiplexer are used as program elements, and the function is determined therewith by a combination of basic logic circuits. As for these methods, however, the area occupied by a redundant circuit of the basic logical block is so large that wiring becomes long. On the other hand, there is a proposal of the element wherein the program element itself is capable of converting the logic by using the ferroelectric ([61th Applied Physics Society Academic Lecture Manuscripts 6a-g-1. Naoichi Kawaguchi, Seimin In, Eisuke Tokumitsu])

FIG. 40 is an equivalent circuit diagram of the neuron element related to the second past example described in the above patent journal. In this example, a residual electric charge is generated by a pulse signal in a ferroelectric capacitor, and this residual electric charge is utilized to control an electric potential of a floating gate so as to attempt implementation of the logic transformation circuit of an NOR circuit and an NAND circuit.

As shown in FIG. 40, this neuron element has an n-channel type MIS transistor (NMISFET 510). Here, the gate electrode of the NMISFET 510 is a floating gate 506 which is connected to no other terminal and is in a floating state. A source is grounded, and a drain is connected to an output terminal 509. The output terminal 509 is connected to a power supply voltage supply terminal 507 for supplying power supply voltage VDD via a load resistance element 508.

In addition, it has two input terminals 500 and 501 for capacity coupling to the floating gate 506, paraelectric capacitors 503 and 504 intervening between the input terminals 501, 502 and the floating gate 506, a control terminal 502 for receiving a control signal, and a ferroelectric capacitor 505 intervening between the control terminal 502 and the floating gate 506.

Here, the logic of an input signal from the input terminal 500 is X1, the input signal from the input terminal 501 is X2, a charge amount of the control terminal 502 is CR, the charge amount of the floating gate 506 is $\phi$F, and the logic of an output signal from an output terminal 509 is Y. In addition, a threshold voltage of the NMISFET 510 is 0 V. Furthermore, when X1 and X2 are "1," the charge amount Q0 is induced to an upper electrode (the electrode on the input terminal side) of each of the paraelectric capacitors 503 and 504.

FIG. 41 is a diagram showing as a table the charge amounts of the portions against the input signals X1 and X2 on adding a negative pulse signal to the control terminal 502 and logical values of an output signal Y.

First, the negative voltage pulse signal is added to the control terminal 502 so as to generate the residual electric charge of the charge amount of $-Q/2$ on the upper electrode of the ferroelectric capacitor 505. At this time, the charge amount $\phi$F of the floating gate 506 is as shown in FIG. 41. If the charge of the floating gate 506 is positive at this time, a channel is formed on a $SiO_2$/Si interface and a MOS transistor is ON so that an output value Y is the value shown in FIG. 41. As is understandable from FIG. 41, a circuit operation at this time is an NOR circuit operation.

FIG. 42 is a diagram showing as a table the charge amounts of the portions against the input signals X1 and X2 on further adding a negative pulse signal of a larger amplitude to the control terminal 502 and logical values of the output signal Y.

First, the negative voltage pulse signal of a larger amplitude is further added to the control terminal 502 so as to generate the residual electric charge of the charge amount of −3Q0/2 on the upper electrode of the ferroelectric capacitor 505. At this time, the charge amount φF of the floating gate 506 is as shown in FIG. 42.

If the charge of the floating gate 506 is positive, the channel is formed on the $SiO_2$/Si interface and the NMISFET 510 is ON so that the output value Y is the value shown in FIG. 42. As is understandable from FIG. 42, the circuit operation at this time is an NAND circuit operation. Thus, it is possible, by controlling the residual electric charge of the ferroelectric capacitor, to implement the program element which is the logic transformation circuit of the NOR circuit and the NAND circuit.

In addition, as a third past example, the neuro-computer in the past will be described. To describe the operation of the neuro-computer, the operation of the brains of the living creature which were a model thereof will be simply described first.

FIG. 44 is a block diagram showing configuration of a basic unit of the brains which is simplified. In this diagram, reference numerals 601a, 601b and 601c denote neurons, and reference numerals 602a, 602b and 602c denote nerve cells. 603a, 603b and 603c are called synapse couplings, which multiply the signal conveyed by the nerve cell 602a by a load wa for instance and input it in the neuron 601a. The neuron 601a takes a linear sum of the signal strength which is inputted, and the nerve cell is activated (ignited) if the sum thereof exceeds a certain threshold and outputs the signal to the nerve cell 602b. If the sum thereof is equal to or less than the threshold, the neuron does not output the signal. It is said that, as plenty of such comparatively simple sum of products operations are processed in parallel, information processing unique to the brains is implemented.

Such a research in the operation of the neuron was actively conducted as the software in the past. On the other hand, there is also a trend to try to implement high-speed operation and so on by implementing and optimizing this neuron function with hardware. As an example of such neuron element development, the neuron MOSFET (abbreviated as νMOS) can be named, which is described in Japanese Patent No. 2662559 specification.

FIG. 45 is a schematic diagram showing the structure of the νMOS related to the third past example which is simplified. As shown in this diagram, the νMOS has floating gates FG which are the gate electrodes of a field effect transistor (MISFET), and also has the configuration wherein a plurality of capacitor CGs of which lower electrodes are the floating gates FG are mutually connected in parallel. As such configuration renders the gate portion of the νMOS as the configuration wherein capacitors CG and CO are serially connected, the signals (voltages) inputted in input terminals G1 to G4 are distributed so that a larger voltage is distributed to the gate portion of the νMOS of a smaller capacity based on the voltage distribution principle of the serial capacitors. As the sum of the signals inputted in the input terminals G1 to G4 increases, the voltage distributed to the gate portion becomes higher and a drain current of the νMOS increases.

This operation allows the above-mentioned neuron operation of the brains to be represented as an element operation of the semiconductor device.

On the other hand, another function is required in the case of implementing the functions of the brains. It is the function described as the synapse in FIG. 44, which is the function of implementing load of a plurality of inputs intervening for one neuron respectively. As a past example of the neuron element of the neuro-computer having such a load function, there is a technology described in Japanese Patent No. 3122756 specification for instance.

FIG. 46 is a schematic diagram showing the configuration of the neuron element of the past example described in the patent journal. In this diagram, 611 and 612 are NMOS and PMOS transistors respectively. A floating gate 613 is provided on an NMOS channel area via a gate oxide film. In addition, the floating gate 613 is opposite a charge injection electrode 616 via a $SiO_2$ film of approximately 5 to 7 nm. A wiring 617 is the gate electrode of the PMOS transistor 611, and is capacity-coupling with the floating gate of the NMOS transistor 611 via the $SiO_2$ film of approximately 20 nm thickness at the same time, also having the function of the gate electrode of the NMOS transistor 611. Reference numeral 620 denotes the wiring. An electrode 621 is capacity-coupling with the floating gate 613 via the $SiO_2$ film of approximately 20 nm thickness. A neuron circuit 217 has a large number of input terminals 218a to 218d.

The neuron element of the past shown in FIG. 46 changes the electric potential of the floating gate 613 by injecting the charge into the floating gate 613 from the charge injection electrode 616 by means of a tunnel current. It is thereby possible to change the threshold voltage of the NMOS transistor 611. This effect allows the signal (voltage) inputted from a wiring 619 via the wiring 617 to change a voltage level for rendering the NMOS transistor 611 in a conductive state. It just means that the influence exerted by the input signal upon the ON (ignition) of the neuron circuit is changed, which implements the synapse operation for changing the load. Moreover, the synapse circuit of the embodiment in the above patent journal is constituted by combining the NMOS transistor 611 and the PMOS transistor 612, and so the outputs are two values of a VDD and a GND (0 V).

In order to correctly control the charge amount of the tunnel current for setting such a load coefficient, this past example not only changes an absolute value of an injection control voltage, but also changes the injection control voltage like a pulse or controls it by a pulse width, a pulse height or the pulse number.

In addition, as for means for changing the threshold voltage of the NMOS transistor in the above past example, a nonvolatile memory element using a ferroelectric film (ferroelectric gate transistor) may be used other than the above-mentioned floating gate type MOS transistor.

FIG. 47 is a sectional view showing the ferroelectric gate transistor structure described in the above patent journal. In this diagram, reference numeral 656 denotes a P type Si substrate, and 657 denotes the $SiO_2$ film of 5 nm for instance. Reference numeral 658 denotes the ferroelectric film, which uses a PZT (Pb $(Zr_xTi_{1-x})$ $O_2$) of 300 nm film thickness for instance. Reference numeral 659 denotes the electrode of Ti for instance. Reference numerals 660a and 660b denote N$^+$ type source and drain. In this patent, the ferroelectric film is polarized by adding a positive or negative pulse to a gate electrode 659, and the threshold voltage of the transistor is controlled according to the size of the polarization.

However, there were the following problems in the above first past example.

First, as for the neuron element, it is necessary, in the case where "1" or "0" is outputted from the neuron to a certain input, to render the same output easier from the next time. To be more specific, it is necessary to learn and store output situation of each neuron. Nevertheless, the MIS type neuron element described in Japanese Patent No. 2929909 specification can learn and store that the input portion of each neuron became 1" or "0" from the residual polarization of the ferroelectric film provided in each input portion, but it cannot learn and store the information that the neuron outputted "1" or "0". It is because it cannot uniquely determine whether the output will be "1" or "0" even if some input portions are "1".

Secondly, in the case of providing the learning ability to the neuron element, it is desirable to add the function of resetting or weakening the learning ability. As the MIS type neuron element described in Japanese Patent No. 2942088 specification has the gate dielectric film of the MISFET on the output side comprised of the ferroelectric, it is capable of learning and storing the output state of the neuron, which is the first problem. However, in order to reset or weaken this learning and storing function, it is necessary to change the polarization of the ferroelectric film by applying between the substrate and the gate electrode the voltage of a polarity different from ordinary operation of the MISFET. It is necessary, for this purpose, to electrically insulate the substrate portion of each MIS type neuron element, which renders it very complicated including the control circuit.

In addition, as for the neuron element for functioning as the logic transformation circuit (program element) related to the above second past example, there was a problem that the residual electric charge generated on the ferroelectric film of the ferroelectric capacitor 505 is influenced by the electric potential $\phi F$ of the floating gate 506.

Here, if the voltage applied to the ferroelectric film (the control terminal side is positive) is Vferr, Vferr is represented by the following equation (101).

$$Vferr = CR - \phi F = -\phi F \tag{101}$$

Here, it is further considered by paying attention to the region in which the pulse signal is not applied to the control terminal 502. At this time, it is understandable from the formula (101) that the voltage applied to the ferroelectric film is dependent on the electric potential $\phi F$ of the floating gate 506. As $\phi F$ changes according to the input, the voltage applied to the ferroelectric film from the formula (101) must change. Thus, there was a problem that the residual electric charge induced to the ferroelectric film changes. This problem will be described by referring to the diagram.

FIGS. 43A and B are timing charts showing time variation of the electric potential of the floating gate and the timing chart showing the time variation of the voltage applied to the ferroelectric film of the neuron element related to the above second past example in order respectively. Here, a voltage value of the logical value "0" is 0 V, and voltage value of the logical value "1" is 5 V. After inputting (0, 0), (1, 1), (0, 1) and (1, 0) in the input terminals 500 and 501 respectively, the pulse signal of −10 V is applied to the control terminal 502 and the residual electric charge is induced to the ferroelectric capacitor 505. Thereafter, (0, 0), (1, 1), (0, 1) and (1, 0) are repeatedly inputted in the input terminals 500 and 501 respectively.

At this time, as is also understandable from FIG. 43A, the voltage applied to the ferroelectric film is also changing in the region to which no pulse signal is added. To be more specific, as shown in a region Rx in FIG. 43A, the electric potential $\phi F$ of the floating gate 506 for the input (0, 1) before the pulse signal is inputted and the electric potential $\phi F$ for the input (1, 0) are mutually different. This is because, as previously mentioned, if the input signal is applied to the input terminal, the voltage applied to the ferroelectric film of the ferroelectric capacitor changes. In addition, as shown in a region Ry in FIG. 43A, the electric potentials $\phi F$ of the floating gate for the same input of the first time and second time are mutually different after the pulse signal is applied to the control terminal 502. It is also because, if the voltage is applied to the input terminal, the voltage applied to the ferroelectric film of the ferroelectric capacitor does not remain invariant and consequently the residual electric charge of the ferroelectric capacitor changes.

Thus, as for the neuron element for functioning as the logic transformation circuit of the NOR circuit and the NAND circuit of the above second past example, there was a problem that the residual electric charge of the ferroelectric capacitor changes due to the voltage applied to another input terminal, and consequently the residual electric charge induced on the ferroelectric capacitor cannot be stably held so that a logic transformation function becomes unstable.

In addition, as for the configuration using the tunnel current shown in FIG. 46 which is a first technique for constituting the synapse circuit of the neuro-computer related to the above third example, it is very difficult, considering that the tunnel current exponentially changes against the field strength, to control a tunnel charge amount by the pulse width, the pulse height and the pulse number.

FIG. 48 is a diagram showing a correlation between the applied voltage and the tunnel current when an electron tunnels through a thermal oxidation silicon film of 10 nm thickness. As shown therein, the tunnel current has a nature of exponentially increasing, and so it is easily understood that controllability of the charge to a floating electrode in the past example is very difficult. As a result of it, it was difficult to set the load coefficient in multiple stages and with high accuracy. As accuracy is required for setting of the load coefficient in an operation process of the neural network, delicate setting of the load coefficient is very difficult with the technique in FIG. 46, and consequently there is a problem that the neuron element does not properly operate so that the learning does not easily converge, for instance. In addition, there is also a problem that the field strength capable of effectively using a tunnel phenomenon with the device is approximately 6 MV/cm or more and consequently a very high driving voltage is necessary.

Furthermore, a ferroelectric gate transistor which is a second technique for constituting the synapse circuit as shown in FIG. 47, there is no concrete means prepared such as a specific wiring connection form and an application method of the driving voltage, and so it is questionable whether the proper operation as the synapse can be obtained.

SUMMARY OF THE INVENTION

A first object of the present invention is to provide a neuron element having incorporated a facility capable of simply learning and storing output situation of each neuron and also resetting or weakening the learning and storing.

A second object of the present invention is to provide the neuron element for functioning as a stable logic transformation circuit.

A third object of the present invention is to provide the neuron element capable of setting a load coefficient in multiple stages.

A first semiconductor device of the present invention has a semiconductor layer, a first dielectric film provided on the above semiconductor layer, a first gate electrode provided on the above dielectric film, at least one second gate electrode provided opposite the above first gate electrode to receive an input signal, at least one second dielectric film intervening between the above first gate electrode and the above at least one second gate electrode, a third gate electrode provided opposite the above first gate electrode, a ferroelectric film intervening between the above first gate electrode and the above third gate electrode and an output portion connected to a part of the above semiconductor layer for outputting an output signal according to the input signal inputted in the above at least one second gate electrode, and also has a learning ability for strengthening or weakening a correlation between the above input signal and the above output signal according to polarization characteristics of the above ferroelectric film.

Thus, a negative learning effect arises in the case where residual polarization of the ferroelectric film is polarized in a direction to weaken a gate bias to be turned on by the semiconductor device, and a positive learning effect arises in the case where the residual polarization is polarized in a direction to strengthen the gate bias. In particular, it has the negative learning effect as a basic function. Accordingly, it is possible to obtain the semiconductor device suited to the neuron element having various learning abilities.

The above third gate electrode has a fixed voltage provided thereto so that the semiconductor device for exerting the learning ability can be obtained without exerting complicated control.

The above third gate electrode has a voltage positive or negative to an electric potential of the above first electrode applied thereto so that it can arbitrarily provide a positive or negative learning ability to the semiconductor device.

It is desirable to apply the voltage to the above third gate electrode like a pulse, and also in that case, the above third gate electrode can have the voltage positive or negative to the above first gate electrode applied thereto.

It may have evaluation means for evaluating the output signal outputted from the above output portion and a signal generation circuit for generating a signal to be provided to the above third gate electrode according to evaluation results of the above evaluation means so as to properly control positive and negative and a level of the learning ability.

It is desirable that an absolute value of a resistance voltage for reversing the polarization of the above ferroelectric film is smaller than that of a threshold voltage for letting a current run to a region located in the lower part of the above first gate electrode in the above semiconductor layer.

It is desirable that, on applying to the above at least one second gate electrode a maximum input voltage in a range of the current running to the region located in the lower part of the above first gate electrode in the above semiconductor layer, the voltage between the above first gate electrode and third gate electrode does not exceed the resistance voltage of the above ferroelectric film.

It is desirable that it has first and second diffusion regions formed in areas located at both sides of the above first gate electrode and first and second voltage supply portions connected to the above first and second diffusion regions for supplying first and second voltages having a difference in height, and the above output portion is connected to the above first diffusion region, and there intervenes a resistive member for functioning as a resistor between the above output portion and the above first voltage supply portion.

It is desirable to have the above semiconductor device function as the neuron element of an arithmetic circuit, and in particular, that of a logical operation circuit.

In addition, it is desirable that the semiconductor device is placed in an artificial intelligence system for performing recognition and determination.

It is desirable that the same number, that is, a plurality of the above at least one second gate electrode and the above at least one second dielectric film are provided so that the above output signals are outputted according to a plurality of input signals.

A second semiconductor device of the present invention has the semiconductor layer, the first dielectric film provided on the above semiconductor layer, the first gate electrode provided on the above dielectric film, the second gate electrode opposite the above first gate electrode, a lower electrode connected to the above first gate electrode, an upper electrode connected to the above second gate electrode and a ferroelectric capacitor having a ferroelectric film intervening between the above upper and lower electrodes connected to the above second gate electrode, the third gate electrode connected to the upper electrode of the above ferroelectric capacitor, at least one fourth gate electrode provided opposite the above third gate electrode to receive the input signal, at least one second dielectric film intervening between the above third and fourth gate electrodes, a fifth gate electrode provided opposite the above third gate electrode to be supplied a polarization adjustment voltage of the above ferroelectric film, a third dielectric film intervening between the above third and fifth gate electrodes, and an output portion connected to a part of the above semiconductor layer for outputting an output signal according to the input signal inputted in the above at least one fourth electrode, and has a learning ability for strengthening or weakening the correlation between the above input signal and the above output signal according to polarization characteristics of the above ferroelectric film.

Thus, it is possible to obtain the semiconductor device especially suited to the neuron element of which basic function is a positive learning ability.

It is desirable that the same number, that is, a plurality of the above at least one fourth gate electrode and the above at least one second dielectric film are provided so that the above output signals are outputted according to the plurality of input signals.

A third semiconductor device of the present invention has the semiconductor layer, the first dielectric film provided on the above semiconductor layer, the first gate electrode provided on the above first dielectric film, the second gate electrode provided opposite the above first gate electrode, the third gate electrode provided opposite the above second gate electrode, a fourth gate electrode provided opposite the above third gate electrode to receive the input signal, at least one second dielectric film intervening between the above third and fourth gate electrodes, the fifth gate electrode provided opposite the above third gate electrode, the third dielectric film intervening between the above third and fifth gate electrodes, and the output portion connected to a part of the above semiconductor layer for outputting the output signal according to the input signal inputted to the above at least one fourth electrode, the lower electrode connected to the above first gate electrode, the upper electrode connected to the above second gate electrode and the ferroelectric capacitor having the ferroelectric film intervening between the upper and lower electrodes connected to the above second gate electrode, and a voltage supply portion for supplying a voltage for controlling the polarization of the above ferroelectric film to the above fifth gate electrode, and the lower electrode of the above ferroelectric capacitor is electrically connectable to one of the above third and fifth gate electrodes and the upper electrode thereof is electrically connectable to one of the above fifth gate electrode and the above voltage supply portion.

Thus, it is possible to switch between the semiconductor device of which basic function is the positive learning ability and that of which basic function is the negative learning ability.

It is desirable that the same number, that is, a plurality of the above at least one fifth gate electrode and the above at least one second dielectric film are provided so that the above output signals are outputted according to the plurality of input signals.

A fourth semiconductor device of the present invention has the first semiconductor layer, the first dielectric film provided on the above first semiconductor layer, the first gate electrode provided on the above first gate dielectric film, a first MISFET having first and second P type diffusion regions formed in the areas located at both sides of the above first gate electrode in the above first semiconductor layer, the second semiconductor layer, the second dielectric film provided on the above second semiconductor layer, the second gate electrode formed on the above second gate dielectric film, a second MISFET having first and second N type diffusion regions formed in the areas located at both sides of the above second gate electrode in the above second semiconductor layer, the first electrode connected in common to the above first and second gate electrodes, the second electrode opposite the first electrode, the ferroelectric capacitor having the ferroelectric film intervening between the above first and second electrodes, the first voltage supply portion for supplying the first voltage to the first N type diffusion region of the above second MISFET, the first voltage supply portion for supplying the second voltage which is lower than the above first voltage to the first P type diffusion region of the above first MISFET, and a voltage output portion connected in common to the second P type and N type diffusion regions of each of the above MISFETs for outputting the output voltage according to the voltage inputted to the above second electrode of the above ferroelectric capacitor, and functions as an electric potential generating device.

Thus, it is possible, by utilizing the residual polarization of the ferroelectric film, to output as the output voltage almost as-is the input voltage inputted to a voltage input portion. To be more specific, it is possible to obtain the electric potential generating device for functioning as a buffer.

As the above second gate electrode is electrically connected to the first P type diffusion region of the above first MISFET, the second MISFET functions as a resistor.

As the above first gate electrode is electrically connected to the first N type diffusion region of the above second MISFET, the first MISFET functions as a resistor.

In the case where the above first P type diffusion region and a part of the area excluding the above first and second N type diffusion regions in the above second semiconductor layer are mutually electrically connected, and the above first N type diffusion region and a part of the area excluding the above first and second P type diffusion regions in the above first semiconductor layer are mutually electrically connected, the buffer for functioning as a source follower circuit can be obtained.

It is desirable that the above first and second MISFETs are enhancement type (normally-off) transistors.

It is possible to reduce a gate source overlap amount and curb the influence of potential change on the output side over a polarization state of the ferroelectric film by further having a side wall formed on at least one side of the above first and second gate electrodes.

It is possible to further curb disturbance to the polarization of the ferroelectric film by further having a path transistor connected to the above second electrode of the above ferroelectric capacitor.

It is possible to utilize the output of the portion for functioning as the above electric potential generating device and perform stable switching of logical operation by further having the third semiconductor layer, the third gate dielectric film provided on the above third semiconductor layer, the third gate electrode provided on the above third gate dielectric film, a third MISFET having first and second diffusion regions formed in the areas located at both sides of the above third gate electrode in the above third semiconductor layer, at least one fourth gate electrode provided opposite the above third gate electrode to receive the input signal, at least one first dielectric film intervening between the above third gate electrode and the above at least one fourth gate electrode, a fifth gate electrode provided opposite the above third gate electrode and electrically connected to the above voltage output portion, the second dielectric film intervening between the above third gate electrode and the above fifth gate electrode, and a signal output portion connected to the above first diffusion region in the above third semiconductor layer for outputting the output signal according to the input signal inputted to the above at least one fourth gate electrode so as to have it function as the logic transformation circuit.

It is desirable that it further has the first and second voltage supply portions, connected to the above first and second diffusion regions in the above third semiconductor layer, for supplying first and second voltages having a difference in height respectively, and there intervenes the resistor between the above signal output portion and the above first voltage supply portion.

It can also have a configuration wherein the above third MISFET is an NMISFET, is connected to the above first and second diffusion regions in the above third semiconductor layer, further has the first and second voltage supply portions for supplying the first and second voltages having a difference in height, and there intervenes a fourth MISFET which is a PMISFET having the gate electrode connected to the above third gate electrode between the above signal output portion and the above first voltage supply portion so as to constitute an inverter circuit.

It is desirable that the threshold voltage of the above inverter circuit is between a maximum value and a minimum value of the electric potential induced by the ferroelectric film of the above ferroelectric capacitor to the third gate electrode of the above third MISFET and the gate electrode of the fourth MISFET.

It can also have a configuration wherein the same number, that is, a plurality of the above at least one fourth gate electrode and the above at least one first dielectric film are provided so that, if a pulse-like voltage having a negative amplitude is applied to the second electrode of the above ferroelectric capacitor, a logical relationship between the input signals inputted to a plurality of the above fourth gate electrode and the output signals outputted from the above output portion is transformed from NOR to NAND.

It is possible, as a plurality of semiconductor devices are placed like an array via a switch element, to obtain an integrated circuit in which the logic transformation circuits are combined. The semiconductor device for functioning as a neural network can be obtained.

A fifth semiconductor device of the present invention has a plurality of synapse portions for load the input signals and outputting a plurality of output signals, and a neuron portion for receiving the plurality of output signals from the above plurality of synapse portions, where the above synapse portion has the semiconductor layer, the gate dielectric film formed on the above semiconductor layer, the gate electrode formed on the above gate dielectric film, the first and second diffusion regions formed in the areas located at both sides of the above gate electrode in the above semiconductor layer, a channel area intervening between the first and second diffusion regions, the first electrode connected to the gate electrode of the above MISFET, the second electrode opposite the first electrode, the ferroelectric gate transistor having the ferroelectric film intervening between the above first and second electrodes, the input portion electrically connected to the above first diffusion region of the above ferroelectric gate transistor for providing the input signals, the output portion connected to the above second diffusion region of the above ferroelectric gate transistor for multiplying the above input signal by the load coefficient and outputting it, and a load signal input portion electrically connected to the above second electrode of the above ferroelectric capacitor to receive a load control signal.

Thus, it is possible to change the polarization state of the ferroelectric film according to the load control signal and output to the input signal the voltage according to the polarization state from the output portion.

It becomes easier to control the voltage outputted from the output portion by further having a resistive member for functioning as the resistor electrically connected to the above second diffusion region of the above ferroelectric gate transistor and the voltage supply portion connected to the above second diffusion region sandwiching the above resistive member.

As the capacity between the above gate electrode and the semiconductor layer is larger than that between the above first and second electrodes, it is possible to facilitate control of the load coefficient.

In particular, it is desirable that the overlapping area of the above first and second electrodes is smaller than the area of the above channel area.

In addition, it is possible to set the load coefficient in multiple stages in increasing order since the overlapping area of the above first and second electrodes is smaller than one fifth of the area of the above channel area.

It is desirable that materials composing the above ferroelectric film contain at least two of chemical elements comprised of a group of Pb, La, Ba, Sr, Bi, Zr, Ti, Ta and Nb.

When the residual polarization of the above ferroelectric film after inputting the above load control signal is PW, thickness and specific inductive capacity of the above gate dielectric film are tI and $\in$I respectively, a difference in the applied voltage to the gate electrode for changing a drain current value of the above ferroelectric gate transistor by two digits is $\Delta$Vg, and permittivity of vacuum is $\in$O, the accuracy of the load coefficient setting is remarkably improved by having a ratio between the area of the above channel area and the overlapping area of the above first and second electrodes represented by $2PW \times tI/(\Delta Vg \times \in O \times \in I)$.

It is possible, even if the residual polarization has changed due to influence of various signals, to reset it and correctly set the load coefficient by applying to the above load signal input portion the voltage of reversed polarity of which absolute value is larger than the maximum voltage of the above load control signal and thereafter inputting the above load control signal and driving it.

It is possible to curb the change in the polarization of the ferroelectric film by distributing the voltage applied from the voltage output portion to the ferroelectric film since it further has a selective transistor intervening between the above second electrode of the above ferroelectric capacitor and the above load signal input portion.

It is possible, as a plurality of semiconductor devices and selective transistors are placed like an array, to efficiently control the load coefficient of each neuron element while constituting the neural network of which neuron elements are the semiconductor devices.

BRIEF DESCRIPTION OF THE DRAWINGS

FIG. 19 is a time chart showing the time variation of the electric potential of an output terminal to the same logical value input as FIG. 18A according to the eighth embodiment.

FIG. 41 is a diagram showing as a table a charge amount of each section to the input signal on adding a negative pulse signal to a control terminal in the past example and a logical value of the output signal.

FIG. 42 is a diagram showing as a table the charge amount of each section to the input signal on adding the negative pulse signal of a larger amplitude to the control terminal in the past example and a logical value of the output signal Y.

DETAILED DESCRIPTION OF THE INVENTION

Embodiment 1

Figure 1:
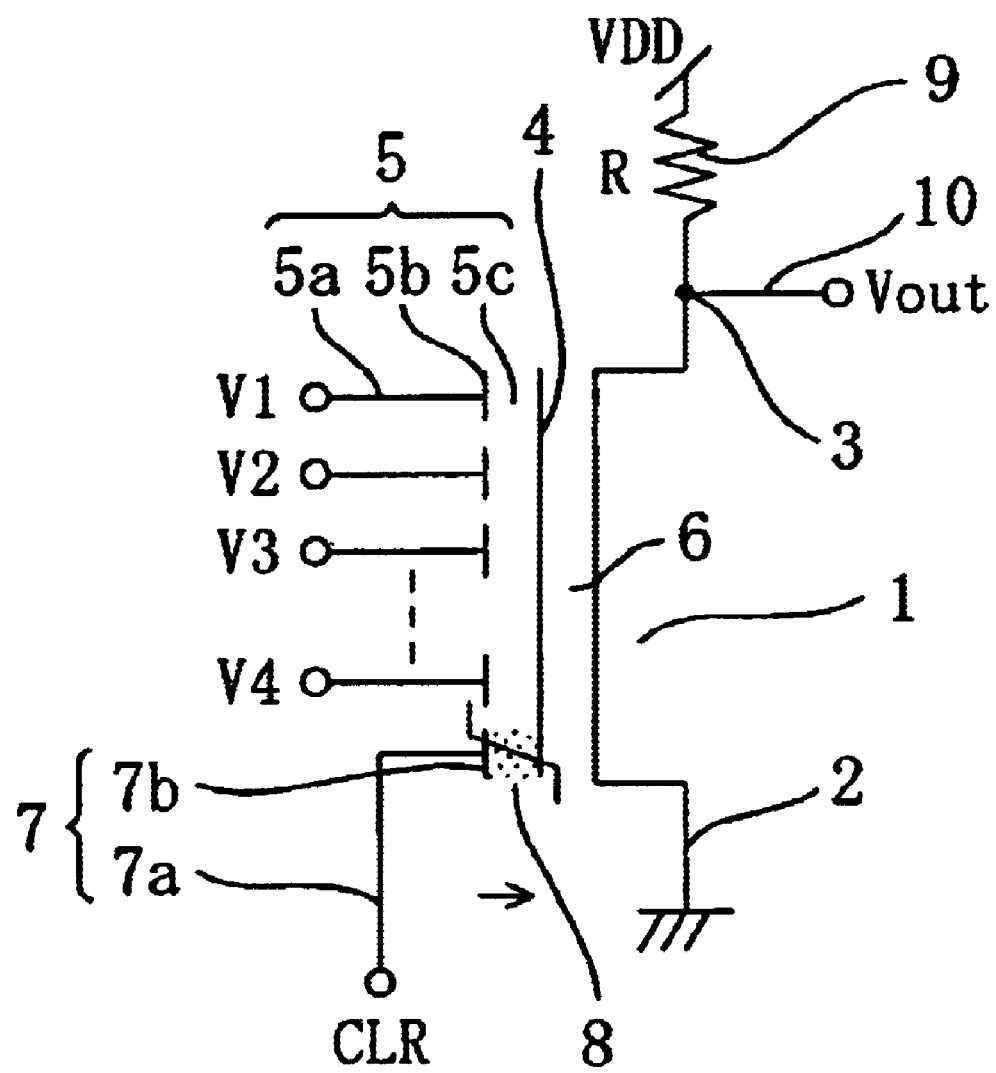
FIG. 1 is a schematic diagram showing a circuit configuration of a neuron element of a semiconductor device according to a first embodiment of the present invention.
Figure 3:
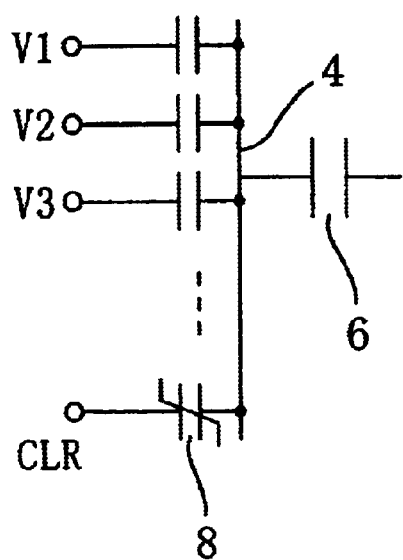
FIG. 3 is an equivalent circuit diagram in the case of taking out only a capacitor portion of a neuron element of the first embodiment.

FIG. 1 is a schematic diagram showing a circuit configuration of a neuron element of a semiconductor device according to a first embodiment of the present invention. FIG. 3 is an equivalent circuit diagram in the case of taking out only a capacitor portion of the neuron element of this embodiment.

The neuron element of this embodiment has an n-channel type MIS transistor (NMISFET 1) having a source terminal 2, a drain terminal 3, a gate dielectric film 6 and a gate electrode. Here, the gate electrode of the NMISFET 1 is a floating gate 4 which is connected to no other terminal and is in a floating state. The source terminal 2 is grounded together with a substrate area of the NMISFET 1, and the drain terminal 3 is connected to an output terminal 10. The output terminal 10 is connected to a power supply voltage supply portion for supplying power supply voltage VDD via a load resistance element 9.

In addition, n pieces of signal input portions 5 for capacity coupling to the floating gate 4 are provided. The signal input portion 5 is comprised of an input terminal 5a, an input gate electrode 5b to be connected to the input terminal 5a, and a paraelectric film 5c intervening between the input gate electrode 5b and the floating gate 4. To be more specific, the input gate electrode 5b and the floating gate 4 are capacity-coupled by the paraelectric film 5c.

The capacity between the input gate electrode 5b and the floating gate 4 is determined by the material, thickness and area of the paraelectric film 5c. The capacity between each input gate electrode 5b and floating gate 4 can be either entirely the same or different for the sake of load.

In addition, a learning and storing portion 7 is provided, which has a voltage terminal 7a for receiving a voltage for polarization and a terminal for polarization 7b opposite the floating gate 4 sandwiching a ferroelectric film 8. The voltage terminal 7a of the learning and storing portion 7 normally has a fixed voltage of 0 V (grounding voltage) applied thereto.

Here, the capacities between each input gate electrode 5b of the n pieces of signal input portions and the floating gate 4 are C1 to Cn. In addition, the capacity between the floating gate 4 and a semiconductor substrate is C0, an effective capacity between the floating gate 4 and the learning and storing portion 7 is CM, and residual polarization of the ferroelectric film 8 is QM. Moreover, if an electric potential of the floating gate 4 is VF and that of the learning and storing portion 7 is VM, the following formula (1) holds approximately.

$$VF=(C1 \cdot V1+C2 \cdot V2+\ldots+Cn \cdot Vn+CM \cdot VM+QM)/(C1+C2+\ldots+Cn+CM+C0) \quad (1)$$

Figure 2:
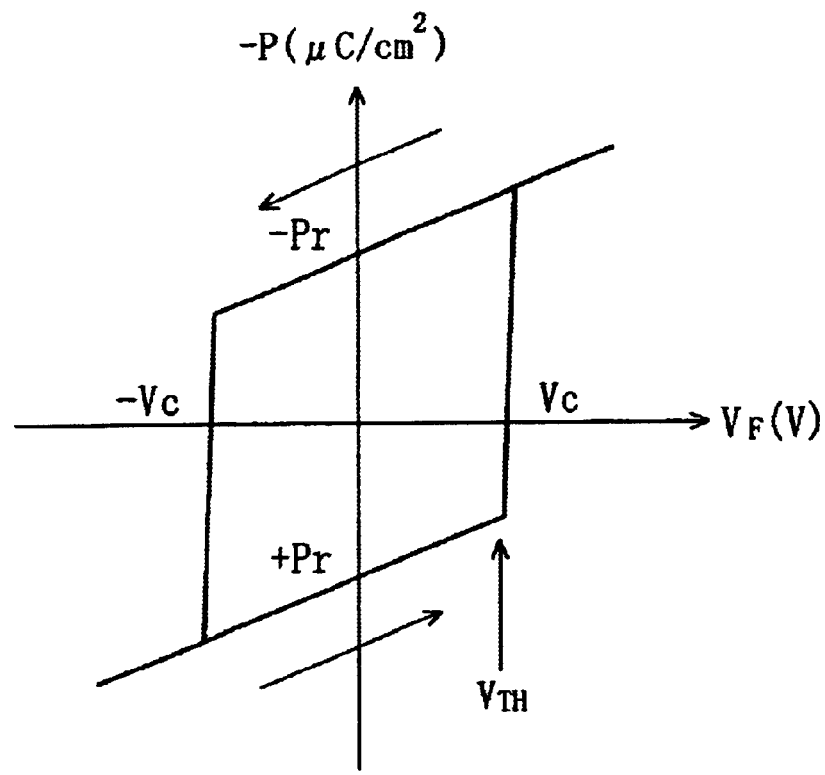
FIG. 2 is a diagram showing voltage dependency (hysteresis loop) of residual polarization of a ferroelectric film.

FIG. 2 is a diagram showing voltage dependency (hysteresis loop) of residual polarization of the ferroelectric film 8. Moreover, in this embodiment, the polarization wherein a positive electric charge is generated on the semiconductor substrate side in the ferroelectric film 4 is positive polarization. It is understandable from FIG. 2 that the polarization is reversed when a resistance voltage +Vc or −Vc is applied to the ferroelectric film. In addition, the residual polarization when having returned the applied voltage to zero is +Pr or −Pr.

Next, the element is designed by adjusting the capacities C1 to Cn of the input portions 5, the effective capacity CM between the learning and storing portion and the floating gate, and the capacity C0 between the floating gate and the semiconductor substrate so that a threshold voltage VTH of the NMISFET 1 and a resistance voltage Vc of the ferroelectric film 8 almost become equal. If the total of the input values of the n pieces of signal input portions 5 becomes a certain value, the electric potential VF of the floating gate 4 exceeds the threshold voltage VTH of the NMISFET 1 and the NMISFET 1 becomes ON, so that a current runs between the source terminal 2 and the drain terminal 3 to be in a conductive state. At this time, the resistance between the source terminal 2 and the drain terminal 3 becomes smaller than the load resistance element 9, and an output voltage of the output terminal 10 almost becomes 0 V. On the other hand, the resistance voltage Vc of the ferroelectric film 8 is designed to be almost equal to the threshold voltage VTH of the NMISFET 1, so that the polarization of the ferroelectric film 8 is reversed from +QM to −QM the instant when the NMISFET 1 becomes ON, changing just by −2QM.

The above action will be described by referring to the circuit shown in FIG. 1 and the equivalent circuit diagram shown in FIG. 3. As previously mentioned, however, the gate dielectric film 6 shows the gate dielectric film of the NMISFET of which gate electrode is the floating gate 4. This threshold voltage VTH of the NMISFET 1 is designed to be almost equal to the resistance voltage Vc of the ferroelectric film 8, so that the NMISFET 1 becomes ON if the voltage of the floating gate 4 exceeds Vc in the positive direction, and becomes OFF otherwise.

If various voltages are applied to signal input portions 5, the voltage of the floating gate 4 becomes VF represented by the aforementioned formula (1). As previously mentioned, the threshold voltage VTH of the NMISFET 1 of which gate electrode is the floating gate 4 is designed to be almost equal to the resistance voltage Vc of the ferroelectric film 8. Accordingly, if various voltages are applied to the signal input portions 5 from a state of all 0 V and the voltage of the floating gate 4 exceeds the threshold voltage VTH, the NMISFET 1 becomes ON. At the same time, the voltage exceeding the resistance voltage Vc is applied to both ends of the ferroelectric film 8, and the polarization of the ferroelectric film 8 starts reversion. If the voltages of the signal input portions 5 returns to the state of all 0 V, the polarization of the ferroelectric film 8 has been reversed from +QM to −QM after all, changing just by −2QM. Moreover, QM is Pr shown in FIG. 2 multiplied by the area of the ferroelectric film. At this time, the voltage of the floating gate 4 is the negative voltage just by 2QM/(C1+C2 +. . . +Cn+CM+C0).

Accordingly, for the NMISFET 1 to become ON next, the voltage must be applied to the signal input portions 5 so that the voltage VF of the floating gate 4 becomes higher than the initial state by 2QM/(C1+C2+. . . +Cn+CM+C0). In other words, it equivalently means that the residual polarization of the ferroelectric film 8 has learned and stored that the NMISFET 1 became ON and is controlling it in a negative direction. Accordingly, assuming that the circuit shown in FIG. 1 is an artificial neuron, it becomes possible, by using this embodiment, to learn and store information that the artificial neuron outputted "1" or "0". In this case, the voltage of the n pieces of signal input portions 5 may be either an analog value or a digital value of H or L.

Figure 4:
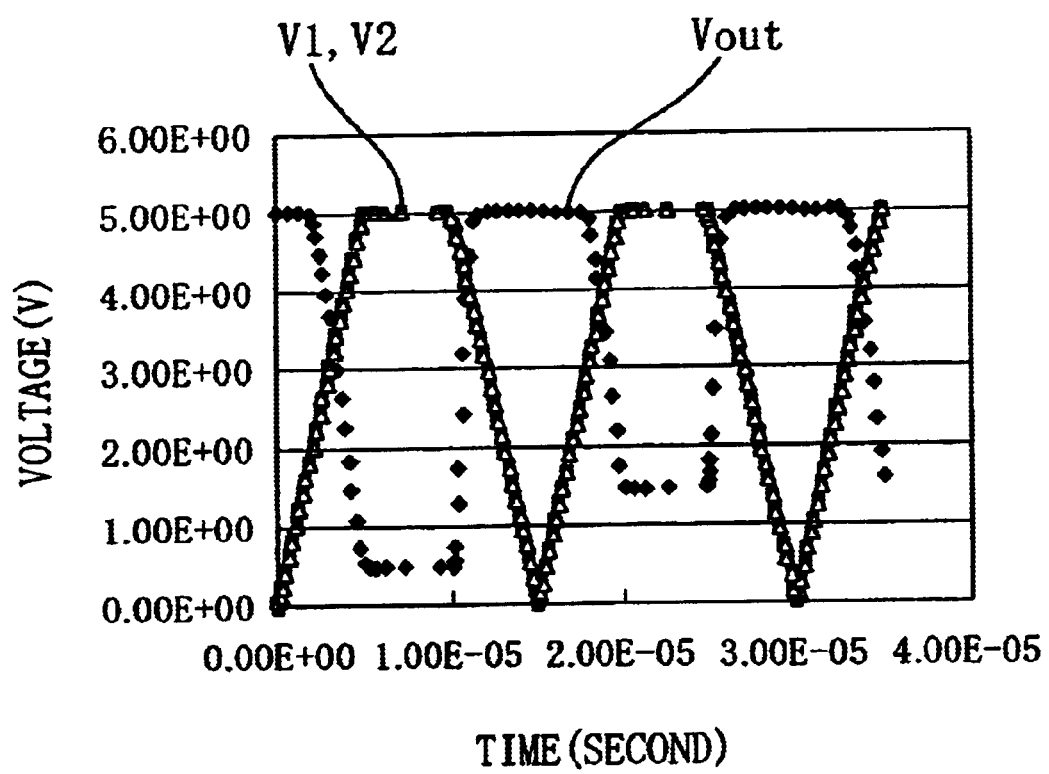
FIG. 4 is a diagram showing an example of an operating waveform in the case of providing two signal input portions in the circuit shown in FIG. 1.

FIG. 4 is a diagram showing an example of an operating waveform in the case of providing two signal input portions 5 in the circuit shown in FIG. 1. The power supply voltage VDD is 5 V, and the voltage of the voltage terminal 7a of the learning and storing portion 7 is 0 V. If voltages V1 and V2 of the two signal input portions 5 are simultaneously changed from 0 V to 5 V, a voltage V OUT of the output terminal 10 is changed from 5 V to approximately 0.5 V as shown in FIG. 4. Furthermore, the voltages V1 and V2 of the two signal input portions 5 are simultaneously changed to 0 V and then changed to 5 V again, the output voltage V OUT is changed from 5 V to approximately 1.4 V. To be more specific, it became approximately 0.5 V on a first input, but it is only reduced to approximately 1.4 V on a second input. This indicates that it is difficult for the NMISFET 1 to be ON, and it equivalently means that the residual polarization of the ferroelectric film 108 has learned and stored that the NMISFET 1 became ON and is controlling it.

Furthermore, if a positive voltage for applying the voltage of −Vc or more to the ferroelectric film 8 is applied to the electrode for polarization 7b of the learning and storing portion 7, the residual polarization of the ferroelectric film 8 is reversed from −QM to +QM by changing just by +2QM so as to return to an initial state. If a little lower voltage is applied to the electrode for polarization 7b, a polarization amount of the ferroelectric film 8 which is reduced according to the voltage changes. This is the operation for resetting learning and storing information of the neuron. Accordingly, use of this embodiment allows operation for easily resetting the learning and storing information of the neuron just by controlling the voltage of the learning and storing portion 7 irrespective of the structure of the NMISFET 1. The use of this embodiment renders it unnecessary to electrically insulate a substrate portion of each MIS type neuron element or design a very complicated control circuit.

Accordingly, it is possible, by using this embodiment, to provide by a simple method the semiconductor device for functioning as the neuron element incorporating a facility capable of easily learning and storing output situation of each neuron and easily resetting or weakening the learning and storing.

FIRST DEFORMED EXAMPLE

While the MIS type neuron element of this embodiment has only one learning and storing portion 7 for holding the learning and storing information, it may also have a plurality of the learning and storing portions 7.

Figure 5:
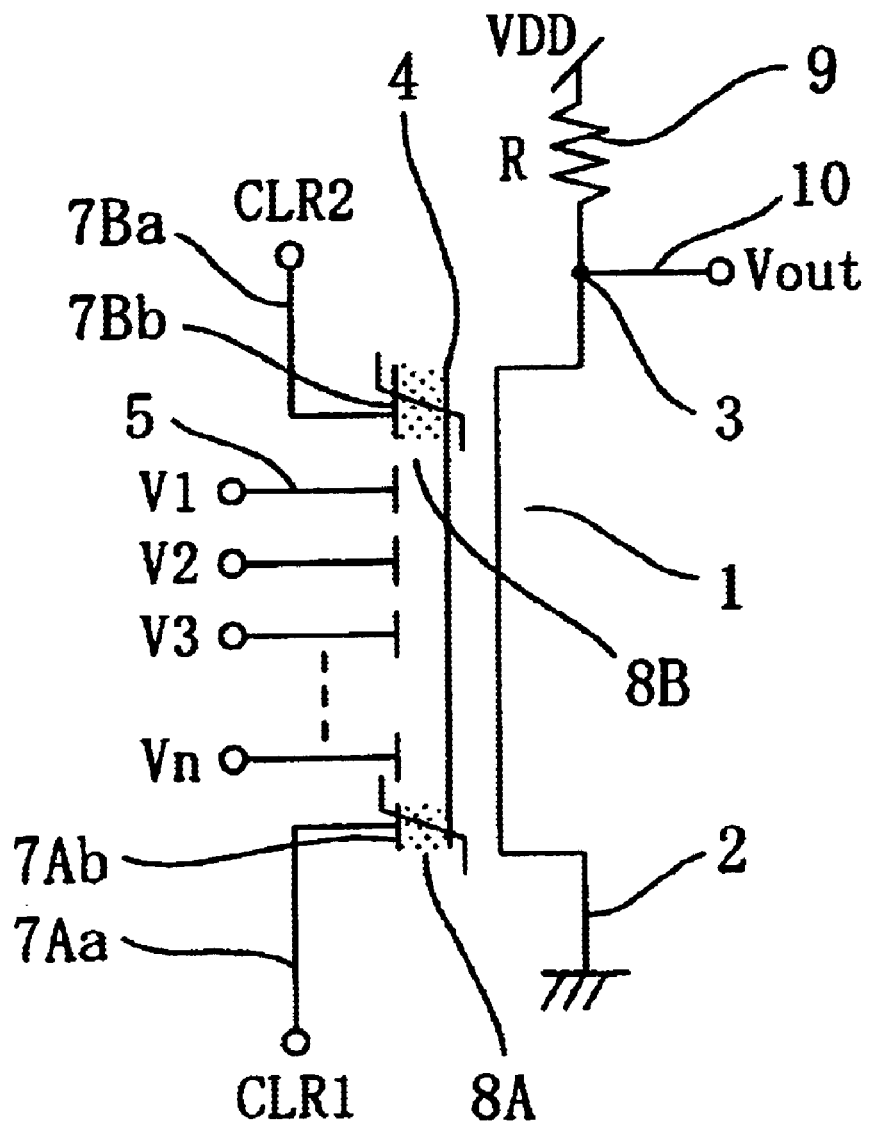
FIG. 5 is a schematic diagram showing a configuration of the neuron element which is the semiconductor device related to a first deformation example of the first embodiment wherein a plurality of learning and storing portions are provided.

FIG. 5 is a schematic diagram showing a configuration of the neuron element which is the semiconductor device related to a first deformation example of the first embodiment wherein a plurality of learning and storing portions are provided. The neuron element related to this deformation example has a learning and storing portion 7B having a voltage terminal 7Ba for receiving the voltage for polarization and an electrode for polarization 7Bb opposite the floating gate 4 sandwiching a ferroelectric film 8B in addition to a learning and storing portion 7A having a voltage terminal 7Aa for receiving the voltage for polarization and an electrode for polarization 7Ab opposite the floating gate 4 sandwiching a ferroelectric film 8A. The configuration other than that is the same as the one shown in FIG. 1.

In the case of this deformation example, the ratio of capacity of the ferroelectric films 8A and 8B intervening between the two learning and storing portions 7A, 7B and the floating gate 4 may be either the same or different. In addition, while this deformation example has the two learning and storing portions 7A, 7B and the ferroelectric films 8A, 8B placed on both ends of the floating gate 4, placement positions of the learning and storing portions 7A, 7B and the ferroelectric films 8A, 8B do not influence the functions of the learning and storing portions 7A, 7B.

According to this deformation example, it is possible to control the polarization in multiple stages by controlling the learning and storing portions 7A and 7B at mutually independent voltages, further allowing high-precision or various learning and storing to be implemented.

Accordingly, it is also possible, by using this deformation example, to provide by a simple method the semiconductor device for functioning as the neuron element incorporating a facility capable of easily learning and storing output situation of each neuron and easily resetting or weakening the learning and storing.

SECOND DEFORMED EXAMPLE

While a circuit is constructed by combining the NMISFET 1 and the load resistance element 9 in this embodiment, it is also possible to use a p-type MIS transistor instead of the load resistance element 9.

Figure 6:
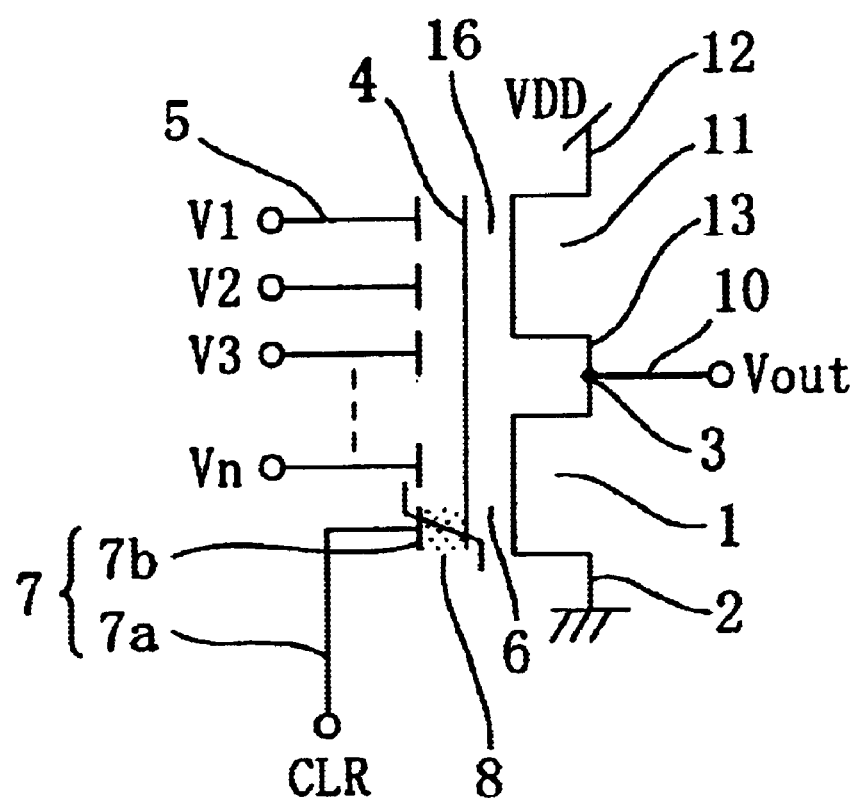
FIG. 6 is a schematic diagram showing a configuration of the neuron element which is the semiconductor device related to a second deformation example of the first embodiment.

FIG. 6 is a schematic diagram showing a configuration of the neuron element which is the semiconductor device related to a second deformation example of the first embodiment. The neuron element related to this deformation example has a p-channel type MIS transistor 11 (PMISFET 11) serially connected to the NMISFET 1 instead of the load resistance element 9 in the structure shown in FIG. 1. And a source terminal 12 of the PMISFET 11 is connected to the power supply voltage supply portion for supplying the power supply voltage VDD, and a drain terminal 13 of the PMISFET 11 is connected to the drain terminal 3 of the NMISFET 1. The output terminal 10 is connected to the drain terminal 3 of the NMISFET 1 and the drain terminal 13 of the PMISFET 11. In addition, the floating gate 4 is provided astride the NMISFET 1 and the PMISFET 11, and a paraelectric film 16 intervenes between the floating gate 4 and the substrate area of the PMISFET 11.

According to this deformation example, while the capacity between the floating gate and the semiconductor substrate was C0 in the description of the aforementioned combinational circuit of the NMISFET and the load resistance element, the same relationship as the above formula (1) holds in the case of using the p-type MISFET 11, if the total of the capacity between the floating gate 4 astride the NMISFET 1 and the PMISFET 11 and the semiconductor substrate is C0.

Embodiment 2

While the element was designed in the first embodiment so that the threshold voltage VTH of the NMISFET 1 and the resistance voltage Vc of the ferroelectric film 8 almost become equal, it is also possible to design the element by a method different from the first embodiment. In this embodiment, the element designed by the different method while adopting the same circuit configuration as the first embodiment will be described by referring to FIG. 1 and FIG. 7. To be more specific, the same circuit configuration of this embodiment is as shown in FIG. 1.

Figure 7:
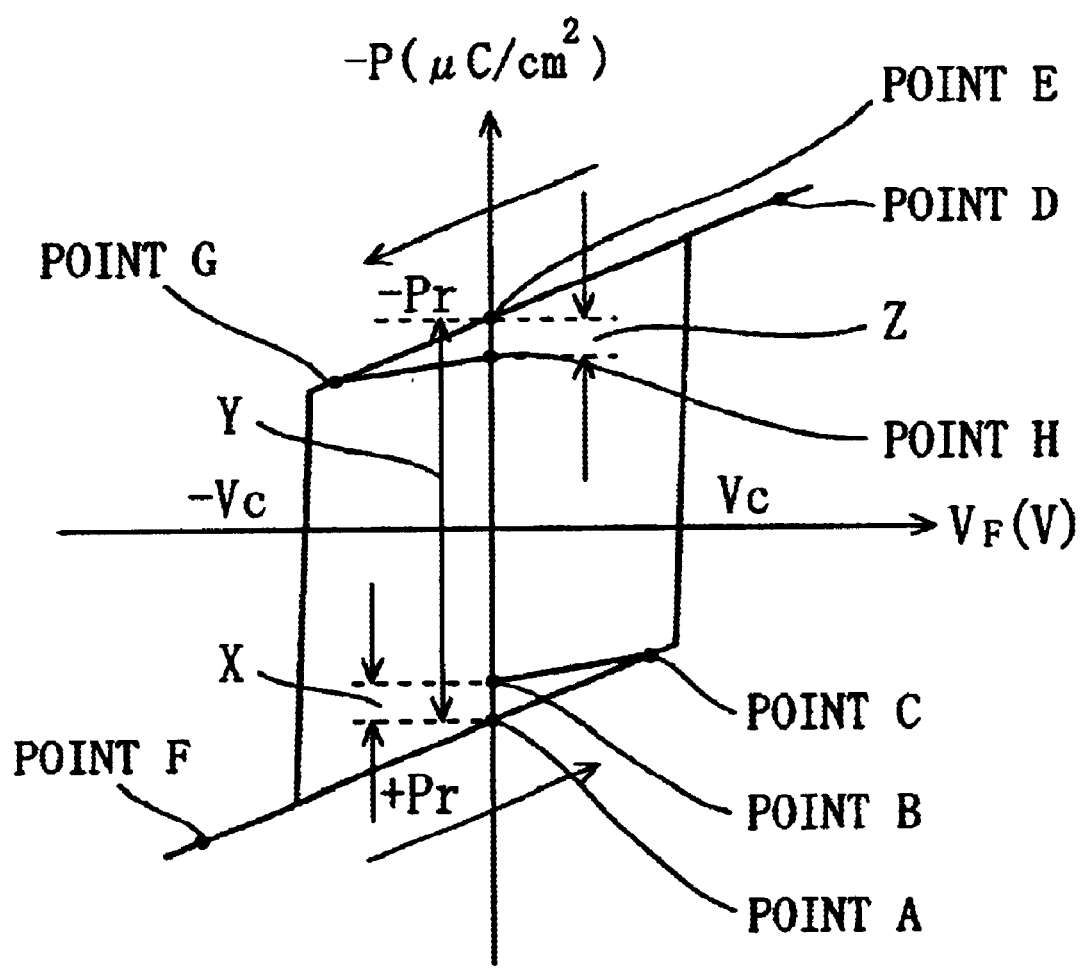
FIG. 7 is a diagram showing the voltage dependency (hysteresis loop) of the residual polarization of the ferroelectric film when adopting a method different from the first embodiment.

FIG. 7 is a diagram showing the voltage dependency (hysteresis loop) of the residual polarization of the ferroelectric film 8 when adopting the method different from the first embodiment. For instance, the element can be designed so that the threshold voltage VTH of the NMISFET 1 is lower than the resistance voltage Vc of the ferroelectric film 8 and the electric potential VF of the floating gate 4 becomes the resistance voltage Vc or less when the input voltage of the n pieces of signal input portions 5 is the maximum value. The capacities of the paraelectric films 5c intervening between the n pieces of the signal input portions 5 and the floating gate 4 may be either entirely the same or mutually different for the sake of load.

In the neuron element shown in FIG. 1, if all the input voltages of the n pieces of the signal input portions 5 are the maximum values, the electric potential VF of the floating gate 4 becomes larger than the threshold voltage VTH of the NMISFET 1, so that the NMISFET 1 becomes ON and the current runs between the source terminal 2 and the drain terminal 3 to render the NMISFET 1 in a conductive state. At this time, the resistance between the source terminal 2 and the drain terminal 3 becomes smaller than the load resistance element 9, and the output voltage of the output terminal 10 almost becomes 0 V. On the other hand, the resistance voltage Vc of the ferroelectric film 8 is designed to be higher than the threshold voltage VTH of the NMISFET 1, and so the polarization state of the ferroelectric film 8 changes a little and not much even if the NMISFET 1 becomes ON.

In FIG. 7, when all the input voltages of the n pieces of the signal input portions 5 are 0 V, the electric potential VF of the floating gate 4 is also 0 V, and the residual polarization of the ferroelectric film 8 is at a point A which is a first state after initialization. Thereafter, even when all the input voltages of the n pieces of the signal input portions 5 are the maximum values, the electric potential VF of the floating gate 4 is smaller than the resistance voltage Vc of the ferroelectric film 8, and so the polarization state only moves on to a point C, and it moves on to a point B when all the input voltages of the n pieces of the signal input portions 5 return to 0 V. Accordingly, the residual polarization changes by a residual polarization difference X between the points A and B. Thus, the residual polarization becomes smaller, and it means that it has changed in a direction where the NMISFET 1 cannot easily become ON. Accordingly, in order to turn on the NMISFET 1 next, VF must be as large as X/(C1+C2+. . . +Cn+CM+C0), which means in other words that the residual polarization of the ferroelectric film 8 learns and stores that the NMISFET 1 became on so as to keep the NMISFET 1 from becoming ON again.

In the case where some of the n pieces of the signal input portions 5 do not take the maximum voltage, the residual polarization is located somewhere between the points A and C according to the electric potential VF of the floating gate 4. In addition, when the voltages of all the signal input portions 5 are returned to 0 V, the residual polarization is located somewhere between the points A and B. In the case where all the voltages of the n pieces of the signal input portions 5 change so that the electric potential VF of the floating gate 4 gradually becomes larger, the residual polarization changes and gradually becomes smaller when all the voltages of the signal input portions 5 are returned to 0 V. This is equivalent to performing learning reinforcement.

On the other hand, in the case where all the voltages of the signal input portions 5 change so that the electric potential VF of the floating gate 4 becomes a certain value and then gradually becomes smaller, the residual polarization does not change when all the voltages of the signal input portions 5 are returned to 0 V, and no learning reinforcement is performed.

In the case of performing further advanced learning reinforcement, the voltage negative to the floating gate 4 is applied to the learning and storing portion 7, and the voltage which is the resistance voltage Vc or higher is applied to both ends of the ferroelectric film 8. Application time can be an arbitrary period of time as far as it is the time necessary to cause polarization reversal of the ferroelectric film 8 or longer. For instance, the time for applying to both ends of the ferroelectric film 8 the voltage which is the resistance voltage Vc or higher may be a pulse of 100 ns or so. At this time, the voltage applied to both ends of the ferroelectric film 8 is 0 V before applying the pulse voltage in the hysteresis characteristics shown in FIG. 7, and so the residual polarization is located somewhere between the points A and B. During application of the pulse, the voltage applied to both ends of the ferroelectric film 8 becomes higher than Vc, and so the polarization state moves on to a point D. After the application of the pulse, the applied voltage returns to 0 V, and so the polarization state moves on to a point E. If the polarization state is at the point A initially, the residual polarization changes by Y so that it greatly polarizes from the positive to negative direction. Accordingly, the NMISFET 1 does not become ON unless the input voltages of the n pieces of the signal input portions 5 are higher. This means that it becomes more difficult for the NMISFET 1 to become ON due to the pulse applied to the learning and storing portion 7, which equivalently means that the negative learning was reinforced and significant curb was exerted.

Subsequently, the function of performing the positive learning will be described. While the voltage is applied to the learning and storing portion 7 by using the same procedure as previously described, the voltage positive to the floating gate 4 is applied to the learning and storing portion 7 in this case, and the voltage which is the resistance voltage Vc or higher is applied to both ends of the ferroelectric film 8. Application time can be arbitrarily set as far as it is the time necessary to cause polarization reversal of the ferroelectric film 8 or longer. For instance, it is possible to apply to both ends of the ferroelectric film 8 the pulse signal wherein the time for applying to both ends of the ferroelectric film 8 the voltage which is the resistance voltage Vc or higher is 100 ns or so. At this time, the voltage applied to both ends of the ferroelectric film 8 is 0 V before applying the pulse voltage in the hysteresis characteristics shown in FIG. 7, and so the polarization state is located at a point E. During the application of the pulse signal, the voltage applied to both ends of the ferroelectric film 8 exceeds −Vc, and so the polarization state moves on to a point F. In addition, the applied voltage returns to 0 V after the application of the pulse signal, and so the polarization state moves on to the point A. As the polarization state initially at the point E returned to the point A, the residual polarization changes by Y so that it greatly polarizes from the negative to positive direction. Accordingly, the NMISFET 1 becomes ON even if the input voltages of the n pieces of the signal input portions 5 are smaller. This means that it becomes easier for the NMISFET 1 to become ON due to the pulse applied to the learning and storing portion 7, which means that the positive learning was performed.

In addition, if the voltages of the pulse signal is set to be a little lower so that the voltage less than the resistance voltage Vc is applied to both ends of the ferroelectric film 8, the polarization state which was at the point E before the application of the pulse signal moves on to a point G during the application of the pulse, and moves on to a point H after the application thereof since the applied voltage returns to 0 V. As the polarization state initially at the point E moved on to the point H, the residual polarization changes by Z and the negative polarization is reduced a little. Accordingly, the NMISFET 1 becomes ON even if the input voltages of the signal input portions 5 are a little lower. This means that it becomes easier for the NMISFET 1 to become ON due to the pulse signal applied to the learning and storing portion 7, which equivalently means that the positive weak learning was performed.

As described above, according to this embodiment, the learning can be reinforced and curbed at various ratios by controlling the voltage applied to the learning and storing portion 7. According to this embodiment, it is possible to easily reinforce and curb the learning and storing information on the neuron at various ratios just by controlling the voltage of the learning and storing portion 7 irrespective of the NMISFET 1. Besides, this embodiment renders it unnecessary to electrically insulate the substrate portion of each MIS type neuron element and design a very complicated control circuit.

Accordingly, it is possible, by using this embodiment, to provide by a simple method the neuron element having incorporated the facility capable of simply learning and storing output situation of each neuron and also resetting or weakening the learning and storing. Moreover, it is possible, by combining the neuron elements and constituting an arithmetic circuit, to form the neuron element and also implement a semiconductor application device having the learning ability by using this neuron element. Furthermore, it is possible, by using this semiconductor application device, to implement a system for performing advanced functions such as recognition and determination, that is, so to speak, an artificial intelligence system.

Moreover, while a circuit is constructed by combining the NMISFET 1 and the load resistance element 9 in this embodiment, it is also possible to use a p-type MIS transistor instead of the load resistance element 9.

Embodiment 3

Figure 8:
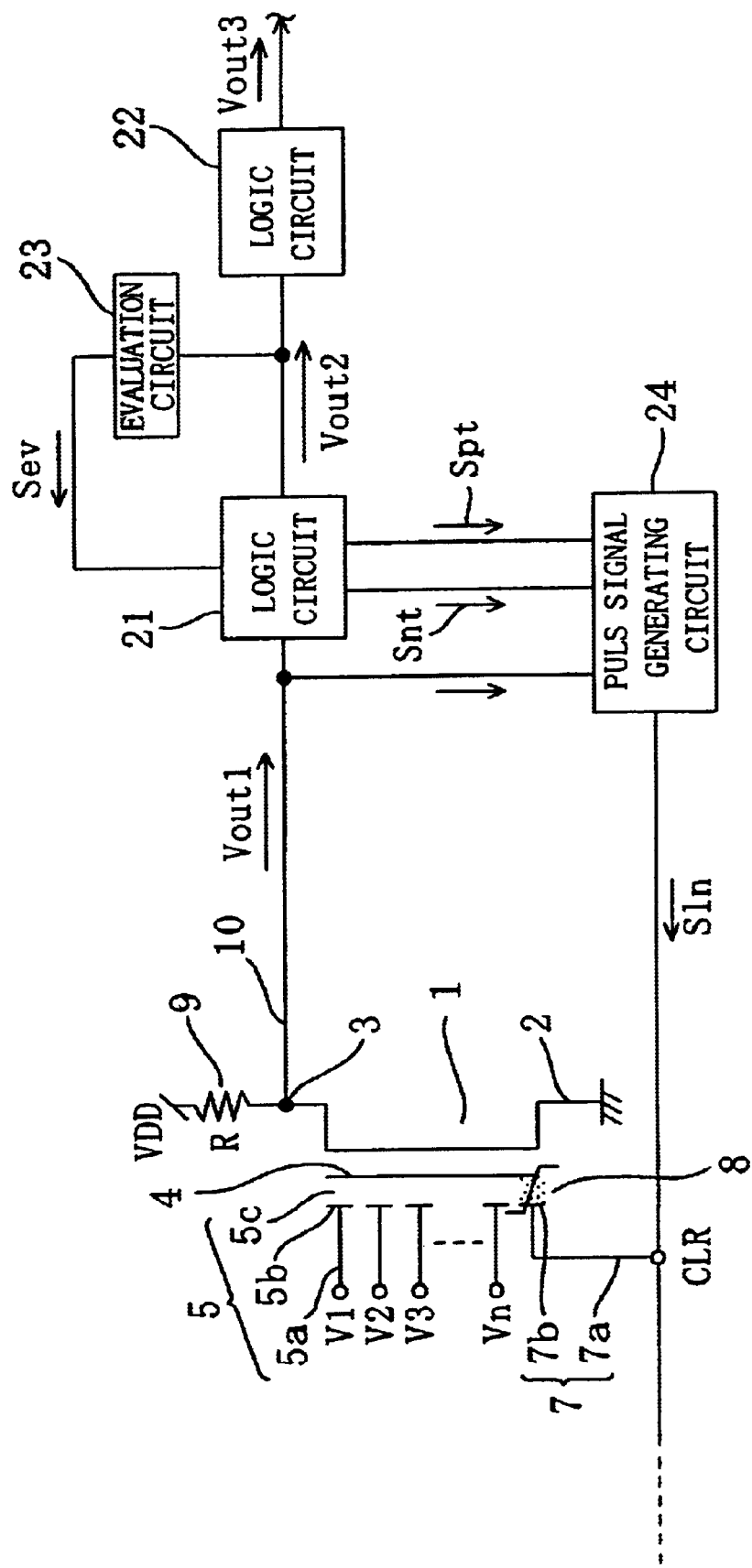
FIG. 8 is a schematic diagram showing a configuration of the neuron element which is the semiconductor device and a control circuit related a third embodiment of the present invention.

FIG. 8 is a schematic diagram showing a configuration of the neuron element which is the semiconductor device and the control circuit related a third embodiment of the present invention.

According to this embodiment, the control circuit is provided in addition to the neuron element of the first embodiment. The control circuit of this embodiment has a logical circuit 21 connected to the output terminal 10 for receiving a first output signal Vout1 and a logical circuit 22 of the next stage connected to the logical circuit 21 for receiving a second output signal Vout2 outputted therefrom, an evaluation circuit 23 containing various data, and a pulse signal generation circuit 24 for generating the pulse signal to be provided to the learning and storing portion 7.

The basic configuration and operation of the NMISFET 1 in this embodiment is as described in the first and second embodiments.

The first output signal Vout1 outputted from the output terminal 10 passes the logical circuit 21 and then becomes the second output signal Vout2 to be further transmitted to the logical circuit 22 of the next stage. As described in the first embodiment, if the total of the input values of the n pieces of signal input portions 5 becomes a certain value, the electric potential VF of the floating gate 4 exceeds the threshold voltage VTH of the NMISFET 1 and the NMISFET 1 becomes ON, so that a current runs between the source terminal 2 and the drain terminal 3 to be in a conductive state. When the NMISFET 1 becomes ON, the first output signal Vout1 changes from 1 to 0.

In addition, the evaluation circuit 23 compares the second output signal Vout2 to a reference value for evaluation stored in the evaluation circuit 23, and a resultant evaluation signal Sev is fed back to the logical circuit 21. The evaluation signal Sev is the signal outputted as a result of evaluating whether or not the second output signal Sout2 is close to the results sought by the signal output of the entire circuit, and the evaluation signal Sev can be provided to all other neuron elements requiring it. For instance, the evaluation signal Sev is a positive voltage signal in the case where it is close to the results sought by the second output signal Vout2 (reference value for evaluation), a negative voltage signal in the case where it is very far from the results sought by the second output signal Vout2 (reference value for evaluation), and a 0 V signal in the case where it is between them. To be more specific, it is determined whether to reinforce or curb the learning of the first output signal Vout1 by using the evaluation signal Sev in the logical circuit 21.

For instance, in the case where the NMISFET 1 is ON and the first output signal Vout1 is close to 0 V and the evaluation signal Sev is the positive voltage signal, a positive teacher signal Spt is supplied from the logical circuit 21 to the pulse signal generation circuit 24 in order to strengthen the first output signal Vout1. At this time, receiving the first output signal Vout1 and the positive teacher signal Spt from the pulse signal generation circuit 24, the pulse signal of a positive voltage for reinforcing the learning is outputted as a learning signal Sln to be provided to the learning and storing portion 7. Accordingly, a strong electric field in the negative direction is applied to both ends of the ferroelectric film 8. Thus, when the pulse signal of the positive voltage is applied and thereafter eliminated, the residual polarization of the ferroelectric film 8 becomes negative, and the absolute value thereof increases. This means that it becomes easier for the NMISFET 1 to be ON when the input portion 5 receives a positive input signal. To be more specific, it means that the NMISFET 1 becomes ON more easily due to the learning signal in which is the positive voltage pulse signal so as to reinforce the positive learning. The application time of the learning signal Sln should be the time necessary to cause polarization reversal of the ferroelectric film 8 or longer. For instance, the learning signal Sln may be the pulse signal wherein the time for applying to both ends of the ferroelectric film 8 the voltage which is the resistance voltage Vc or higher is 100 ns or so.

Likewise, in the case where the NMISFET 1 is OFF and the first output signal Vout1 is close to the power supply voltage and the evaluation signal Sev is the positive voltage signal, the positive teacher signal Spt is provided to the pulse signal generation circuit 24 from the logical circuit 21 in order to strengthen the first output signal Vout1. The pulse signal generation circuit 24 receives the first output signal Vout1 and the positive teacher signal Spt, and outputs a negative voltage pulse signal for reinforcing the learning as the learning signal Sln to be provided to the learning and storing portion 7.

On the other hand, in the case where the NMISFET 1 is ON and the first output signal Vout1 is close to 0 V and the evaluation signal Sev is the negative voltage, the negative teacher signal Snt is provided to the pulse signal generation circuit 24 from the logical circuit 21 in order to weaken the first output signal Vout1. At this time, the pulse signal generation circuit 24 receives the first output signal Vout1 and the negative teacher signal Snt, and outputs the negative voltage pulse signal for weakening (curbing) the learning as the learning signal Sln to be provided to the learning and storing portion 7. Accordingly, a strong electric field in the positive direction is applied to both ends of the ferroelectric film 8. Thus, when the pulse signal of the negative voltage is applied and thereafter eliminated, the residual polarization of the ferroelectric film 8 becomes positive, and the absolute value thereof increases. This means that it becomes more difficult for the NMISFET 1 to be ON when the input portion 5 receives a positive input signal. To be more specific, it means that the NMISFET 1 becomes ON less easily due to the learning signal in which is the negative voltage pulse signal so as to weaken (curb) the learning. The application time of the learning signal Sln should be the time necessary to cause polarization reversal of the ferroelectric film 8 or longer. For instance, the learning signal Sln may be the pulse signal wherein the time for applying to both ends of the ferroelectric film 8 the voltage which is the resistance voltage Vc or higher is 100 ns or so.

Likewise, in the case where the NMISFET 1 is OFF and the first output signal Vout1 is close to the power supply voltage and the evaluation signal Sev is the negative voltage signal, the negative teacher signal Snt is provided to the pulse signal generation circuit 24 from the logical circuit 21 in order to weaken the first output signal Vout1. The pulse signal generation circuit 24 receives the first output signal Vout1 and the negative teacher signal Snt, and outputs the positive voltage pulse signal for weakening the learning as the learning signal Sln to be provided to the learning and storing portion 7.

As described above, it is possible to reinforce and curb the learning at various ratios as in the second embodiment just by controlling the voltage of the learning signal Sln according to output signals Sout1 and Sout2 from the output terminal 10.

Moreover, in the case where the evaluation signal Sev is 0 V, the logical circuit 21 outputs neither the positive teacher signal Spt nor the negative teacher signal Snt so that the learning signal Sln remains at 0 V and the learning is neither reinforced nor curbed.

As described above, it is possible to use either the positive voltage pulse signal or the negative voltage pulse signal as the learning signal Sln. In that case, the NMISFET 1 can be used in a normal operation mode, and it is not necessary to control the voltage of the substrate area of the NMISFET 1.

Accordingly, the neuron element of this embodiment allows the learning using the ferroelectric film 8 to be easily reinforced and curbed without using the complicated control circuit. Thus, it is possible, by combining a large number of the neuron elements of this embodiment, to provide by the simple method the neuron elements having incorporated a facility capable of simply learning and storing output situation of each neuron and also easily reinforcing or weakening the learning and storing.

Moreover, while the circuit of the neuron element is constructed by combining the NMISFET 1 and the load resistance element 9 in this embodiment, it is also possible to use the p-type MIS transistor instead of the load resistance element 9 as in the second embodiment. In addition, while there are three types of the positive voltage, the negative voltage and 0 V as to the evaluation signal Sev, it is possible, by adjusting gradation of the voltage thereof with an analog value or the pulse number, to control the voltage of the learning signal Sln analog-wise so as to reinforce and curb the learning with higher accuracy.

Embodiment 4

While the first to third embodiments described the examples of mainly applying the present invention to the output-control type neuron elements, this embodiment describes the example of mainly applying it to the neuron elements of an output-reinforced type or the type capable of selecting either the output-control type or the output-reinforced type.

Figure 9:
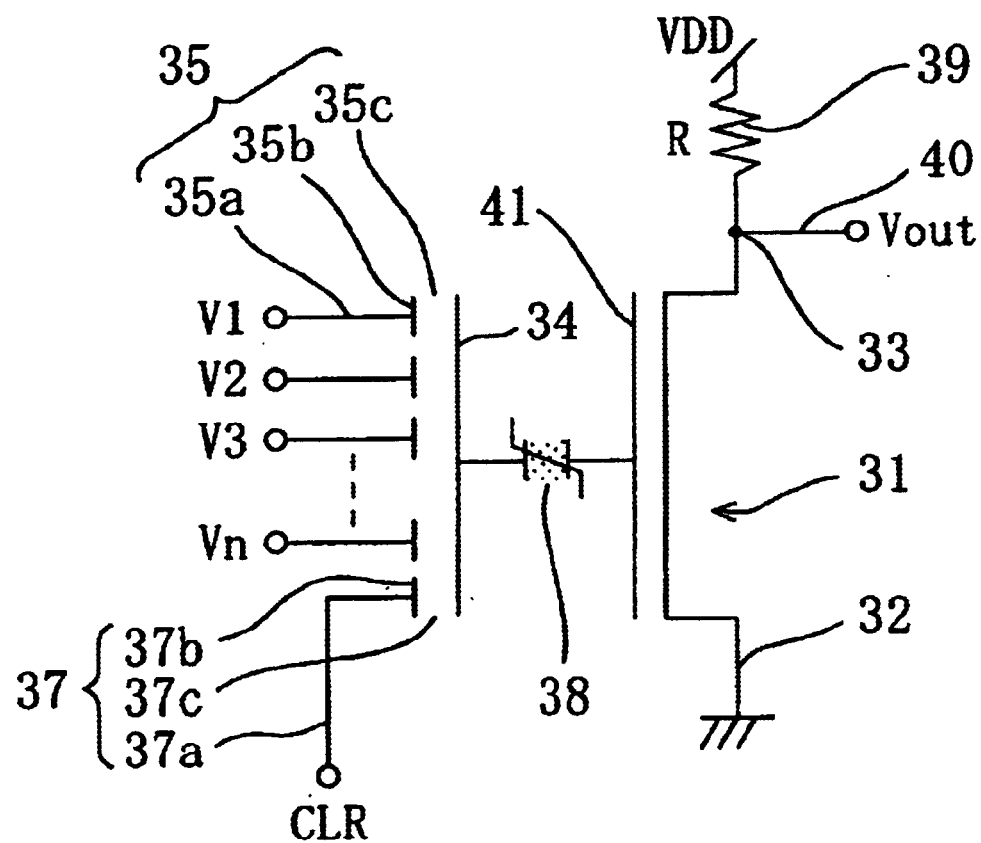
FIG. 9 is a schematic diagram showing a configuration of the neuron element which is the semiconductor device related a fourth embodiment of the present invention.

FIG. 9 is a schematic diagram showing a configuration of the neuron element which is the semiconductor device related a fourth embodiment of the present invention.

The neuron element of this embodiment has the n-channel type MIS transistor (NMISFET 31) having a source terminal 32, a drain terminal 33, a gate dielectric film 36 and a gate electrode 41. The source terminal 32 is grounded together with the substrate area of the NMISFET 31, and the drain terminal 33 is connected to an output terminal 40. The output terminal 40 is connected to the power supply voltage supply portion for supplying the power supply voltage VDD via a load resistance element 39.

In addition, a floating gate 34 opposite a gate electrode 41 of the NMISFET 31 sandwiching a ferroelectric film 38 is provided. And n pieces of signal input portions 35 for capacity coupling to the floating electrode 34 are provided. The signal input portion 35 is comprised of an input terminal 35a, an input gate electrode 35b to be connected to the input terminal 35a, and a paraelectric film 35c intervening between the input gate electrode 35b and the floating gate 34. To be more specific, the input gate electrode 35b and the floating gate 34 are capacity-coupled by the paraelectric film 35c.

The capacity between the input gate electrode 35b and the floating gate 34 is determined by the material, thickness and area of the paraelectric film 35c. The capacity between each input gate electrode 35b and floating electrode 34 can be either entirely the same or different for the sake of load.

In addition, a learning and storing portion 37 is provided, which has a voltage terminal 37a for receiving the voltage for polarization and a terminal 37b opposite the floating gate 34 sandwiching a paraelectric 37c. The voltage terminal 37a of the learning and storing portion 37 normally has the fixed voltage of 0 V (grounding voltage) applied thereto.

Moreover, the signal of the output terminal 40 is transmitted to the logical circuit (not shown) as in the third embodiment.

Here, as described in the first embodiment, if the total of the input values of the n pieces of signal input portions 35 becomes a certain value, the electric potential VF of the gate electrode 41 exceeds the threshold voltage VTH of the NMISFET 31 and the NMISFET 31 becomes ON, so that the current runs between the source terminal 32 and the drain terminal 33 to be in a conductive state. When the NMISFET 31 becomes ON, the voltage of the output terminal 40 changes from the power supply voltage VDD to 0. It should be designed so that, when the electric potential VF of the gate electrode 41 becomes the threshold voltage VTH of the NMISFET 31, the capacity of the ferroelectric film 38, the gate capacity of the NMISFET 31, the paraelectric films 35c of the n pieces of signal input portions 35, and the capacity of the paraelectric films 37c of the learning and storing portion 37 are optimized so that the resistance voltage Vc is applied to both sides of the ferroelectric film 38. Then, the polarization of the ferroelectric film 38 is reversed from −QM to +QM the instant when the NMISFET 31 becomes ON, becoming larger just by +2QM. Accordingly, for the NMISFET 31 to become ON next, the electric potential VF of the floating electrode 34 may be smaller by 2QM/(C1+C2+. . . +Cn+CM+C0). In other words, it equivalently means that the residual polarization of the ferroelectric film 38 has learned and stored that the NMISFET 31 became ON and is strengthening the output. In order to reset this learning, the voltage negative to the signal input portions 35 should be applied to the learning and storing control portion 37.

While the configuration of the neuron element of the output-reinforced type was described in this embodiment, there is also the method of selecting the output-control type or the output-reinforced type by using wiring or the transistor.

Figure 10A:
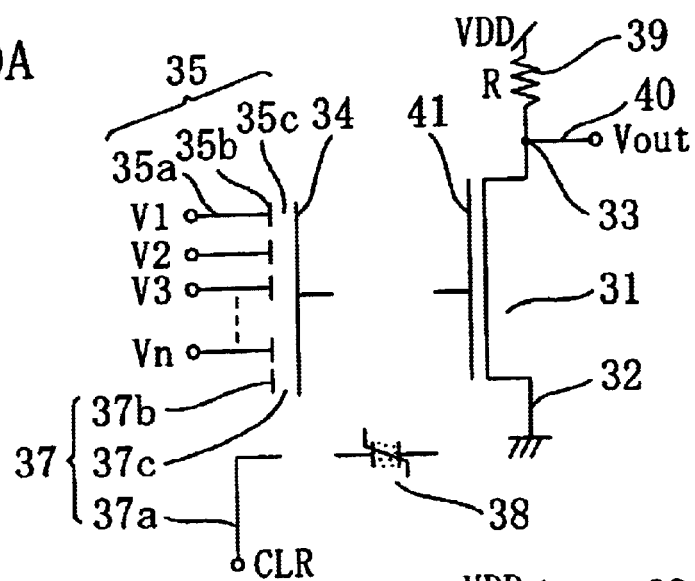
FIGS. 10A to C are schematic diagrams showing a configuration of the neuron element which is the semiconductor device before switched wiring, the configuration when wired as an output-control type, and the configuration when wired as an output-reinforced type related to an deformation example of the fourth embodiment of the present invention in order respectively.
Figure 10B:
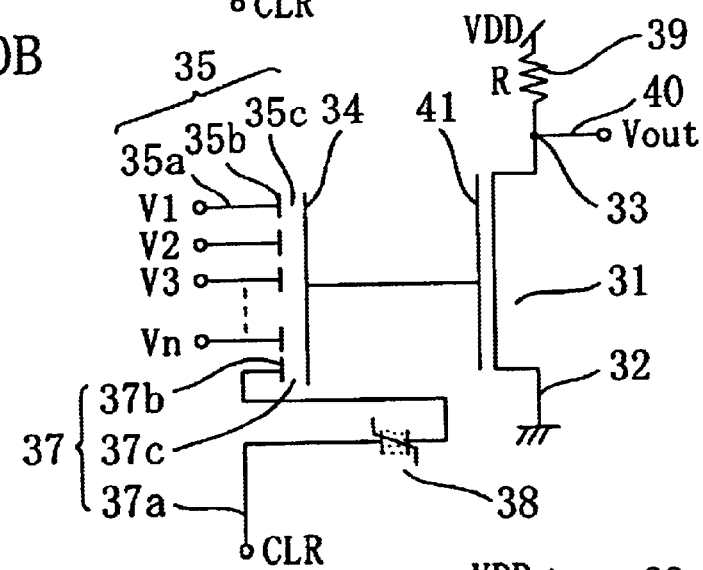
Figure 10C:
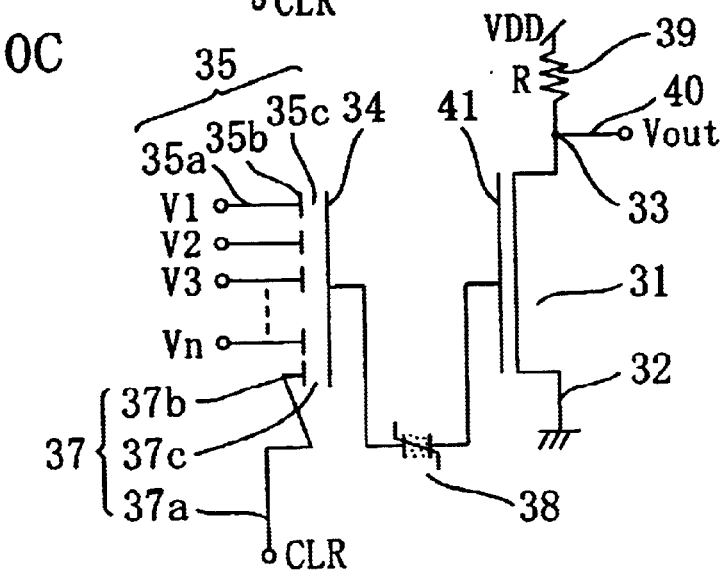

FIGS. 10A to C are schematic diagrams showing a configuration of the neuron element which is the semiconductor device before switched wiring, the configuration when wired as the output-control type, and the configuration when wired as an output-reinforced type related to the deformation example of the fourth embodiment of the present invention in order respectively.

As shown in FIG. 10A, before the switched wiring, the gate electrode 41, the floating electrode 34 and the two electrodes sandwiching the ferroelectric film 38 of the NMISFET 31 are not connected. In addition, the voltage terminal 37a and a terminal 37b of the learning and storing portion 37 are not mutually connected.

As shown in FIG. 10B, one method is to perform wiring so as to connect the two electrodes sandwiching the ferroelectric film 38 to the voltage terminal 37a and the terminal 37b of the learning and storing portion 37. In other words, it is to have the ferroelectric film 38 in the voltage terminal 37a of the learning and storing portion 37. If thus connected, the learning and storing portion 37 obtains the negative learning ability of weakening the learning on application of the fixed voltage of 0 V to the voltage terminal 37a.

As shown in FIG. 10C, another method is to perform wiring so as to connect the two electrodes sandwiching the ferroelectric film 38 to the gate electrode 41 and the floating electrode 34. In other words, it is to have the ferroelectric film 38 between the gate electrode 41 and the floating electrode 34. If thus connected, just as in the fourth embodiment, the learning and storing portion 37 obtains the positive learning ability of reinforcing the learning on application of the fixed voltage of 0 V to the voltage terminal 37a.

Moreover, while this deformation example has the configuration wherein connection relationships among the ferroelectric film 38, the gate electrode 41, the floating electrode 34 and the learning and storing portion 37 are switched by the wiring, it is also possible to perform the wiring and then place a switching transistor on each path so as to switch to the connection relationship shown in FIG. 10B or 10C. In that case, it is possible to change the function in the middle of use.

Embodiment 5

Figure 11A:
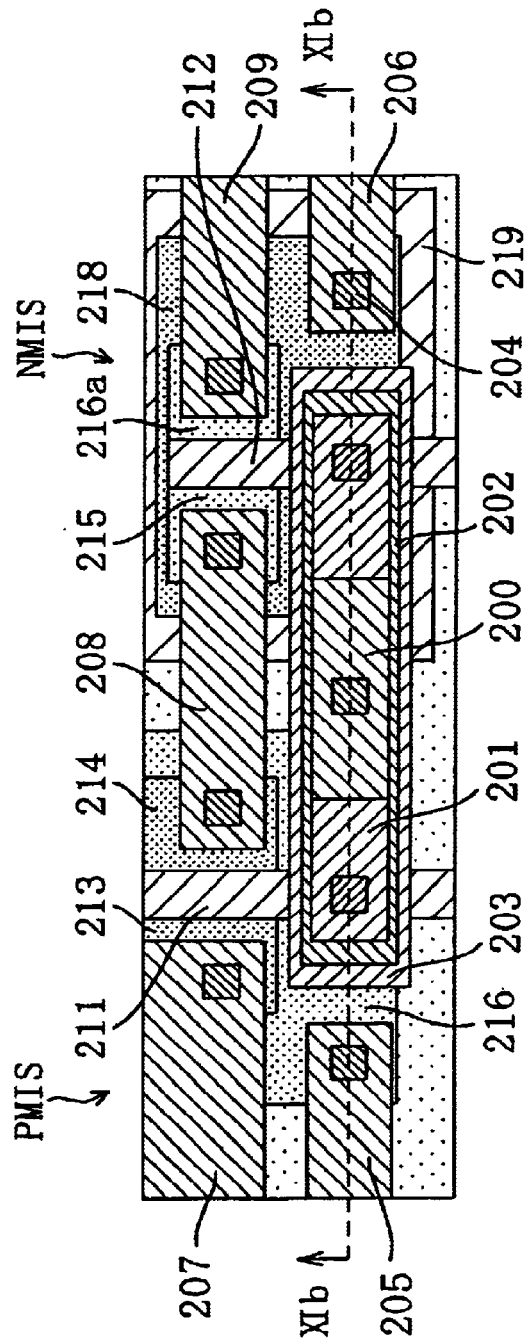
FIGS. 11A and B are a plan view of an electric potential generating device of the neuron element and a sectional view on a XIb—XIb line related to the fifth embodiment of the present invention in order respectively.
Figure 11B:
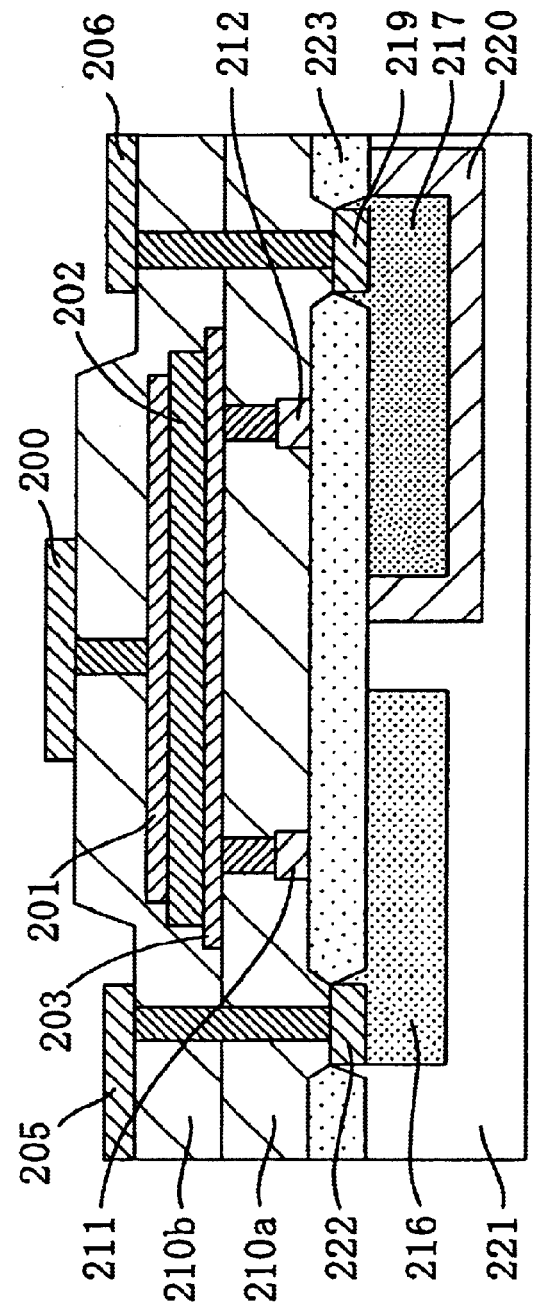

FIGS. 11A and B are a plan view of an electric potential generating device of the neuron element and a sectional view on a XIb—XIb line related to the fifth embodiment of the present invention in order respectively.

In FIGS. 11A and B, reference numeral 200 denotes an input electrode, 201 denotes the upper electrode of the ferroelectric capacitor, 202 denotes the ferroelectric film of the ferroelectric capacitor, 203 denotes the lower electrode of the ferroelectric capacitor, 204 denotes a contact, 205 denotes a substrate electrode of a P type MIS transistor (PMIS), that is, a PMIS substrate electrode, 206 denotes an NMIS substrate electrode of an N type MIS transistor (NMIS), 207 denotes a PMIS drain electrode, 208 denotes an output electrode, 209 denotes an NMIS drain electrode, 210a denotes a first interlayer dielectric film, 210b denotes a second interlayer dielectric film, 211 denotes a PMIS gate electrode comprised of polycrystalline silicon, 212 denotes an NMIS gate electrode, 213 denotes a PMIS drain region, 214 denotes a PMIS source region, 215 denotes an NMIS source region, 216 denotes an NMIS drain region, 217 denotes an N type well region, 218 denotes a P type well region, 219 denotes a LOCOS oxide film, 220 denotes an N type triple well region, 221 denotes a P type Si substrate, 222 denotes an N type high density contact region, and 223 denotes a P type high density contact region. Moreover, although it is not shown in FIGS. 11A and B, the gate dielectric films such as a silicon oxide film and a silicon oxide nitride film intervene between the PMIS gate electrode 211 and the N type well region 216, and between the NMIS gate electrode 212 and the P type well region 217 respectively.

As shown in FIGS. 11A and B, the N type well region 216 and the P type well region 217 are provided in the P type Si substrate 221, and the underside and the sides of the P type well region 217 are surrounded by the N type triple well region 220. In addition, the LOCOS oxide film 219 surrounding an active region where the transistors and so on are provided is formed on the surface of the P type Si substrate 221. Moreover, the first interlayer dielectric film 210a and the second interlayer dielectric film 210b comprised of a thick silicon oxide film are sequentially formed on the P type Si substrate 221.

And the electric potential generating device of the neuron element related to the fifth embodiment of the present invention has the P type MIS transistor (PMIS) formed on the N type well region 217 and the N type MIS transistor (NMIS) formed on the P type well region 218. The PMIS source region 214 and the NMIS source region 215 are electrically connected to the common output electrode 208 via the contact 204. In addition, the NMIS drain region 216a is connected via the contact 204 to the NMIS drain electrode 209 for receiving the power supply voltage, and the PMIS drain region 213 is electrically connected via the contact 204 to the PMIS drain electrode 207 for receiving the grounding voltage. The output electrode 208, the PMIS drain electrode 207 and the NMIS drain electrode 209 are all formed on the second interlayer dielectric film 210b. In addition, the PMIS substrate electrode 205 and the P type well region 217 are provided on the second interlayer dielectric film 210b. The N type high density contact region 222 is formed in the N type well region 216, and the PMIS substrate electrode 205 is electrically connected to the N type high density contact region 222 via the contact 204. The P type high density contact region 223 is formed in the P type well region 217, and the NMIS electrode 206 is electrically connected to the P type high density contact region 223 via the contact 204.

The ferroelectric capacitor is comprised of the lower electrode 203 formed on the first interlayer dielectric film 210a, the ferroelectric film 202 formed on the lower electrode 203, and the upper electrode 201 formed on the ferroelectric film 202. The lower electrode 203 of the ferroelectric capacitor is electrically connected to the PMIS gate electrode 211 and the NMIS gate electrode 212, and the upper electrode 201 of the ferroelectric capacitor is connected to the input electrode 200 provided on the second interlayer dielectric film 210b.

If the input voltage is applied to the input electrode 200, the voltage applied to the ferroelectric film 202 becomes smaller when a capacitance value of the gate dielectric film is very small compared to the ferroelectric film 202, so that the residual polarization of the ferroelectric film 202 becomes smaller, and so the voltage of the lower electrode 203, that is, a gate bias applied to the PMIS gate electrode 211 and the NMIS gate electrode 212 becomes smaller. In addition, in the case where capacitance value of the gate dielectric film is very large compared to the ferroelectric film 202, a distributed voltage to the ferroelectric film 202 increases but the polarization is saturated before long, and so the voltage of the lower electrode 203, that is, the gate bias applied to the PMIS gate electrode 211 and the NMIS gate electrode 212 becomes smaller after all as is understandable from V=Q/C. Thus, in order to render the gate bias maximum, the capacity ratio between the ferroelectric film 202 and the gate dielectric film must become an optimum value. Accordingly, if the materials and film thickness of the ferroelectric film 202 and the gate dielectric film remain unchanged, the area ratio between the ferroelectric film 202 and the gate dielectric film is important. In this embodiment, the ferroelectric film 202 is formed on the first interlayer dielectric film 210a, so that it is easy to adjust the ratio between the ferroelectric film 202 and the gate dielectric film.

Next, the method of manufacturing the electric potential generating device related to this embodiment will be described.

First, the LOCOS oxide film 219 is formed as element separation on the P type Si substrate 221. Next, in this embodiment, the N type triple well region 220 is formed by injecting As ion of high energy in the region where the NMIS transistor is formed in order to independently control the substrate potential of each MIS transistor. Although it is not shown, the N type triple well region 220 is connected to a potential control electrode via the contact, so that the electric potential of the N type triple well region 220 is controlled to keep the P type well region 217 and the N type triple well region 220 from becoming forward biases.

Moreover, while the N type triple well is used in this embodiment in order to mutually and independently control the electric potential of each substrate area, the SOI technology may also be used.

Next, the N type well region 216 and the P type well region 217 are formed by injecting the As ion and B ion respectively.

Thereafter, the gate dielectric film of 10 nm thickness and the polycrystalline silicon film of 400 nm thickness are formed on the substrate, and then patterning of the polycrystalline silicon film is performed so as to form the PMIS gate electrode 211 of 5-$\mu$m gate length and 50-$\mu$m gate width and the NMIS gate electrode 212 of 5-$\mu$m gate length and 25-$\mu$m gate width.

And the PMIS drain region 213 and the PMIS source region 214 are formed in the N type well region 216 by the B ion injection using the PMIS gate electrode 211 as a part of a mask. Likewise, the NMIS drain region 216a and the NMIS source region 215 are formed in the P type well region 217 by the As ion injection using the NMIS gate electrode 212 as a part of the mask.

Next, in order to reduce contact resistance, the surface portions of the gate electrodes 211 and 212, the source regions 214 and 215, the drain regions 213 and 216a, and the high density contact region 222 and 223 are rendered as suicide. Thereafter, a TEOS film by plasma CVD is accumulated on the substrate so as to accumulate the first interlayer dielectric film 210a.

Next, a hole penetrating the first interlayer dielectric film 210a and reaching the gate electrodes 211 and 212 is formed, and the contact 204 for filling the hole such as tungsten is formed. Thereafter, the CVD method is used to accumulate TiN as an adherence layer on the first interlayer dielectric film 210a and the contact 204, and then a Pt film (platinum film) is accumulated by using a sputtering method. And the patterning of the Pt film and the TiN film is performed so as to form the lower electrode 203. And in this embodiment, a PLT film which is a lead titanate lanthanum (($Pb_{0-85}(La_{0-1}Ti_{0-9})_{0-15}O_3$)) film of which area is 50 $\mu m^2$ and film thickness is 400 $\mu$m is accumulated at a substrate temperature of 600 degrees C. or so by the sputtering method on the lower electrode 203 and the first interlayer dielectric film 210a, and then the patterning of the PLT film is performed so as to form the ferroelectric film 202 on the lower electrode 203. Thereafter, the Pt film is accumulated by the sputtering method on the ferroelectric film 202, the lower electrode 203 and the first interlayer dielectric film 210a, and then the patterning of the Pt film is performed so as to form the upper electrode 201 formed on the ferroelectric film 202.

Next, the second interlayer dielectric film 210b comprised of TEOS is accumulated on the substrate, a hole penetrating the second interlayer dielectric film 210b and reaching the source regions 214, 215, the drain regions 213, 216 and the high density contact regions 222, 223 is formed, and then the contact 204 is formed by filling the hole with the tungsten and so on. And Al wiring is formed on the second interlayer dielectric film 210b, which wiring includes the PMIS drain electrode 207, the output electrode 208, the NMIS drain electrode 209, the PMIS substrate electrode 205, the NMIS substrate electrode 206, the input electrode 200 and so on.

In this Al wiring, the input electrode 200 electrically connected to the upper electrode 201 of the ferroelectric capacitor is the electrode for receiving the input signal, and the output electrode 208 electrically connected to the PMIS source region 214 and the NMIS source region 215 is the electrode for outputting the output signal. The NMIS drain electrode 209 and the PMIS substrate electrode 205 are connected to the power supply voltage supply portion (not shown) for supplying the power supply voltage VDD. The PMIS drain electrode 207 and the NMIS substrate electrode 206 are connected to a ground (not shown) for supplying ground voltage VSS.

Moreover, while the P type Si substrate is used in this embodiment, an N type Si substrate may also be used.

Figure 12:
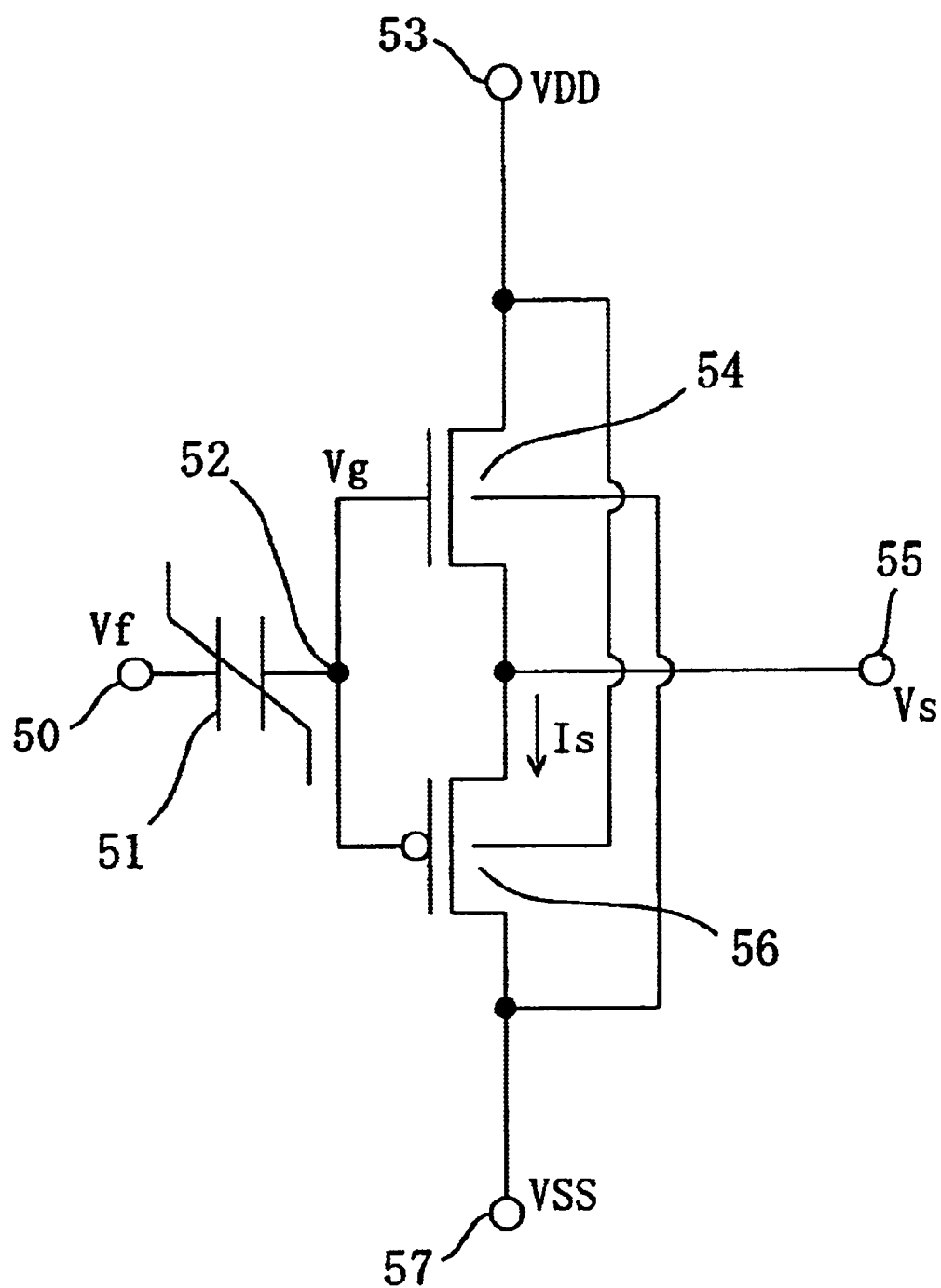
FIG. 12 is an equivalent circuit diagram of the electric potential generating device of the neuron element related to the fifth embodiment of the present invention.

FIG. 12 is the equivalent circuit diagram of the electric potential generating device of the neuron element of this embodiment. In this embodiment, as shown in FIG. 12, it is equivalent to the circuit wherein a ferroelectric capacitor 51 which is the first capacitor is connected to a gate portion 52 which is a common gate electrode to an N type MIS transistor (NMISFET) 54 which is a second MISFET and a P type MIS transistor (PMISFET) 56 which is a first MISFET.

And the source which is one diffusion region of the N type MIS transistor 54 and the source of the P type MIS transistor 56 are mutually connected, and are also connected to an output terminal 55. Then drain which is the other diffusion region of the N type MIS transistor 54 is connected to a power supply voltage supply portion 53 for supplying power supply voltage VDD, and the drain of the P type MIS transistor 56 is connected to a ground 57 for supplying ground voltage VSS. Moreover, the substrate potential of the N type MIS transistor 54 is the ground voltage VSS, and the substrate potential of the P type MIS transistor 56 is the power supply voltage VDD. Thus, the circuit for taking out the output from the source is called a source follower circuit.

Here, the operation of the source follower circuit which is the electric potential generating device of this embodiment will be described. The electric potential of the gate portion 52 (gate bias) is Vg, and that of the output terminal 55 is Vs. The N type MIS transistor 54 is operating in a saturated region, and the P type MIS transistor 56 is in an off state. If the threshold voltage of the N type MIS transistor 54 is Vtn and that of the P type MIS transistor 56 is Vtp, a current Is running in the N type MIS transistor 54 is represented by the following formula (2).

$$Is = \mu n \cdot Cox \cdot Wn(Vg-Vs-Vtn)^2/2Ln \qquad (2)$$

However, $\mu n$ is mobility of the electron, Cox is the capacity of the gate dielectric film, Wn is the gate width, and Ln is the gate length.

As the P type MIS transistor 56 is in the off state, it can be regarded as very great resistance. For this reason, Is is almost 0. Accordingly, the electric potential Vs of the output terminal 55 from the formula (2) is represented by the following formula (3).

$$Vs = Vg - Vtn \qquad (3)$$

To be more specific, the electric potential Vs of the output terminal 55 is the value wherein the electric potential Vg of the gate portion became smaller by the threshold voltage Vtn of the N type MIS transistor 54. And the range of the electric potential Vs of the output terminal 55 is between VSS to VDD. Thus, the input is conveyed almost as-is to the circuit of the next stage by the source follower circuit. Furthermore, as there is little influence between the source follower circuit and the circuit of the previous stage or the next stage, the source follower circuit is used as a buffer inserted between the circuits.

The electric potential generating device of this embodiment is constituted by providing the two MIS transistors 54 and 56 constituting the source follower circuit, and the ferroelectric capacitor 51 between the gate portion 52 which is the common gate electrode to the MIS transistors 54, 56 and the input terminal 50. And if the electric charge is induced to the gate portion 52 by the polarization of the ferroelectric capacitor 51, it is possible, with the electric potential generated thereby, to generate the voltage signal which is nonvolatile for outputting from the output terminal 55 of the source follower circuit.

Next, operating characteristics of the electric potential generating device of this embodiment will be described by referring to FIG. 13 and FIG. 14. In the following description of the operation, the power supply voltage VDD is 0 V, and the ground voltage VSS is −5 V. In addition, the threshold voltage of the N type MIS transistor 54 is 1.0 V, and that of the P type MIS transistor 56 is −1.0 V.

Figure 13A:
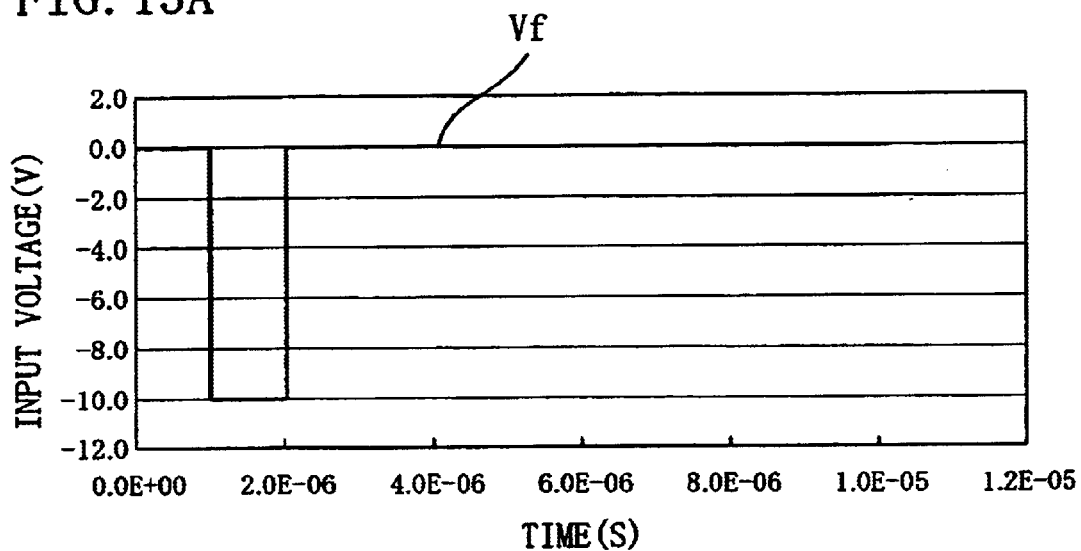
FIGS. 13A and B are a time chart showing time variation of a voltage of an input terminal and a time chart showing time variation of the voltage of a gate portion and an output terminal in the fifth embodiment in order respectively.

FIGS. 13A and B are a time chart showing time variation of the voltage of the input terminal 50 and the time chart showing time variation of the voltage of the gate portion 52 and the output terminal 55 in order respectively.

Figure 13B:
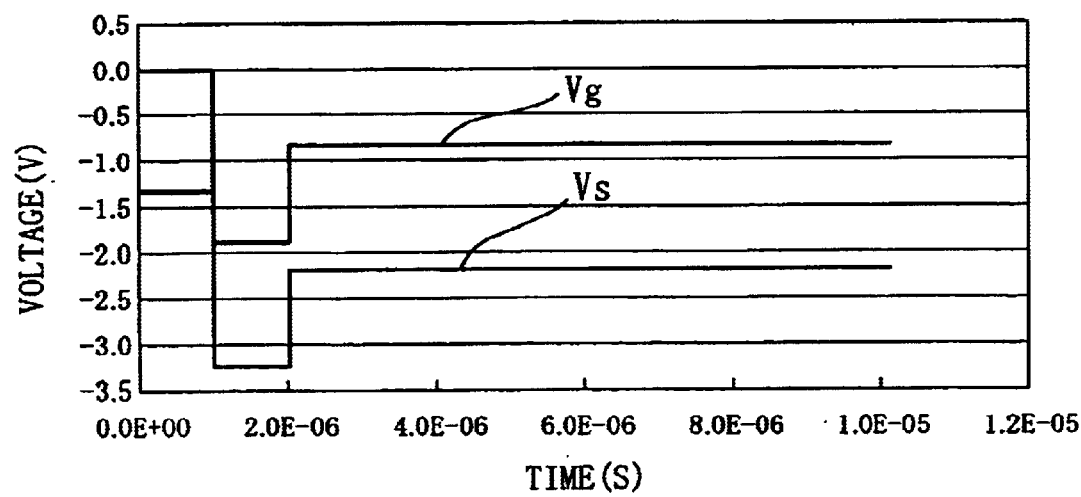

As shown in FIG. 13A, if the pulse signal of −10 V is inputted to the input terminal 50, the residual polarization is generated in the ferroelectric capacitor 51. As shown in FIG. 13B, even after the pulse signal passed, the electric potential of the gate portion 52 is kept at −0.85 V due to the residual polarization of the ferroelectric capacitor 51. Next, as the electric potential of the gate portion 52 is conveyed to the output terminal 55 through the above-mentioned source follower circuit, the electric potential of the output terminal 55 is kept at −2.2 V even after the pulse signal passed as shown in FIG. 13B. Thus, the pulse signal is inputted to the input terminal 50 so that, even after the electric potential of the input terminal 50 returns to 0 V, the negative voltage is kept by the output terminal 55 due to the polarization of the ferroelectric capacitor 51. It becomes possible, due to this nonvolatile bias, to keep the electric potential of the output terminal 55 at a desired electric potential without constantly applying the voltage to the input terminal 50 so as to curb power consumption.

Next, stability of the electric potential of the gate portion 52 in circuit operation of the electric potential generating device related to this embodiment will be described by referring to FIG. 14.

Figure 14A:
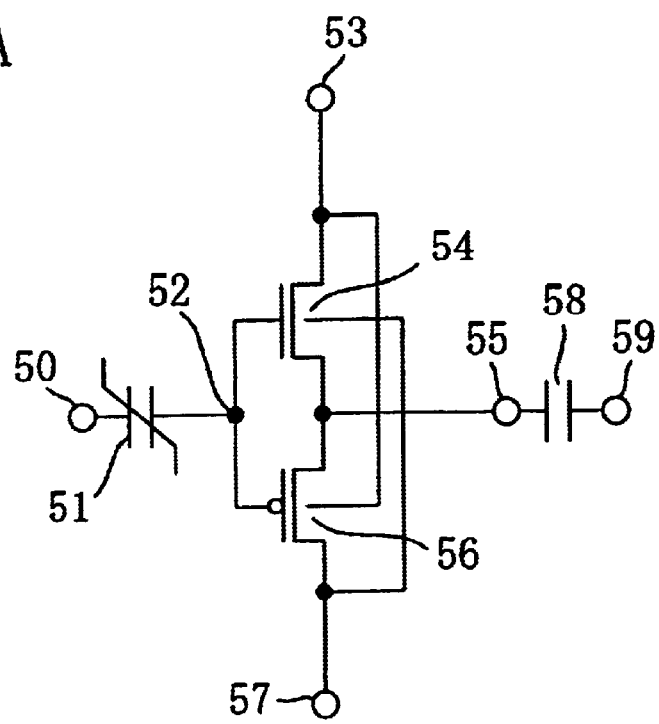
FIGS. 14A, B and C are a circuit diagram showing the configuration of a test circuit for examining electric potential stability of the gate portion of the fifth embodiment, a time chart showing the time variation of the electric potential of the input terminal, and a time chart showing the time variation of the electric potential of the gate portion in order respectively.
Figure 14B:
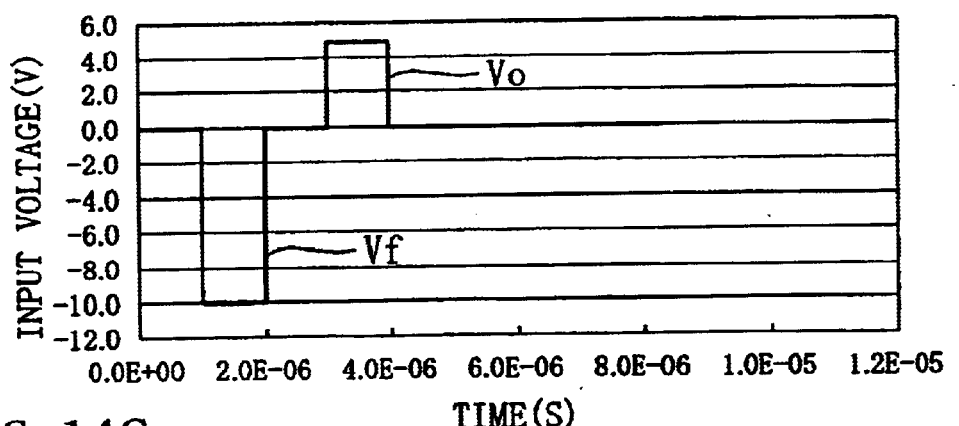

FIGS. 14A, B and C are a circuit diagram showing a configuration of a test circuit for examining electric potential stability of the gate portion 52, the time chart showing the time variation of the electric potential of the input terminal 50, and the time chart showing the time variation of the electric potential of the gate portion 52 in order respectively.

As shown in FIG. 14A, this test circuit has a second input terminal 59 and a paraelectric capacitor 58 of a capacity value 0.1 pF intervening between this second input terminal 59 and the output terminal 55 of the electric potential generating device in addition to the electric potential generating device shown in FIG. 12. If the pulse signal of −10 V is inputted to the input terminal 50, the electric potential of −1.08 V is generated in the gate portion 52. Thereafter, the pulse signal of 5 V is in putted to the second input terminal 59 so that, on a rise and a fall of the pulse signal, a transient current runs in the MIS transistors 54, 56 and the paraelectric capacitor 58 respectively and the electric potential of the gate portion 52 changes a little, but it is almost stably at −100 V in a stable region of the gate portion 52 so as to return to the original set voltage as is understood.

For this reason, according to the electric potential generating device of this embodiment, even when an output potential of the ferroelectric capacitor changes as in the past example, the electric charge induced to the ferroelectric capacitor remains unchanged and also the residual polarization is kept stable. In addition, while the transient current can be curbed by rendering the threshold voltage of the MIS transistors higher, it cannot be rendered very high since the higher threshold voltage influences the output as is understandable from the formula (3) and furthermore, the MIS transistors no longer operate in the saturated region on conveyance of the electric potential.

As opposed to this, as for the electric potential generating device of this embodiment, the threshold voltage of the N type MIS transistor is 1.0 V and that of the P type MIS transistor is −1.0 V as described above, and so it is possible to obtain the optimum operation without rendering the threshold voltages of the MIS transistors so high. Thus, the electric potential generating device was constituted by connecting the source follower circuit to the ferroelectric capacitor 51, so that the electric potential of the gate portion 52 changed very little even if the pulse signal was added to the second input terminal 59 to change the electric potential of the output terminal 55.

As described above, according to the electric potential generating device of this embodiment, it is possible, by utilizing the ferroelectric capacitor 51, to keep the electric potential of the output terminal 55, that is, the voltage of the output signal almost constant with the residual polarization without constantly applying the voltage to the input terminal 50. Thus, it is possible to implement reduction in the power consumption of the circuit utilizing this electric potential generating device.

In particular, the source follower circuit is connected to an output side electrode of the ferroelectric capacitor 51, so that there is very little influence on the residual polarization generated on the ferroelectric capacitor 51 even if voltage fluctuation occurs to the output portion (output terminal 55) of the source follower circuit. To be more specific, the electric potential induced by the residual polarization is stably conveyed to the circuit of the next stage by passing the source follower circuit.

Moreover, while the PLT is used for the material constituting the ferroelectric film of the ferroelectric capacitor in this embodiment, the ferroelectric film of the present invention may be any material showing the polarization characteristics having a hysteresis nature. For instance, ferroelectric materials such as bismuth titanate ($Bi_4Ti_3O_{12}$) (BIT), tantalic acid strontium bismuth ($SrBi_2Ta_2O_9$) (Y1) and titanic acid zirconate (Pb ($Zr_{0-45}Ti_{0-55}$)$O_3$) (PZT), a high molecular compound for saving the data by utilizing a charge bias and so on are used as the ferroelectric film in the ferroelectric capacitor of the electric potential generating device of the present invention so as to obtain the same action and effects as this embodiment.

Embodiment 6

Figure 15:
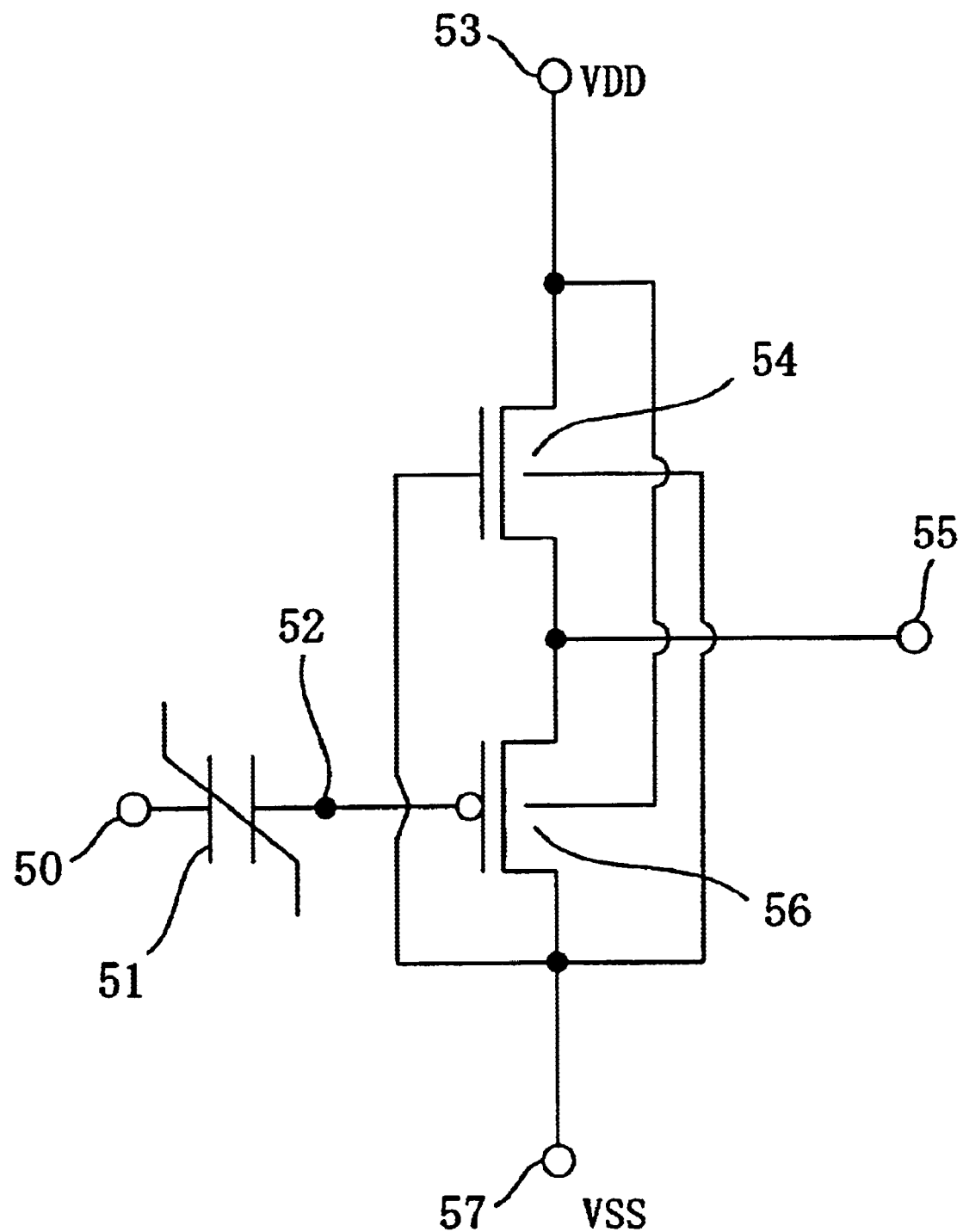
FIG. 15 is an equivalent circuit diagram of the electric potential generating device related to the sixth embodiment of the present invention.

FIG. 15 is an equivalent circuit of the electric potential generating device related to the sixth embodiment of the present invention.

As shown in this drawing, while the electric potential generating device of this embodiment has almost the same element as that of the fifth embodiment, this embodiment is different therefrom in that the gate of the N type MIS transistor 54 is connected to a ground 57 and is maintained at the ground potential VSS.

While the operating characteristics of the electric potential generating device of this embodiment is almost the same as those of the fifth embodiment, this embodiment has an advantage that the N type MIS transistor 54 functions as a high resistor and so the transient current can be rendered very little without rendering a threshold voltage Vpt of the P type MIS transistor 56 high.

Moreover, it is also possible to place a resistive element having a high resistance value instead of the N type MIS transistor 54 of this embodiment.

Embodiment 7

Figure 16:
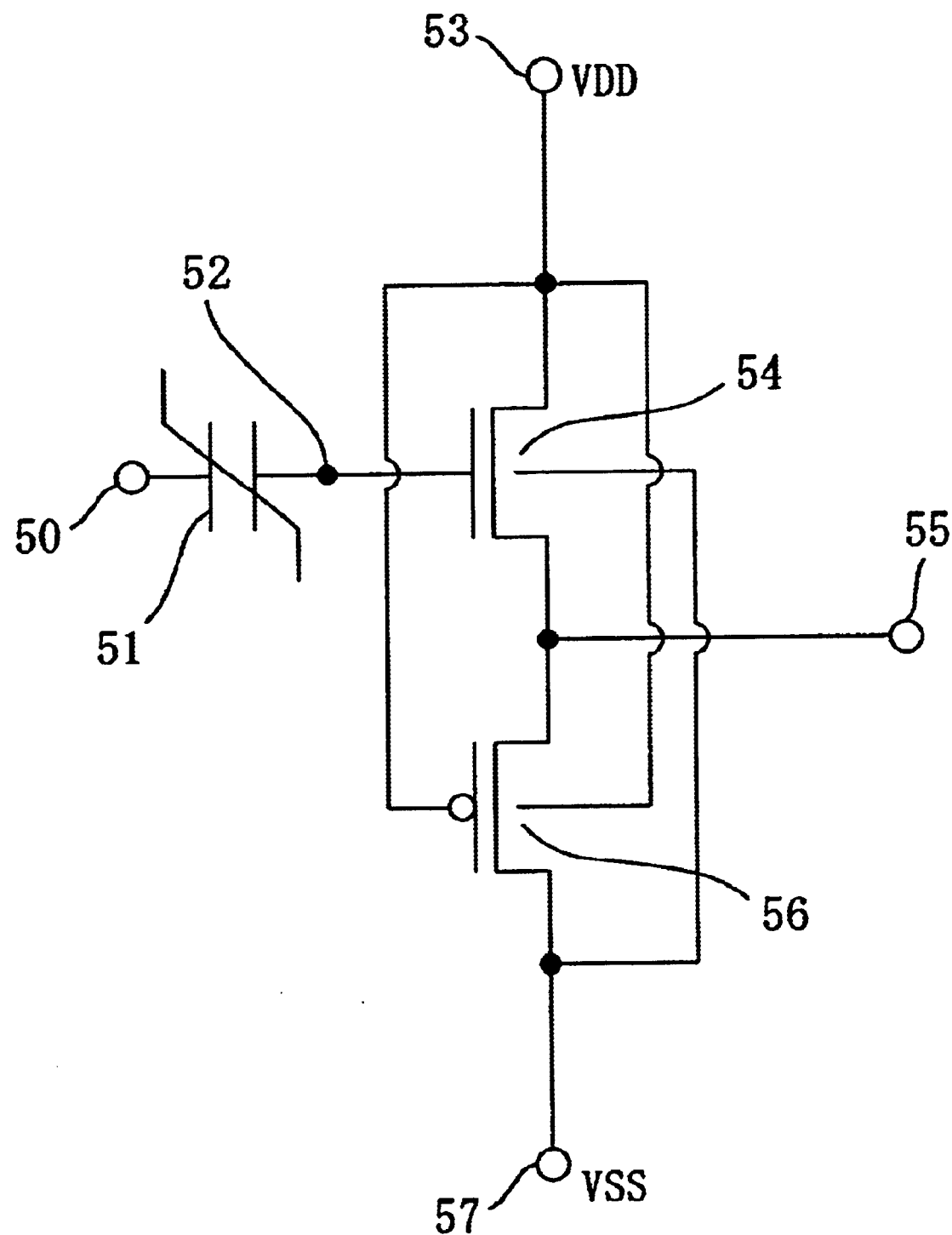
FIG. 16 is an equivalent circuit diagram of the electric potential generating device related to the seventh embodiment of the present invention.

FIG. 16 is an equivalent circuit diagram of the electric potential generating device related to the seventh embodiment of the present invention.

As shown in this drawing, while the electric potential generating device of this embodiment has almost the same element as that of the fifth embodiment, this embodiment is different therefrom in that the gate of the P type MIS transistor 56 is connected to the power supply voltage supply portion 53 and is maintained at the power supply voltage VDD.

While the operating characteristics of the electric potential generating device of this embodiment is almost the same as those of the fifth embodiment, this embodiment has an advantage that the P type MIS transistor 56 functions as a high resistor and so the transient current can be rendered very little without rendering a threshold voltage Vpn of the N type MIS transistor 54 high.

Moreover, it is also possible to place the resistive element having the high resistance value instead of the P type MIS transistor 56 of this embodiment.

Embodiment 8

Figure 17:
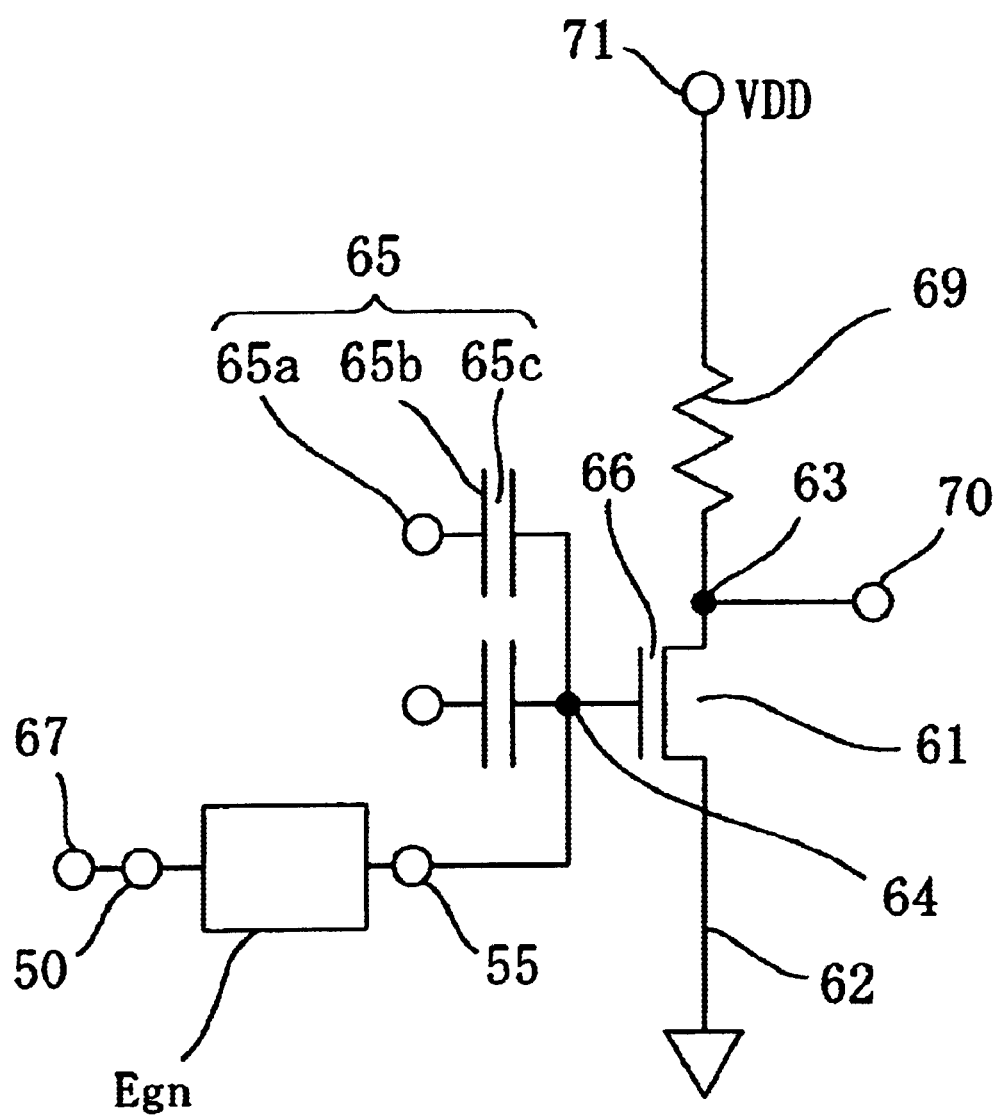
FIG. 17 is an equivalent circuit diagram of the neuron element related to the eighth embodiment of the present invention.

FIG. 17 is an equivalent circuit diagram of the neuron element related to the eighth embodiment of the present invention. As shown in this drawing, the neuron element of this embodiment has the configuration wherein the electric potential generating device of the fifth embodiment is added to the neuron element having almost the same structure as the first embodiment.

To be more specific, the neuron element of this embodiment has the n-channel type IS transistor (NMISFET 61) having a source terminal 62, a drain terminal 63, a gate dielectric film 66 and the gate electrode as with the first embodiment. Here, the gate electrode of the NMISFET 61 is a floating gate 64 which is connected to no other terminal and is in the floating state. The source terminal 62 is grounded together with the substrate area of the NMISFET 61, and the drain terminal 63 is connected to an output terminal 70. The output terminal 70 is connected to the power supply voltage supply terminal 71 for supplying the power supply voltage VDD via a load resistance element 69.

In addition, it has two input terminals 65 for capacity coupling to the floating gate 64. The signal input portion 65 is comprised of an input terminal 65*a*, an input gate electrode 65*b* to be connected to the input terminal 65*a*, and a paraelectric film 65*c* intervening between the input gate electrode 65*b* and the floating gate 64. To be more specific, the input gate electrode 65*b* and the floating gate 64 are capacity-coupled by the paraelectric film 65*c*. However, there may be provided three or more signal input portions 65.

And in this embodiment, the electric potential generating device of the fifth embodiment (see FIG. 12) intervenes between a control terminal 67 for receiving the control signal and the floating gate 64. To be more specific, the control terminal 67 is connected to the input terminal 50 of the electric potential generating device, and the output terminal 55 of the electric potential generating device is connected to the floating gate 64.

In this embodiment, the capacity value of each paraelectric film 65*c* of the input portion 65 is 0.5 pF, and an electric resistance of the load resistance element 69 is 100 kohms. In addition, the gate length of the N type MIS transistor 61 is 10 µm, the gate width is 50 µm, and the threshold voltage is −0.8 V. The voltage VDD of a power supply voltage supply terminal 71 is 5 V.

Next, the operating characteristics of the circuit of this embodiment will be described by referring to FIGS. 18A, B and FIG. 19.

Figure 18A:
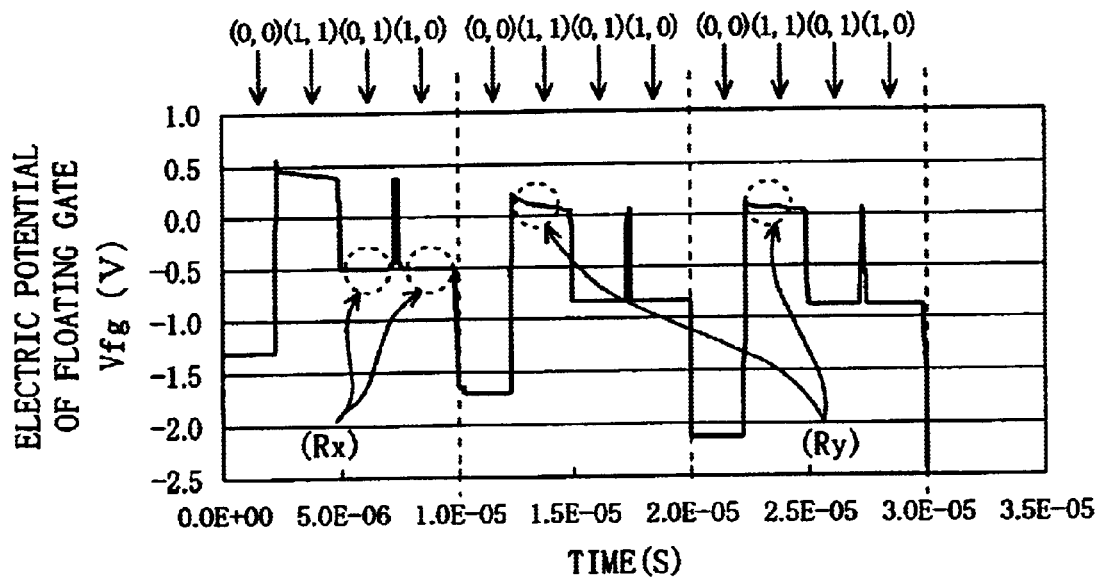
FIGS. 18A and B are a time chart showing the time variation of the electric potential of a floating gate when changing a logical value of an input signal inputted to each input terminal of the two input portions and the time variation of the voltage applied to the ferroelectric capacitor according to the eighth embodiment.
Figure 18B:
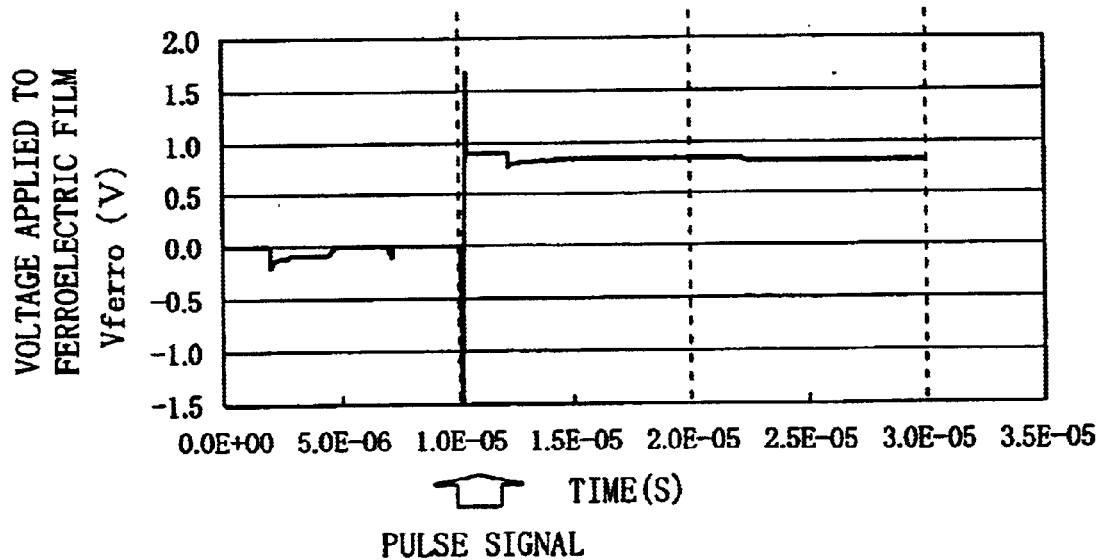

FIGS. 18A and B are the time chart showing the time variation of the electric potential of the floating gate 64 when changing the logical value of the input signal inputted to each input terminal 65*a* of the two input portions 65 and the time variation of the voltage applied to the ferroelectric capacitor 51 in order respectively. Here, after inputting logical value signals of (0, 0), (1, 1), (0, 1) and (1, 0) to the input terminals 65*a* of the two input portions 65, the pulse signal of −10 V is applied to the control terminal 67 and the residual electric charge is generated on the ferroelectric film of the ferroelectric capacitor 51. Thereafter, the logical value signals (0, 0), (1, 1), (0, 1) and (1, 0) are repeatedly inputted to the input terminals 65*a* of the two input portions 65.

Figure 14C:
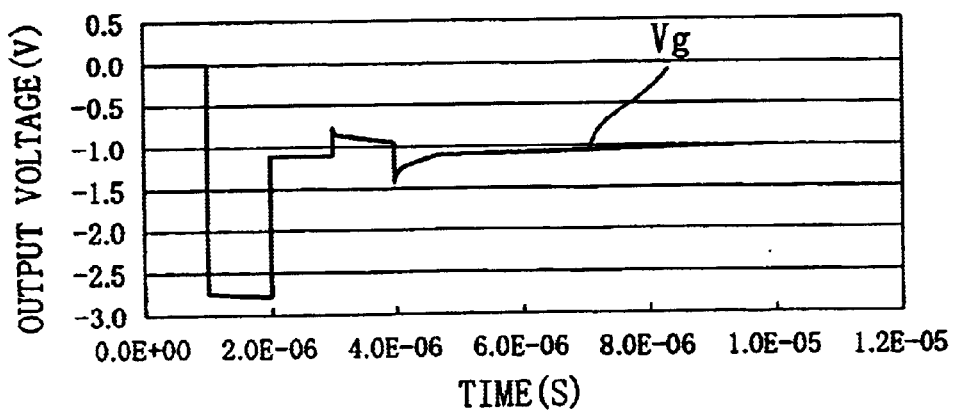

At this time, as is also understandable from FIGS. 18A and B, the voltage applied to the ferroelectric capacitor 51 is almost constant in the regions where no pulse signal is applied. This is also understandable seeing that the floating gate 64 of the neuron element of this embodiment is equivalent to the electrode connected to the output terminal 55 of the paraelectric capacitor 58 shown in FIG. 14A, and so the voltage of the gate portion 52 connected to the ferroelectric capacitor does not change due to the voltage fluctuation applied to the output terminal 55 as shown in FIG. 14C. To be more specific, as the neuron element of this embodiment has an electric potential generating device Egn having the same configuration as the fifth embodiment intervening between the floating gate 64 and the control terminal 67, the electric potential VF of the floating gate 64 hardly influences the voltage applied to the ferroelectric film of the ferroelectric capacitor 51 so that the voltage of the ferroelectric film can be kept almost constant.

To be more specific, as shown in a region Ra in FIG. 18A, the electric potential of the floating gate 64 when receiving the input of the logical value (0, 1) and that when receiving the input of the logical value (1, 0) are almost the same before the pulse signal is applied to the control terminal 67. In addition, as shown in a region Rb in FIG. 18A, the electric potentials of the floating gate 64 when receiving the input of the same logical value for the first and second times are almost the same after the pulse signal is applied to the control terminal 67. This is because the voltage applied to the ferroelectric hardly changes and the residual electric charge induced by the ferroelectric does not change.

FIG. 19 is the time chart showing the time variation of the electric potential Vout of the output terminal 70 to the same logical value input as FIG. 18A. In this example, the threshold voltage of the N type MIS transistor 61 is rendered lower, before adding the pulse signal to the control terminal 67, than the electric potential of the floating gate 64 when the logical value "1 " is applied to one of the two input portions 65, so that it becomes higher than the electric potential of the floating gate 64 when the logical value "0" is applied to one of the two input portions 65. As shown in FIG. 19, the neuron element of this embodiment operates as an NOR circuit before the pulse signal is applied to the control terminal 67 and operates as a NAND circuit after the pulse signal is applied to the control terminal 67.

In this embodiment, the threshold voltage of the N type MIS transistor is −0.8 V as previously mentioned. Furthermore, it is understandable that logic transformation is possible with the residual electric charge induced by the ferroelectric capacitor. Thus, according to the eighth embodiment of the present invention, the residual electric charge induced on the ferroelectric film does not change so that it is implemented that the circuit operation of a logic transformation circuit becomes very stable compared to the past examples. In addition, it is needless to say that, when the circuit operation of this embodiment is operating as the NAND circuit, it is possible to switch from the NAND circuit operation to the NOR circuit operation by resetting the polarization of the ferroelectric.

Moreover, while the circuit of the fifth embodiment is used in this embodiment, the circuit of the second or third embodiment may also be used. In addition, while the N type MIS transistor and the load resistance circuit are used as the inverter circuits in this embodiment, the P type MIS transistor and a load resistance may also be used.

Embodiment 9

Figure 20:
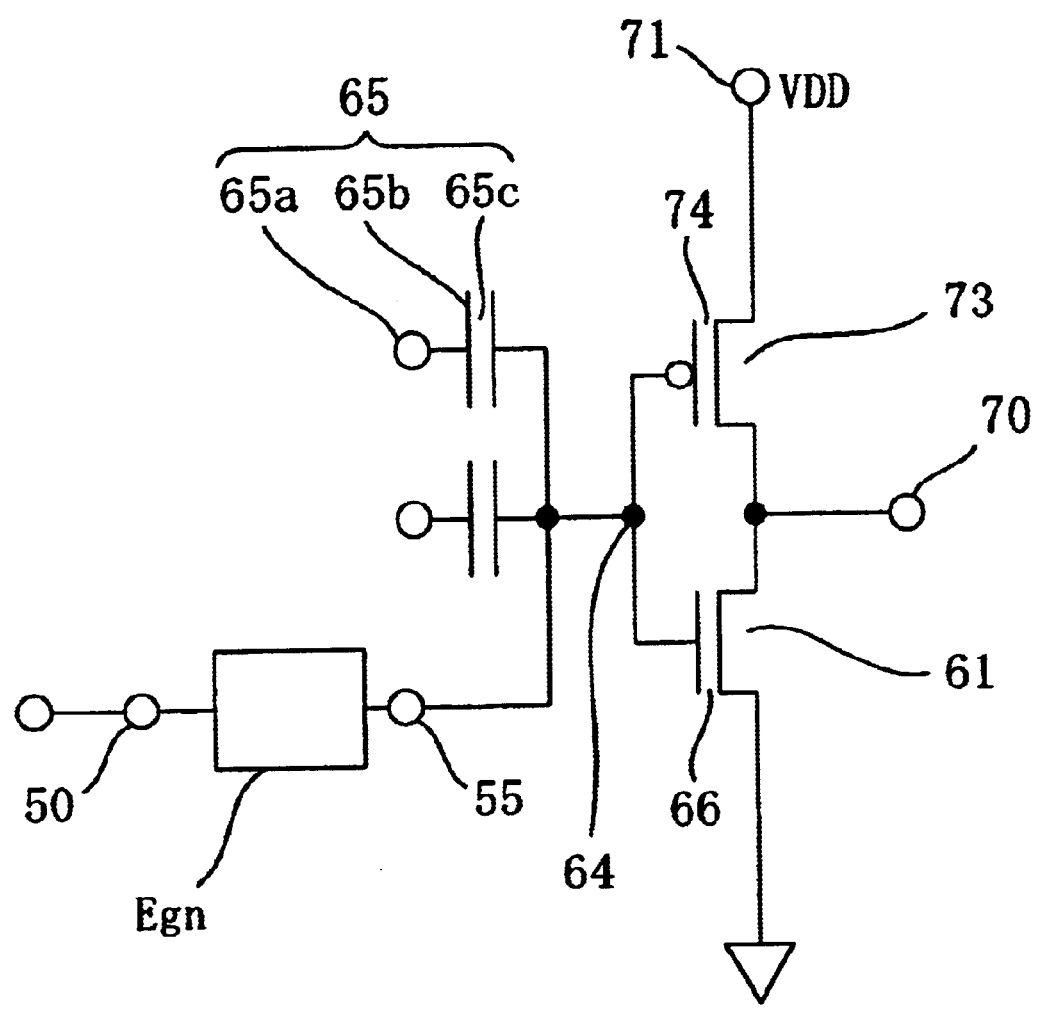
FIG. 20 is an equivalent circuit diagram of the neuron element related to the ninth embodiment of the present invention.

FIG. 20 is an equivalent circuit diagram of the neuron element related to the ninth embodiment. As shown in this drawing, the neuron element of this embodiment has the configuration wherein the electric potential generating device of the fifth embodiment is added to the neuron element related to a second deformation example of the first embodiment shown in FIG. 6. The neuron element related to this embodiment has the p-channel type MIS transistor (PMISFET 73) connected in series to the NMISFET 61 instead of the load resistance element 69 of the structure shown in FIG. 17. To be more specific, it has the inverter circuit comprised of a CMIS device. And the source of the PMISFET 73 is connected to the power supply voltage supply portion for supplying power supply voltage VDD, and the drain of the PMISFET 73 is connected to the drain of the NMISFET 61. The output terminal 70 is connected to the drain of the NMISFET 61 and that of the PMISFET 73. In addition, the floating gate 64 is provided astride the NMISFET 61 and the PMISFET 73, and a paraelectric film 74 intervenes between the floating gate 64 and the substrate area of the PMISFET 73.

While the circuit configuration of this embodiment is almost the same as that of the eighth embodiment, a difference is that the inverter circuit is comprised of a CMIS circuit. The operating characteristics of the circuit of this embodiment are the same as those of the eighth embodiment. In particular, this embodiment allows the power consumption to be further curbed compared with the eighth embodiment since it uses the CMIS circuit as the inverter circuit.

In addition, the voltage applied to the ferroelectric film of the ferroelectric capacitor 51 (see FIG. 12) is hardly influenced by the potential fluctuation of the floating gate 64 shown in FIG. 17 because of the configuration shown in FIG. 20, and so it is not necessary to apply the pulse signal with timing as shown in FIG. 18A and B. To be more specific, there is the advantage that the pulse signal can be applied irrespective of the value of the input signal so as to switch the function of the neuron element between the NOR and NAND circuit operations.

Embodiment 10

Figure 21:
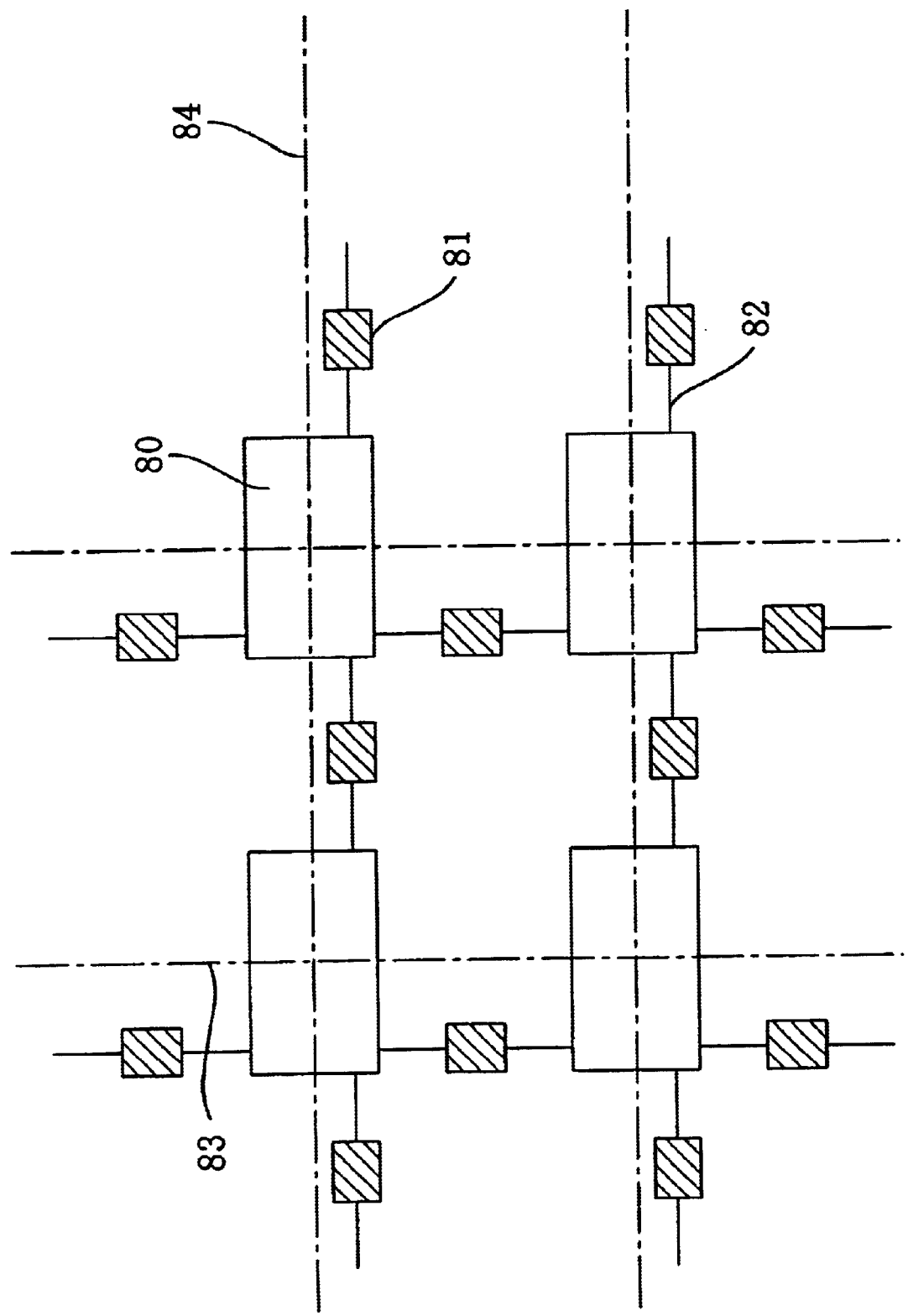
FIG. 21 is a block circuit diagram showing a configuration of the semiconductor integrated circuit device related to a tenth embodiment of the present invention.

FIG. 21 is a block circuit diagram showing a configuration of the semiconductor integrated circuit device related to a tenth embodiment. As shown in this drawing, the semiconductor integrated circuit device of this embodiment has logic transformation circuits 80 placed like an array and the configuration wherein the logic transformation circuits 80 are mutually connected by wiring 82 via a switch element 81. As for the logic transformation circuit 80 in the embodiment, the neuron element related to the eighth embodiment (see FIG. 17) is used. And it has a first control signal line 83 extending along a row of arrays and a second control signal line 84 extending along a line of arrays, and the NOR or NAND operation of each logic transformation circuit 80 is switched according to the control signals provided by the first control signal line 83 and the second control signal line 84.

According to this embodiment, it is possible, by simultaneously adding the pulse-like voltage signal of −5 V to the selected first control signal line 83 and the pulse-like voltage signal of −5 V to the selected second control signal line 84, to switch the circuit operation of only the logic transformation circuit 80 located at a point of intersection of the selected first control signal line 83 and the selected second control signal line 84 (switching the NOR or NAND operation). Thus, it is possible to control the circuit operation of the logic transformation circuits 80 with the first and second control signal line 83 and 84.

In addition, a fuse transistor is used as the switch element 81 in this embodiment, and it is possible to break and connect the fuse transistors according to the type and use of a product after forming a basic structure of the semiconductor integrated circuit device so as to finally reconstitute the specifications and logic of the semiconductor integrated circuit, thus implementing flexibility of design.

Moreover, it is possible to use the MIS transistor, a flash type EEPROM, an MFMIS and so on as the switch element 81. In that case, it is feasible to reconstitute the specifications and logic of the semiconductor integrated circuit while using it by utilizing the switch element 81.

Embodiment 11

Figure 22A:
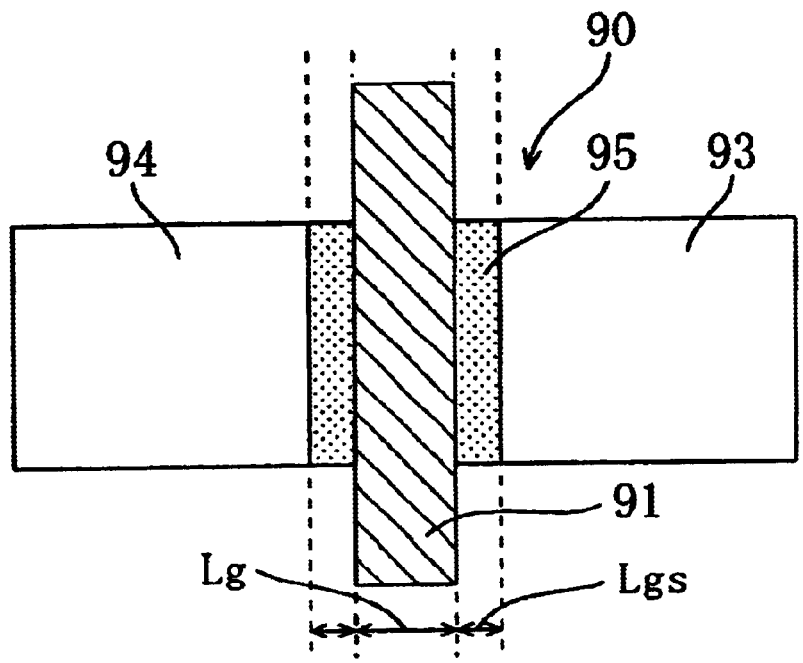
FIGS. 22A and B are a plan view and a longitudinal section showing a configuration of MISFET related to an eleventh embodiment of the present invention.
Figure 22B:
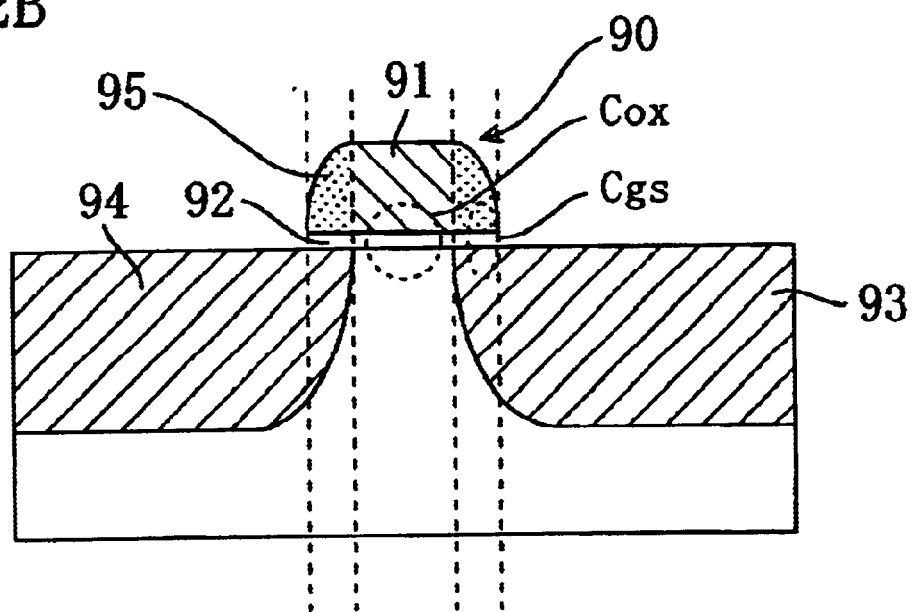

FIGS. 22A and B are a plan view and a longitudinal section showing a configuration of MISFET related to an eleventh embodiment of the present invention. An MISFET 90 of this embodiment is an NMISFET 54 or a PMISFET 56 in the electric potential generating device of the fifth embodiment shown in FIG. 12, for instance.

The MISFET 90 of this embodiment has a gate electrode 91, a gate dielectric film 92 provided below the gate electrode 91, a source region 93 and a drain region 94 formed in the Si substrate, and in addition, a side wall 95 provided on a side of the gate electrode 91. To be more specific, the side wall 95 is formed on the side of the gate electrode 91, and thereafter, the gate electrode 91 and the side wall 95 are used as a part of the mask to inject the As ion or the B ion so as to form the source region 93 and the drain region 94. In the MISFET formed by such a manufacturing method, if the gate length is Lg, the gate width is Wg, and a gate source overlap capacity is Lgs, a capacity Cox between the gate and the channel areas and a gate source overlap capacity Cgs are represented by the following formulas (4) and (5) respectively.

$$Cox = (\epsilon \cdot \epsilon_0 \cdot Lg \cdot Wg)/tox \quad (4)$$

$$Cds = (\epsilon \cdot \epsilon_0 \cdot Lgs \cdot Wg)/tox \quad (5)$$

Accordingly, if Lg>>Lgs, it is Cox>>Cgs, and so the following action can curb polarization fluctuation of the ferroelectric film more effectively.

Figure 23A:
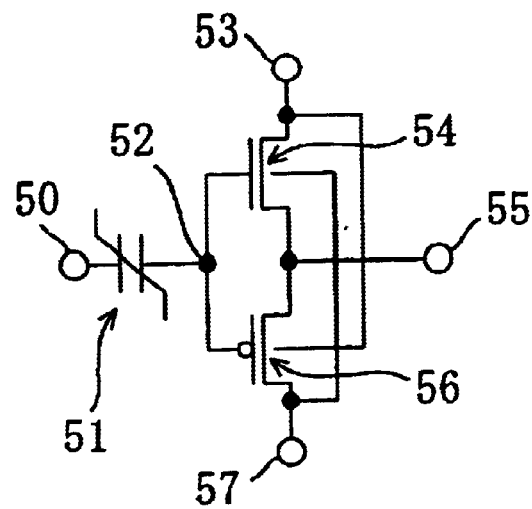
FIGS. 23A, B and C are an equivalent circuit diagram of the electric potential generating device to which the MISFET of the eleventh embodiment is placed, a circuit diagram showing an equivalent capacitor of a resource follower circuit when inputting from the input terminal, and a circuit diagram showing an equivalent capacitor of a resource follower circuit when the electric potential of the output terminal changes, respectively.

FIGS. 23A, B and C are an equivalent circuit diagram of the electric potential generating device to which the MIS- FET of this embodiment is placed, a circuit diagram showing an equivalent capacitor C1 of a source follower circuit when inputting from the input terminal, and a circuit diagram showing the equivalent capacitor of the source follower circuit when the electric potential of the output terminal changes. While FIGS. 23B and C show only one of the capacitors of the NMISFET 54 or the PMISFET 56 as the equivalent capacitors C1 and C2, the equivalent capacitors C1 and C2 intervene in both the MISFETs 54 and 56 respectively in the case of the structure shown in FIG. 23A.

Figure 23B:
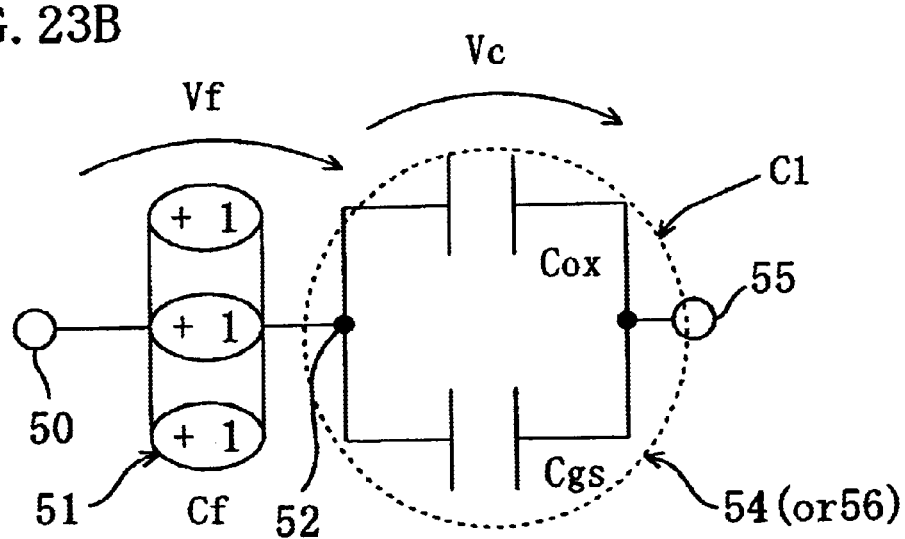

In the case where a voltage for writing is applied from the input terminal 50 of the electric potential generating device shown in FIG. 23A, the equivalent capacitor C1 is in a state wherein the capacity Cox between the gate and the channel areas and the gate source overlap capacity Cgs are connected in parallel as shown in FIG. 23B. And optimization is performed so that a distribution ratio of a voltage Vf applied to the ferroelectric capacitor 51 to a voltage Vc applied to the MISFET will be almost the same, and consequently a sufficiently high voltage is applied to the ferroelectric film and a large residual polarization can be obtained.

Figure 23C:
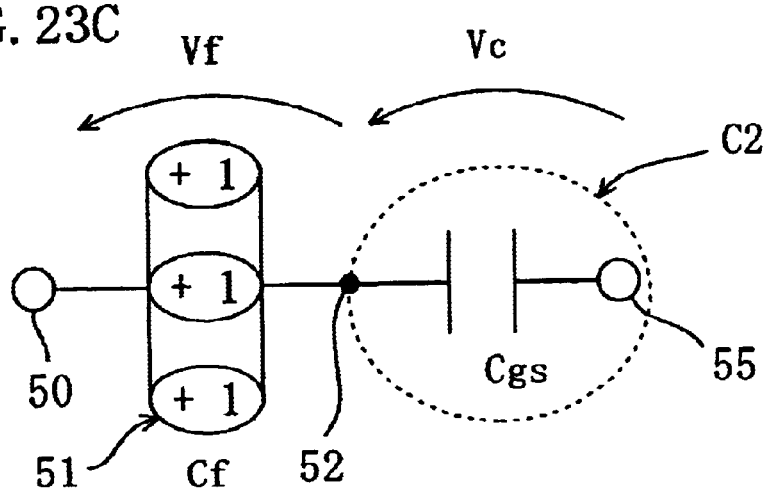

In addition, in the case where the electric potential of the output terminal 55 of the electric potential generating device changes as shown in FIG. 23C, the equivalent capacitor C2 of the source follower circuit is only the gate source overlap capacity Cgs. Accordingly, it is possible to render the voltage Vf distributed to the ferroelectric capacitor 51 sufficiently small compared to the voltage applied to the equivalent capacitor C2 by setting the capacity Cgs sufficiently small, such as Cgs≐Cox/100. Thus, the polarization state of the ferroelectric film is hardly influenced by the voltage fluctuation of the output terminal 55.

For instance, the NMISFET or the PMISFET in the electric potential generating device Egn of the neuron element shown in FIG. 17 can be comprised of the NMISFET 90 of this embodiment so as to keep the function of writing to the ferroelectric film high and also curb the polarization fluctuation of the ferroelectric film due to the voltage fluctuation of the floating gate (the floating gate 64 shown in FIG. 17).

It is also possible to apply the electric potential generating device of this embodiment to the neuron element of the ninth embodiment shown in FIG. 20 and the logic transformation circuit of the tenth embodiment shown in FIG. 21.

Embodiment 12

In this embodiment, the electric potentials of the power supply voltage VDD and the ground voltage VSS are changed according to the electric potential of the output terminal 55 in the structure of the electric potential generating device of the fifth embodiment shown in FIG. 12. To be more specific, when the electric potential generating device Egn is incorporated into the neuron element as shown in FIG. 17, the power supply voltage VDD and the ground voltage VSS are changed according to the electric potential of the floating gate 64 (see FIG. 17).

In the electric potential generating device shown in FIG. 12, the electric potential of the output terminal 55 (floating gate) is in the range from the VSS to the VDD.

And if the power supply voltage VDD is 5 V and the ground voltage VSS is −5 V, the voltage between the source and the drain of the PMISFET 56 becomes as high as 6 V when the electric potential of the output terminal 55 (floating gate) is 1 V.

On the other hand, if the power supply voltage VDD is 5 V and the ground voltage VSS is 0 V, the voltage between the source and the drain of the PMISFET 56 becomes as low as 1 V when the electric potential of the output terminal 55 (floating gate) is 1 V.

Thus, it is rendered as VDD=5 (V), VSS=0 (V) when the electric potential of the output terminal 55 (floating gate) is positive, and as VDD=0 (V), VSS=−5 (V) when negative, so that the voltage between the source and the drain can be kept in a proper range. And as the voltage between the gate and the source can thereby be rendered low, it is possible to keep the voltage applied to the ferroelectric film low so as to curb the polarization fluctuation of the ferroelectric film.

It is also possible to apply the electric potential generating device of this embodiment to the neuron element of the ninth embodiment shown in FIG. 20 and the logic transformation circuit of the tenth embodiment shown in FIG. 21.

Embodiment 13

Figure 24:
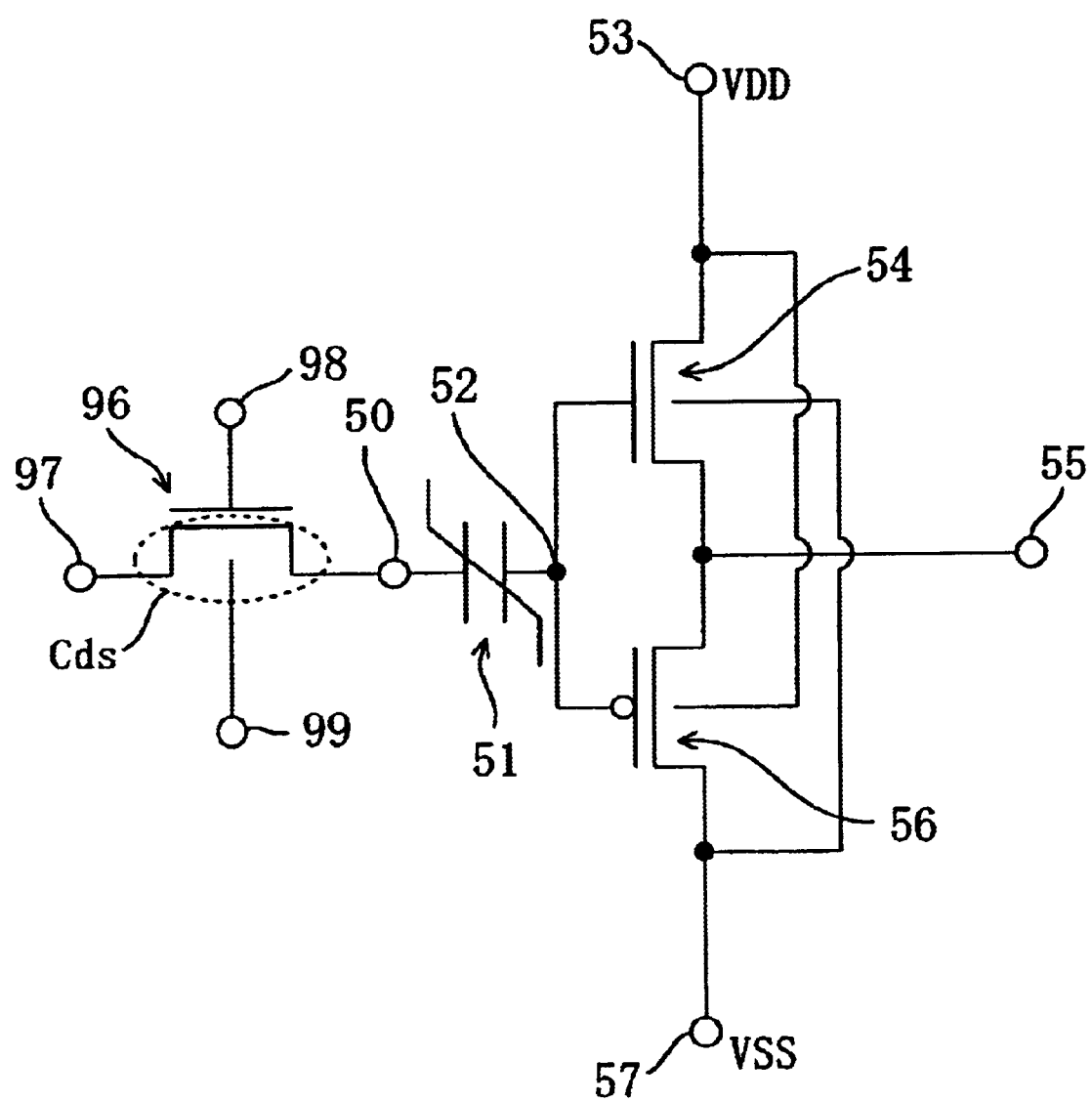
FIG. 24 is an equivalent circuit diagram of the electric potential generating device related to the thirteenth embodiment of the present invention.

FIG. 24 is an equivalent circuit diagram of the electric potential generating device related to the thirteenth embodiment of the present invention. As shown in this drawing, the electric potential generating device of this embodiment has the structure wherein a path transistor 96 is connected to the input terminal 50 of the electric potential generating device of the fifth embodiment shown in FIG. 12. The gate of the path transistor 96 is connected to a control signal terminal 98, the substrate area is connected to a back gate terminal 99, the source is connected to the input terminal 50, and the drain is connected to the aforementioned input terminal 97.

And the gate bias for turning on the path transistor 96 only when the pulse signal shown in FIG. 18A is inputted and turning it off otherwise is applied to the control signal terminal 98. In addition, the back gate terminal 99 has the voltage of 0 V applied when the path transistor 96 is ON, and has the voltage of −1 V applied when OFF. In other words, the voltage of the substrate area is set lower just by −1 V when the path transistor 96 is OFF than when ON.

According to this embodiment, if the path transistor 96 is OFF due to such ON and OFF control of the path transistor 96 and voltage control of the back gate terminal 99, the drain source capacity Cds is so small that the voltage is hardly distributed to the ferroelectric capacitor 51, and much of it is distributed to the drain source capacity Cds. As a result of it, it is possible to curb the polarization fluctuation of the ferroelectric capacitor 51.

Embodiment 14

Figure 25:
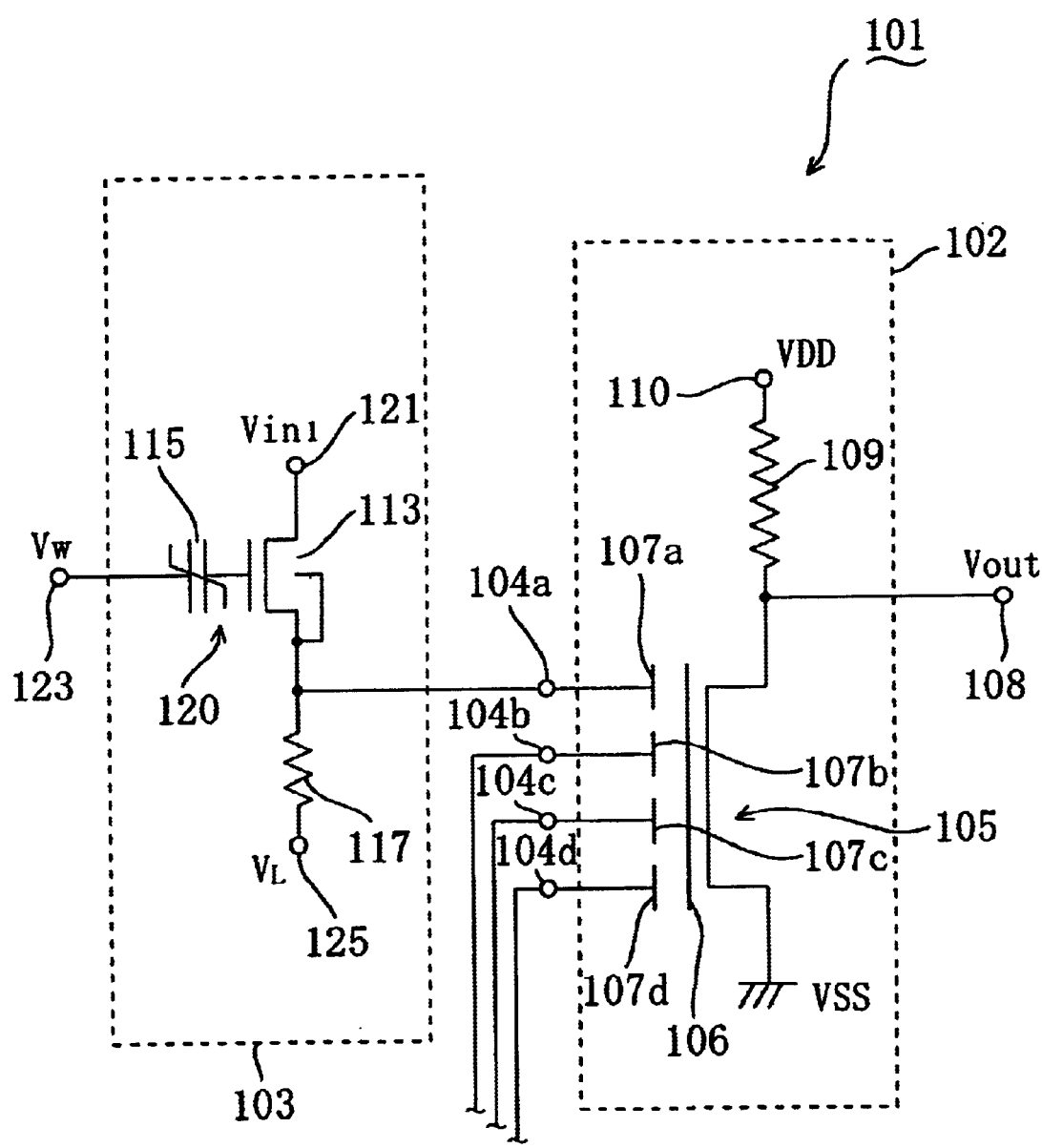
FIG. 25 is an equivalent circuit diagram of the neuron element related to the fourteenth embodiment of the present invention.

FIG. 25 is an equivalent circuit diagram of the neuron element related to the fourteenth embodiment of the present invention.

While a neuron element 101 of this embodiment functions as a neuro-computer by having a large number of it placed and connected as shown in FIG., the present invention is characterized by the structure of the neuron element which is one element in the neuro-computer, and so the discrete neuron element 101 will be described below.

As shown in this drawing, the neuron element 101 of this embodiment has a neuron portion 102 and a large number of synapse portions 103 to be connected to the neuron portion 102.

The neuron portion 102 has an NMISFET 105, a floating gate 106 opposite the channel area of the NMISFET 105 sandwiching the gate dielectric film, four control gates 107a to 107d opposite the floating gate 106 sandwiching the capacity dielectric film, four input wirings 104a to 104d connected to the control gates 107a to 107d, a power supply voltage supply terminal 110 for supplying the power supply voltage VDD, and a load resistance element 109 set between the drain region of the NMISFET 105 and the power supply voltage supply terminal 110. The output terminal 108 outputs the electric potential corresponding to the sum of the input values from the input wirings 104a to 104d for instance.

And the drain of the NMISFET 105 is connected to the output terminal 108 for outputting the output signal Vout. In addition, the input wirings 104a to 104d extend outward from the neuron portion 102 and are connected to the synapse portions 103. While only one synapse portion 103 is shown in FIG. 25 to make it easier to understand, the synapse portions 103 having the common configuration are also provided in other input wirings 104b to 104c. The numbers of the input wirings and the synapse portions do not need to be four respectively, and it is possible to increase or decrease the numbers according to throughput of the neuron element 101.

In the synapse portion 103, an NMISFET 113, an electric potential prescription terminal 125 connected to the source of the NMISFET 113 via a resistance element 117, an input terminal 121 connected to the drain of the NMISFET 113, and a ferroelectric capacitor 115 having one electrode thereof connected to the gate of the NMISFET 113 are provided. And the other electrode of the ferroelectric capacitor 115 is connected to a load signal terminal 123. The input terminal 121 has the output from the aforementioned neuron element inputted as an input signal Vin1. The load signal terminal 123 has a signal Vw for setting the load for the input signal Vin1 inputted. The electric potential prescription terminal 125 has a low-level electric potential VL which is the voltage for determining the lowest electric potential level to be outputted to the input wirings 104a to 104d inputted. As the electric potential prescription terminal 125 is grounded in this embodiment, the low-level electric potential VL is 0 V. In other words, the structure of the synapse portion 103 has a ferroelectric gate transistor 120 (the MFMIS device in this embodiment) combining the NMISFET 113 and the ferroelectric capacitor 115 and the fixed resistance element 117.

In the synapse portion 103, the gate length of the NMISFET 113 is 1 $\mu$m, the gate width is 5 $\mu$m, and the thickness of the gate oxide film is 3 nm. One electrode of the ferroelectric capacitor 115 is connected to the gate electrode of the NMISFET 113. The ferroelectric capacitor 115 has electrode area of 1 $\mu$m square for instance. The two electrodes of the ferroelectric capacitor 115 are comprised of Pt for instance. As for the ferroelectric materials constituting the ferroelectric film of the ferroelectric capacitor 115, there is the lead titanate lanthanum (PLT) of 400 nm film thickness for instance.

Here, in this embodiment, the electrode area of the ferroelectric capacitor 115 is rendered as small as approximately one fifth, for instance, of that of the channel area of the NMISFET 113 for the reason mentioned later. While the NMISFET 105 having the configuration of the vMOS is provided in the neuron portion 102 in this embodiment, the same action and effects as this embodiment can be exerted as far as it is the circuit having a plurality of input portions and ignitable according to the correlation between the sum thereof and the threshold.

In particular, as the larger the sum of the input voltages of the input wirings 104a to 104d is, the higher the voltage of the floating gate 106 becomes in the case of using the vMOS shown in FIG. 25 and in the case of using the NMOS as the transistor, the resistance value between the source and the drain of the NMISFET 105 becomes lower. As a result of it, the output signal Vout from the output terminal 108 approaches 0 V for instance. Inversely, the smaller the sum of the input voltages of the input wirings 104a to 104d is, the closer the output signal Vout is to the power supply voltage VDD.

Figure 26:
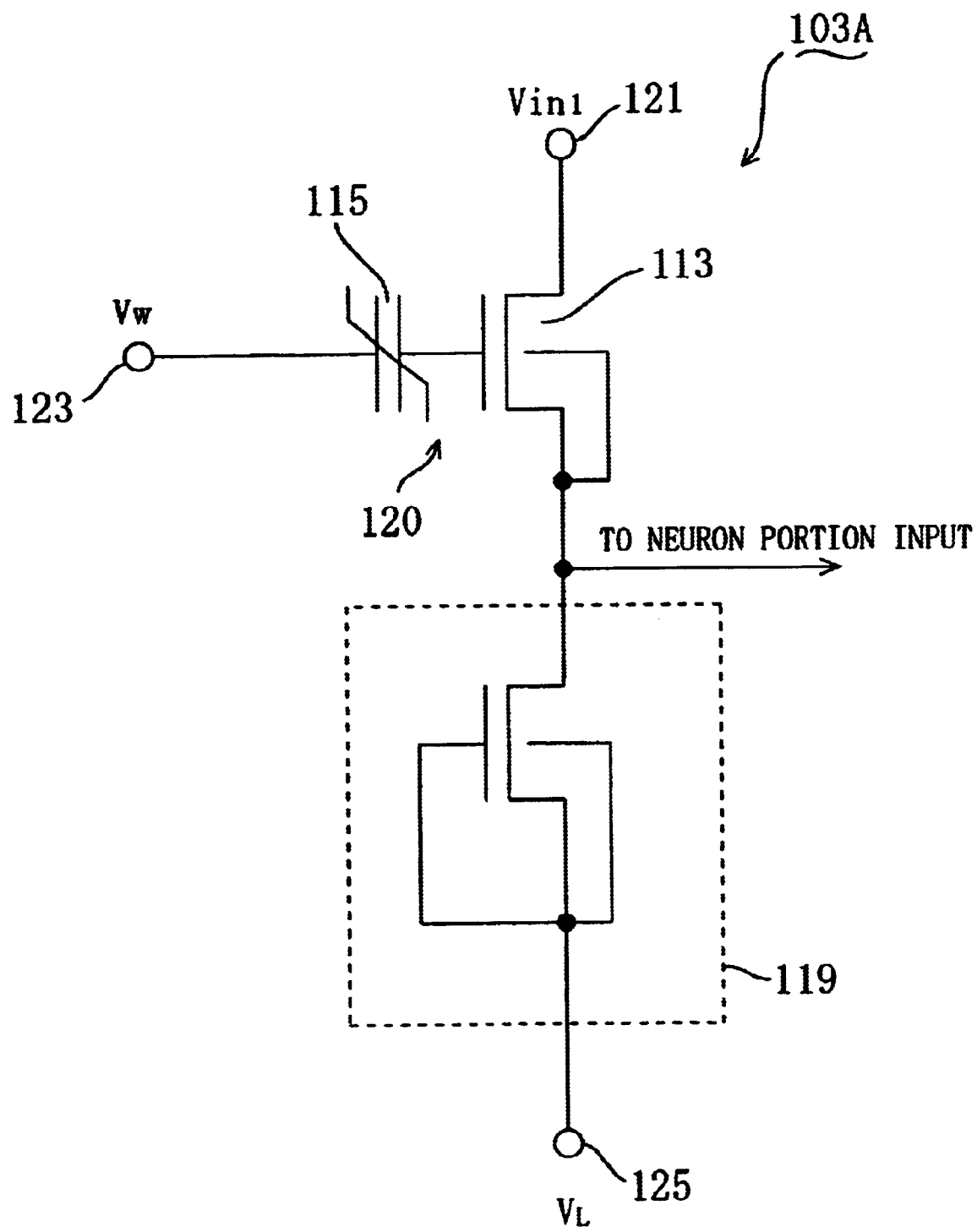
FIG. 26 is a circuit diagram showing a concrete example of a synapse portion of the neuron element of the fourteenth embodiment.

FIG. 26 is a circuit diagram showing a concrete example of the synapse portion of the neuron element 101 of this embodiment. As shown in this drawing, the synapse portion 103a of the neuron element related to this example has a fixed resistive element 119 consisting of the NMISFET short-circuited between the gate and the substrate replacing the resistance element 117 in the synapse portion 103 shown in FIG. 25.

The fixed resistive element 119 has all of the gates, sources and substrate potentials of the NMOS in common, and is capable of providing a substrate potential VL which is different from peripheral elements by a separation technique not shown, that is, by using an SOI substrate for instance. The fixed resistive element 119 operates, by making such a connection, as fixed resistance determined by the correlation between the threshold voltage of the NMISFET 113 and the low-level electric potential VL. The MISFET was used as the fixed resistive element because manufacturing in the semiconductor process can be performed simultaneously with the peripheral circuits and thus formation thereof is easy.

Figure 27:
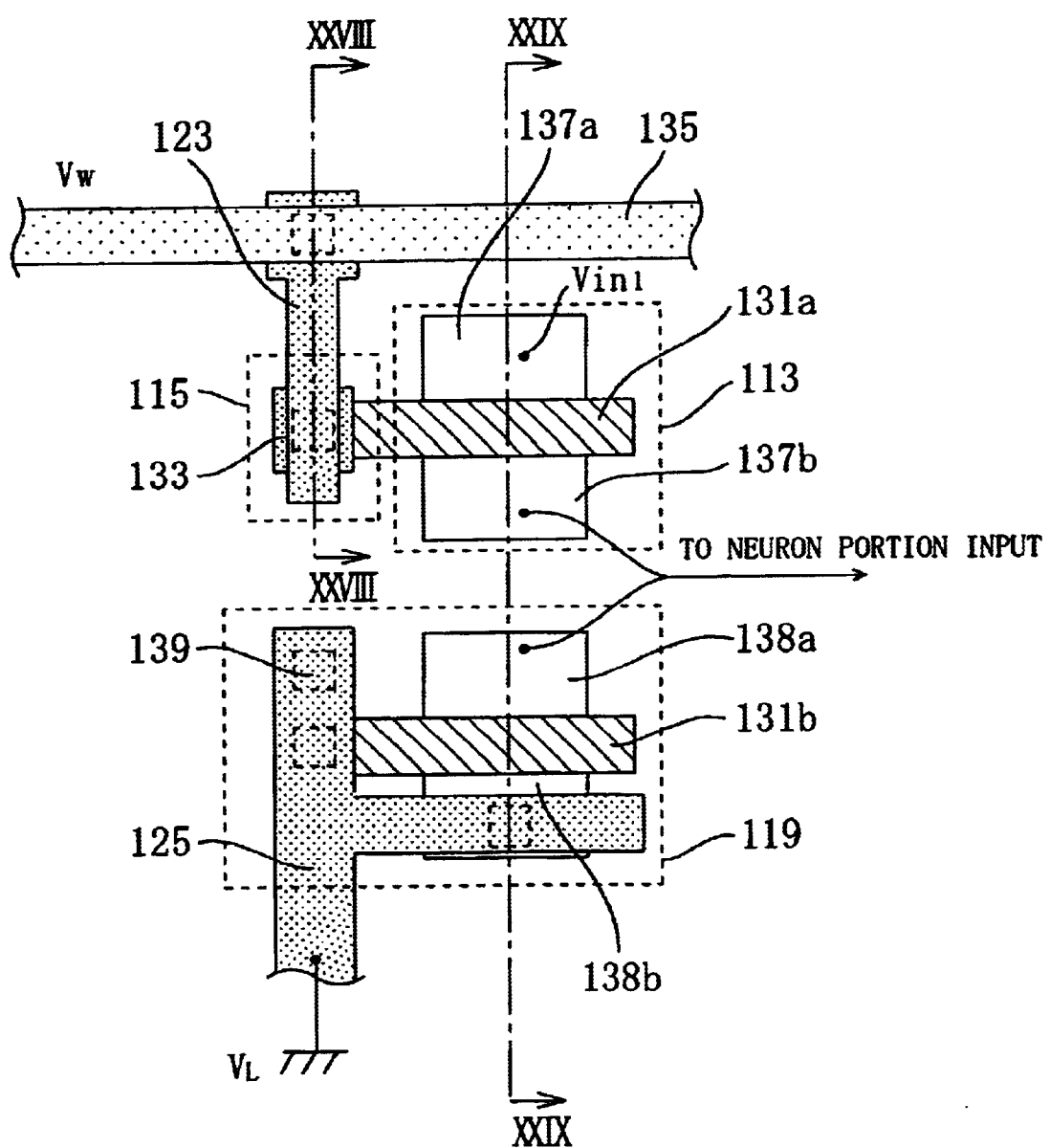
FIG. 27 is a top view of the synapse portion related to the concrete example of the fourteenth embodiment.

FIG. 27 is a top view of the synapse portion 103 related to the concrete example of this embodiment. Moreover, while FIG. 27 is shown by omitting a part of the wiring in order to make it easier to see, a connection state thereof will be described below as appropriate. In FIG. 27, the same elements as in FIGS. 25 and 26 are given the same symbols and the description thereof will be omitted.

In FIG. 27, 131a and 131b are the gate electrodes of the NMISFET 113 shown in FIG. 25 and the NMISFET shown in FIG. 26 which is the fixed resistive element 119 respectively. In this embodiment, the gate length of the gate electrodes 131a and 131b is 1 $\mu$m, and the gate width is 5 $\mu$m in both the NMISFET 113 and the NMISFET which is the fixed resistive element 119. Reference numeral 133 denotes the lower electrode, which is equivalent to the electrode on the substrate side of the ferroelectric capacitor 115 shown in FIG. 25 and has the area of 1 $\mu$m square. Moreover, while FIG. 27 shows the ferroelectric capacitor 115 by rendering it a little larger to make it easier to see, it is understandable that the area of the ferroelectric capacitor 115 is significantly smaller than the channel area of the NMISFET 113.

Furthermore, reference numeral 135 denotes a load signal wiring, and the load signal wiring 135 is electrically connected to the load signal terminal 123, 137a and 137b are the drain region and the source region of the NMISFET 113 respectively. In addition, 138a and 138b are the drain region and the source region of the NMISFET which is the fixed resistive element 119 respectively. The drain region 137a is connected to the input terminal 121 by the wiring not shown, and the output of the aforementioned neuron element is inputted to the drain region 137a. In addition, the source region 137b and the drain region 138a are electrically connected mutually by the wiring not shown, and are further connected to the input wirings 104a to 104d of the neuron portion 102 shown in FIG. 25. The source region 138b is electrically connected to the electric potential prescription terminal 125. In addition, the electric potential prescription terminal 125 is electrically connected to the gate electrode 131b as explained in FIG. 26, and is further electrically connected to the substrate area of the NMISFET which is the fixed resistive element 119 by way of a substrate connection portion 139. The electric potential prescription terminal 125 is grounded in this embodiment for instance.

Figure 28:
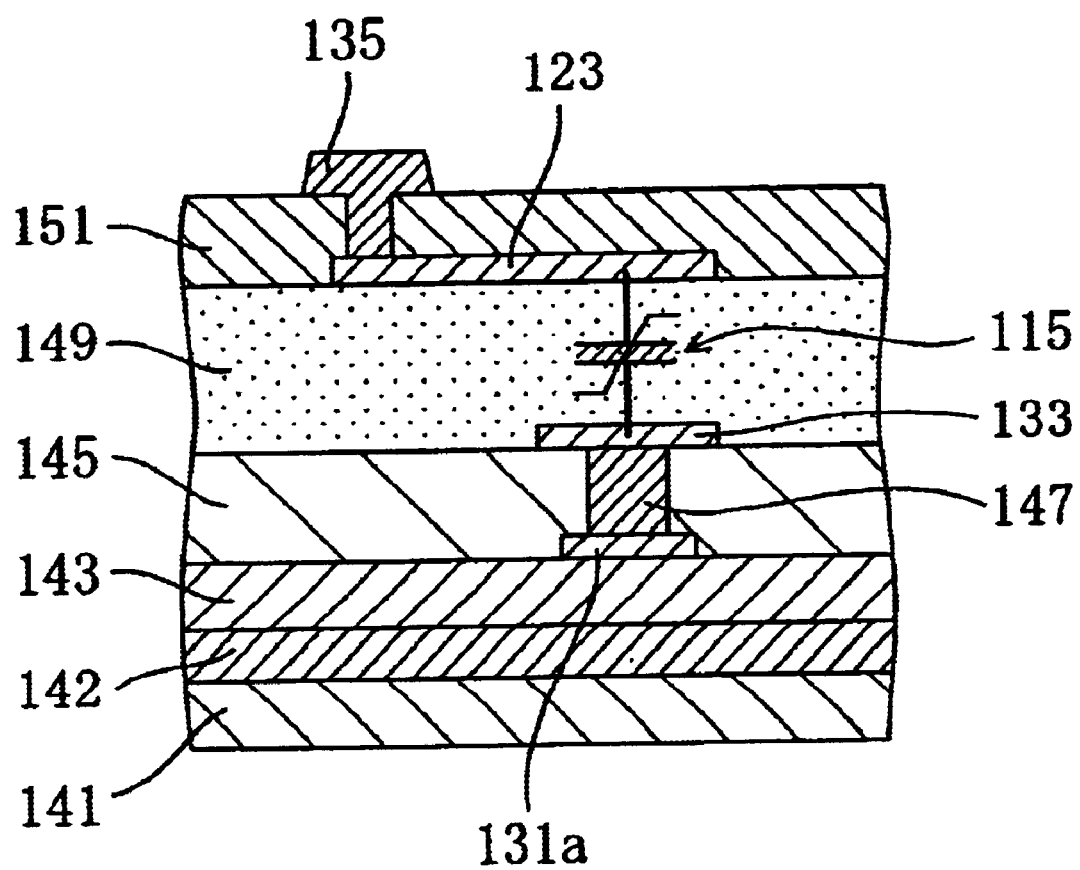
FIG. 28 is a sectional view on a line XXIII—XXIII in FIG. 27.

FIG. 28 is a sectional view on a line XXIII—XXIII in FIG. 27. In FIG. 28, the same elements as in FIG. 27 are given the same symbols and the description thereof will be omitted.

In FIG. 28, reference numeral 141 denotes the substrate comprised of the silicon for instance, 142 denotes an embedded oxide film (BOX layer) comprised of SiO$_2$, for instance, and the neuron element 101 of this embodiment is formed by using a so-called SOI substrate. Reference numeral 143 denotes a dielectric film for element separation, and the dielectric film for element separation 143 is comprised of SiO$_2$ formed by a publicly known LOCOS method for instance. Reference numeral 145 denotes a first interlayer dielectric film, and the first interlayer dielectric film 145 is comprised of SiO$_2$ formed by an LPCVD method for instance. Reference numeral 147 denotes a plug wiring, and the plug wiring 147 connects the gate electrode 131a to a lower electrode 133. The plug wiring 147 is comprised of the tungsten formed by the sputtering method for instance. Reference numeral 149 denotes the ferroelectric film, and the ferroelectric film 149 is formed by accumulating the PLT film of which thickness is 400 nm on the conditions of substrate temperature of 600 degrees C., oxygen partial pressure 10 percent and an RF power 100 W by the sputtering method for instance and then performing the patterning of the PLT film. Reference numeral 151 denotes the second interlayer dielectric film, and the second interlayer dielectric film 151 is formed, for instance, by accumulating an oxidation silicon film with the plasma CVD using TEOS and then flattening it by a CMP method for instance.

Figure 29:
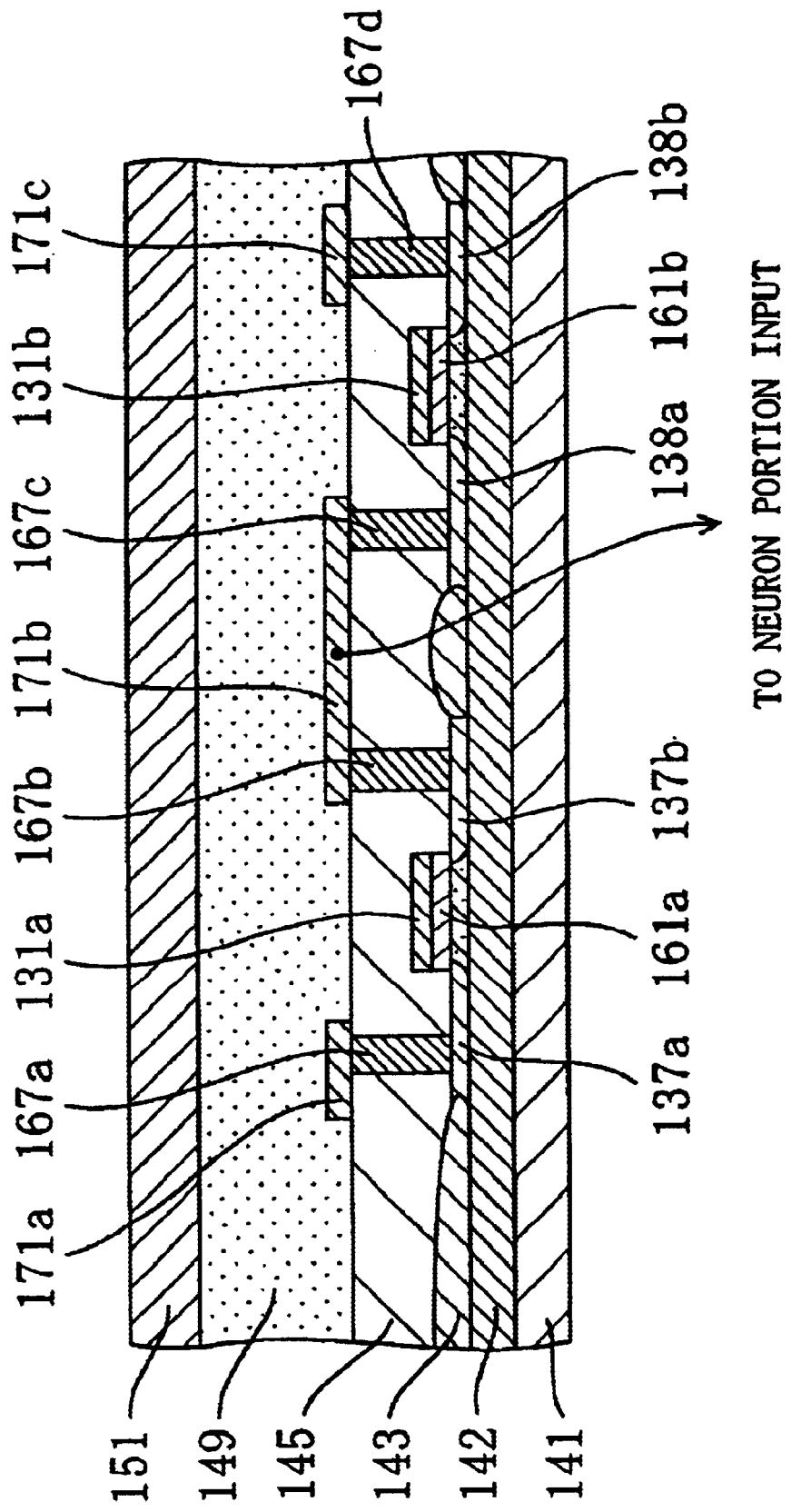
FIG. 29 is a sectional view on a line XXIX—XXIX in FIG. 27.

FIG. 29 is a sectional view on a line XXIX—XXIX in FIG. 27. Moreover, in FIG. 29, the same elements as in FIG. 27 or 28 are given the same symbols and the description thereof will be omitted.

In FIG. 29, reference numerals 161a and 161b denote the gate dielectric films of the NMISFET 113 shown in FIG. 25 and the NMISFET which is the fixed resistive element 119 in FIG. 26, and the gate dielectric films 161a and 161b are formed with the oxidation silicon film of 3 nm thickness fanned by pyrogenic oxidation at 900 degrees C. for instance. In addition, the drain regions 137a, 138a and the source regions 137b, 138b are formed by injecting boron for instance with the gate electrodes 131a, 131b as the masks and then performing heat treatment of 900 degrees C. and 30 minutes for instance. Reference numerals 167a to 167d denote the plug wirings, and the plug wirings 167a to 167d are comprised of the tungsten formed by the sputtering method for instance. Reference numerals 171a to 171c denote the wirings. As explained in FIG. 27, the aforementioned output of the neuron element is inputted by the wiring 171a to the drain regions 137a as an input signal Vin1 via the plug 167a. In addition, the source region 137b and the drain region 138a are connected to the wiring 171b via the plugs 167b and 167c respectively, and are further connected to the input wiring 104a of the neuron portion 103 shown in FIG. 25. The source region 138b is electrically connected to the electric potential prescription terminal 125 by the wiring 171c via the plug 167d.

The operation of the neuron element 101 having the above structure will be described below.

Figure 30:
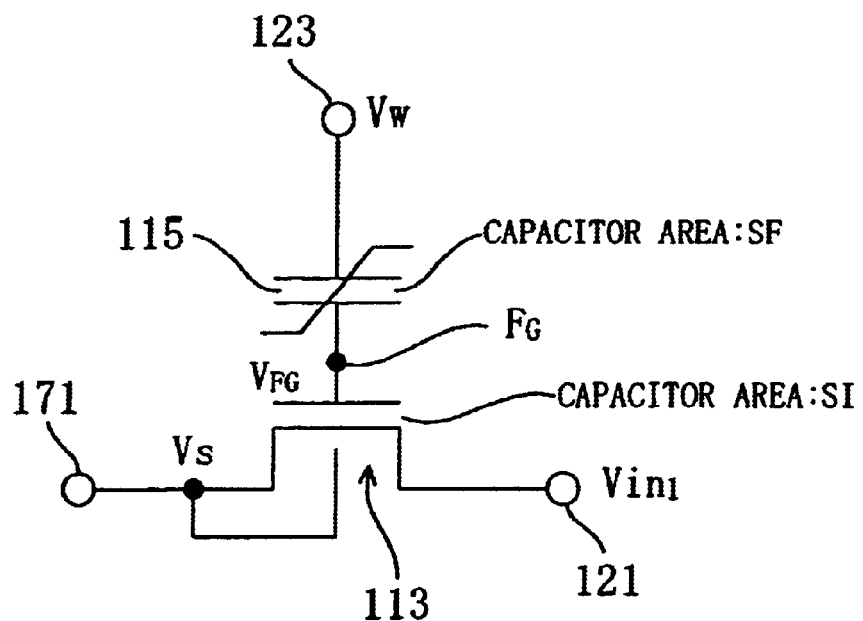
FIG. 30 is a diagram showing the configuration of the synapse portion shown in FIG. 25 excluding a fixed resistive element therefrom.

FIG. 30 is a diagram showing the configuration of the synapse portion 103 shown in FIG. 25 excluding the fixed resistive element 117 therefrom. To be more specific, FIG. 30 is a diagram showing only the ferroelectric gate transistor 120 (the MFMIS device) for implementing a load function of the neuron element 101 of the present invention.

In FIG. 30, reference numeral 171 denotes the terminal, and the terminal 171 is connected to the resistance element 117 shown in FIG. 25. Moreover, the following description refers to the channel area of the MISFET (area of the MIS capacitor) as SI, and represents the capacitor area of the ferroelectric capacitor as SF, and further refers to the area ratio thereof as RS (RS=SI/SF). In addition, $V_{FG}$ shown in FIG. 30 indicates the electric potential of the floating gate, and $V_S$ indicates the electric potential of the source area (substrate potential) respectively.

While the ferroelectric gate transistor of the past example already described has an MFIS configuration, it is the MFMIS type ferroelectric gate transistor 120 in the neuron element of the present invention. An advantage of this structure will be described later.

Figure 31:
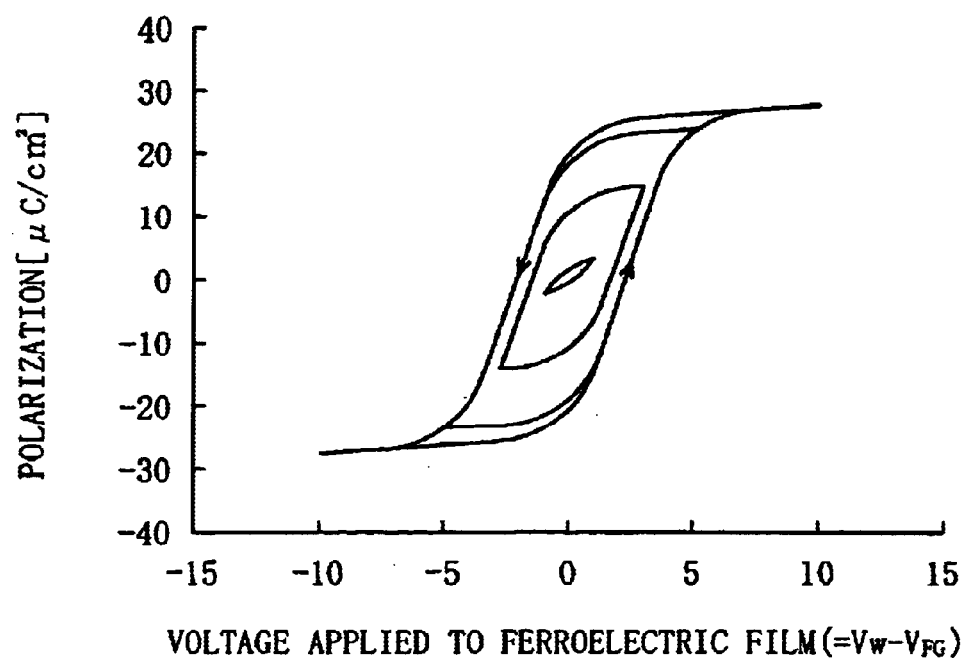
FIG. 31 is a diagram showing polarization characteristics of a ferroelectric capacitor of MFMIS of the fourteenth embodiment.

FIG. 31 is a diagram showing the polarization characteristics of the ferroelectric capacitor 115 of the MFMIS of this embodiment. In this drawing, the horizontal axis is the voltage applied to the ferroelectric film, and is the voltage represented by $V_W$–$V_{FG}$ in the structure shown in FIG. 30, while the vertical axis thereof is the polarization. As shown in this drawing, the polarization characteristics show counterclockwise hysteresis characteristics. As the PLT is used for instance as the ferroelectric material in this embodiment, the residual polarization (polarization at applied voltage 0 V) is approximately 20 $\mu$C/cm$^2$ and the resistance voltage (voltage at which the polarization becomes 0) is 2 V or so. In addition, it shows a so-called minor loop characteristic wherein the loop of the polarization is small while the applied voltage is comparatively low. To be more specific, the value of the residual polarization changes according to the size of the applied voltage.

Figure 32:
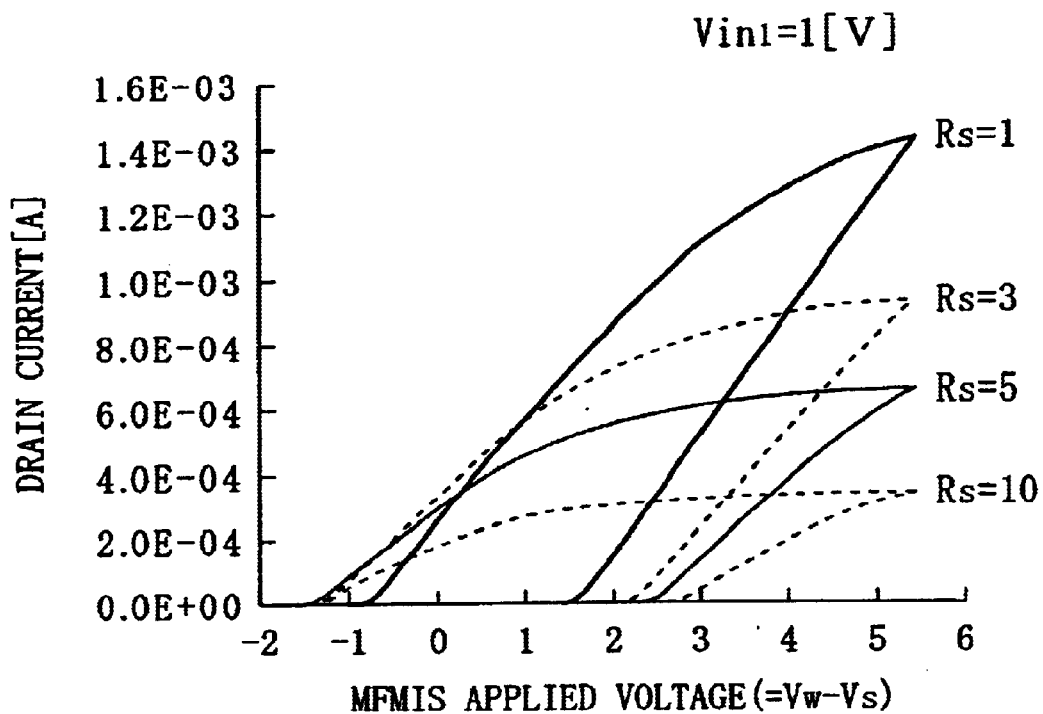
FIG. 32 is a diagram explaining a correlation between an applied voltage to the MFMIS and a drain current in the fourteenth embodiment by rendering an area ratio RS as a parameter.

FIG. 32 is a diagram explaining a correlation between an applied voltage to the MFMIS and a drain current by rendering the area ratio RS as a parameter. FIG. 32 was obtained by observing the change of the drain current when performing a voltage sweep of ±5.4 V between Vw and Vs. FIG. 32 also shows how the drain current of the MFMIS changes when the aforementioned RS is changed. As shown in FIG. 32, the drain current of the MFMIS also shows counterclockwise hysteresis. As for the effect provided to the drain current characteristics by the area ratio RS, it is understood that the larger the area ratio RS is, the more collapsed the hysteresis of the drain current becomes in the vertical direction and the lower the saturation drain current value becomes. To be more specific, there is a trend wherein the change of the drain current slows down against the change of the applied voltage.

Figure 33:
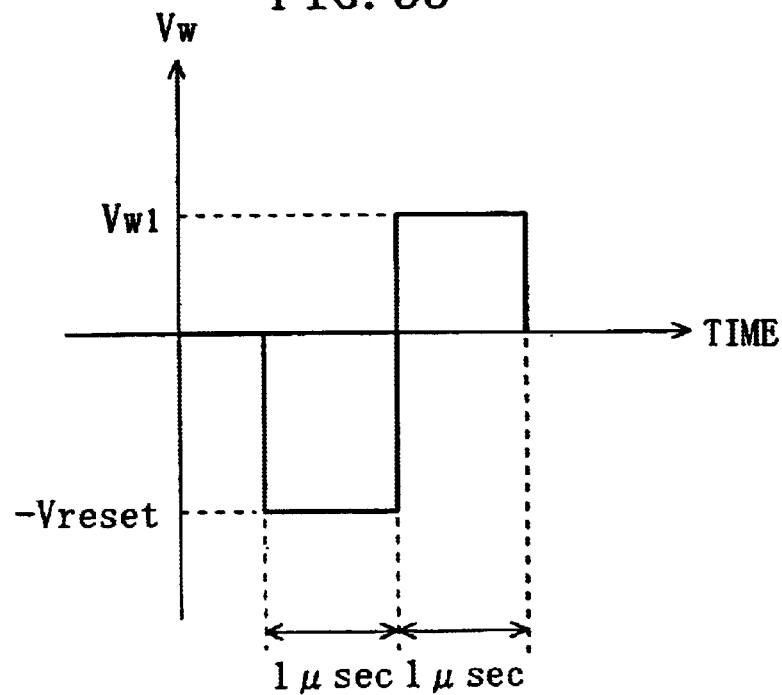
FIG. 33 is a diagram showing an example of a waveform of a load control signal used when load in the neuron element of the fourteenth embodiment.

FIG. 33 is a diagram showing an example of a waveform of a load control signal used when a load is given in the neuron element 101 of this embodiment. This example is characterized by applying –Vreset before applying the voltage of Vw1 as the load control signal as the load control signal. This is for the purpose of allowing a load coefficient to be controlled as linearly as possible according to the voltage of the next load control signal. It is –Vreset=–10 V in this embodiment for instance.

Figure 34:
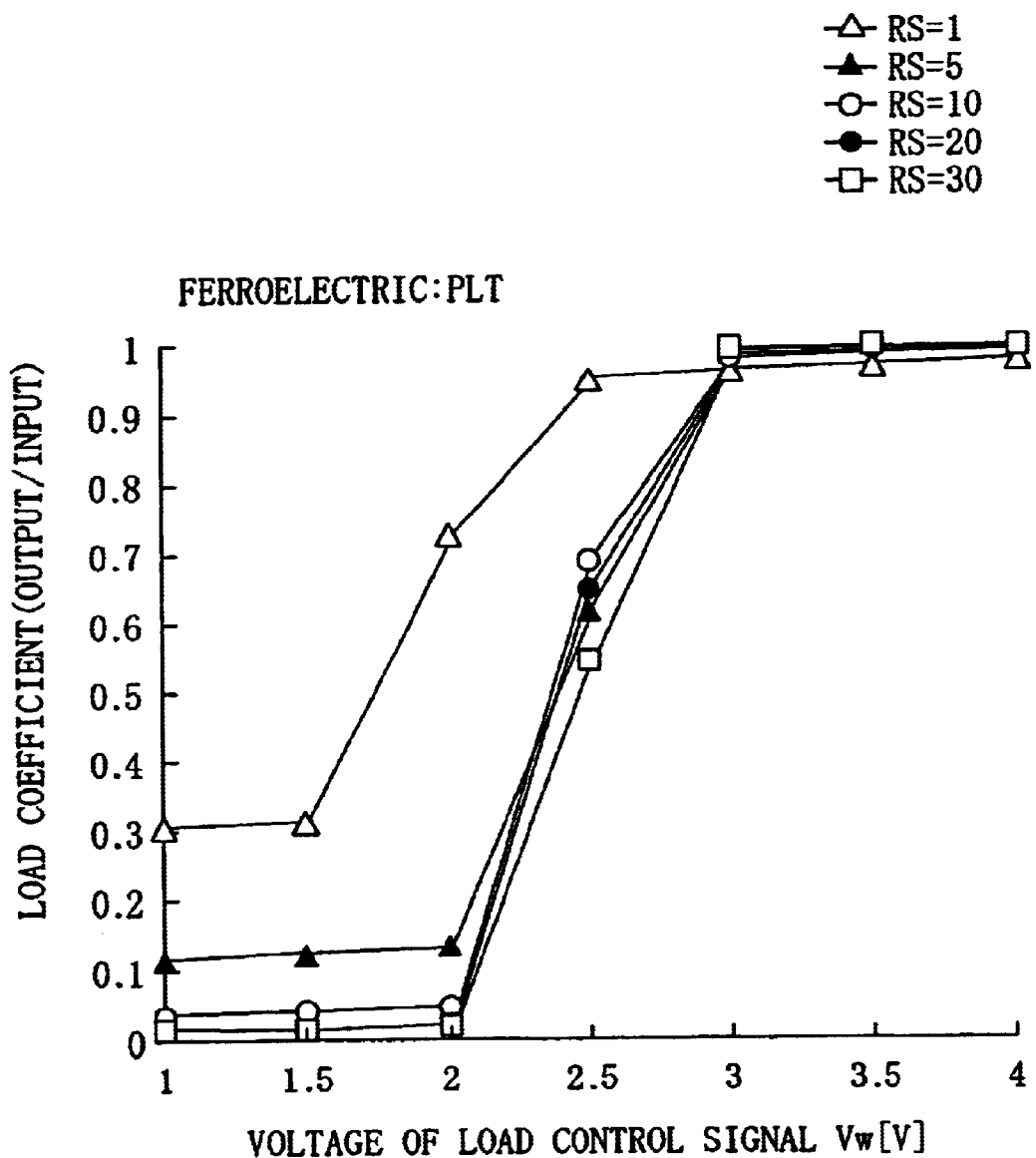
FIG. 34 is a diagram showing change in a load coefficient to the voltage of the load control signal in the synapse portion of the fourteenth embodiment.

FIG. 34 is a diagram showing change in the load coefficient to the voltage Vw of the load control signal in the synapse portion of this embodiment.

The horizontal axis of the graph in FIG. 34 is the voltage of the load control signal described as to the load signal control pulse in FIG. 33, and the vertical axis shows the ratio between the voltage Vout outputted to the neuron portion 102 and the voltage of the output signal Vin1 inputted from the aforementioned neuron inputted from the input terminal 121 in FIG. 26. Hereafter, the ratio of the voltages between this input signal and the output signal is represented as a load ratio.

As is apparent from FIG. 34, the load coefficient of the synapse portion in the case of RS=1 does not become 0.3 or smaller, and the operation sufficiently proper as the load is not obtained. It is because, as effective permittivity of the material called the PLT is far larger than the SiO$_2$ comprising the serially connected capacitor of NMOS, most of the voltage of the load control signal Vw is not applied to the ferroelectric and consequently little polarization arises, so that there is little change in the electric potential $V_{FG}$ remaining in the floating electrode even if the load control signal Vw is changed. As a matter of course, it is possible to improve fluctuation characteristics of such a load coefficient by rendering the resistance value of the fixed resistive element 119 relatively small. As means for changing the resistance value of the fixed resistive element 119, there are effective techniques such as widening the gate width of the NMISFET comprising the fixed resistive element 119, shortening the gate width, and increasing a carrier density of the channel area. In the case of using PZT as with the ferroelectric film in the MFIS of the past example, a further dielectric constant (approximately 1,000) of the PZT is significantly higher than the PLT, so that the above malfunction becomes further conspicuous.

However, as a result of consideration by the inventors hereof, it was found out that, even in the case of using the ferroelectric of such a high permittivity, the operation of the synapse portion becomes stable by rendering the area of the ferroelectric film smaller and the area ratio RS (=SI/SF) larger. For instance, it is possible, by rendering the area ratio RS at least two or more, to render a fluctuation range of the load coefficient wider to the extent that it will not impede the operation of the synapse portion.

Furthermore, as shown in FIG. 34 for instance, it was found out that the fluctuation range of the load coefficient became very wide by rendering the area ratio RS five or more, and the fluctuation characteristics of such a load coefficient drew almost the same curve very stably even if the RS became 30. It indicates that, in the case of manufacturing the device of this embodiment, the load coefficient can be very stably reproduced even if the size of the ferroelectric capacitor or that of the MISFET is not a predetermined size due to variations in working accuracy and so on and the area ratio RS changes.

In the case of this embodiment, it is possible to stably modulate the load coefficient from 0 to 1 in the range of Vw=2 to 3 (V) by rendering it as RS=10. Moreover, this modulation characteristic has linearity for changing almost like a straight line, it is further advantageous in the aspect of controllability of exponential change of the past examples.

In this embodiment, as a control accuracy of the voltage of the load control signal is of ±50 mV for instance, it is possible to set the load coefficient in approximately 10 stages with the load control signal. As opposed to it, while it was very difficult to control a charge amount in the synapse circuit of the past examples since it used the tunnel current, it is possible to easily obtain the load coefficients of multiple stages with the ferroelectric gate transistor 120 of the present invention.

Furthermore, in this embodiment, it is possible to obtain the synapse circuit capable of implementing the very stable load coefficient for a working error of the process by adopting the MFMIS structure as the ferroelectric gate transistor 120 and rendering the value of the area ratio RS (=SI/SF) large enough.

From a viewpoint of a driving voltage, the synapse circuit of this embodiment (synapse portion 103) can control the load coefficient with the driving voltage of 2 to 3 V, it is possible to implement the voltage significantly lower than the synapse circuit of the past examples utilizing a tunnel phenomenon.

As described above, the neuron element 101 of this embodiment has the synapse portion 103 for multiplying the input voltage by the load and outputting it by means of voltage distribution between the ferroelectric gate transistor 120 and the fixed resistance element 117 so as to implement the synapse circuit of the low voltage, high accuracy and good controllability.

At this time, it became apparent that the operation of the synapse circuit becomes a proper value and the load coefficient can be modulated approximately between 0 and 1 by rendering the area ratio RS (=SI/SF) of the channel area to the ferroelectric capacitor area larger and rendering the capacity of the ferroelectric capacitor 115 constituting the ferroelectric gate transistor 120 smaller than the capacity between the gate and the substrate of the NMISFET 113.

Furthermore, it was also found out that it is possible, by rendering the area ratio RS, that is, the capacity ratio sufficiently small, to implement the synapse circuit for operating stably with very little change against a dimensional error in the process.

Moreover, while this embodiment was described as to the case where the electric potential VL of the electric potential prescription terminal 125 in FIG. 25 is 0 V, it is also possible to render the electric potential VL as the negative electric potential and thereby output the negative voltage as the input to the neuron portion 102. In this case, when providing so-called vMOS to the neuron portion 102, such a signal gives the effect that makes ignition of the neuron portion 102 difficult. To be more specific, it operates as the synapse for curbing the ignition.

In addition, while this embodiment has the configuration wherein the ferroelectric gate transistor 120 (MFMIS device) combining the NMISFET 113 and the ferroelectric capacitor 115 is constituted and the input signal Vin1 is inputted from the drain region of the ferroelectric gate transistor 120, it is also possible to have the synapse portion 103 operate properly by connecting the resistor to the drain side of the ferroelectric gate transistor 120 and inputting the input signal from another terminal of the resistor. In that case, as the load coefficient of the synapse portion becomes reverse of the operation of this embodiment for the load control signal, high and low of the voltage of the input signal should be reversed, such as inputting the load control signal of low voltage in the case of rendering the output larger.

In addition, it can be easily inferred from analogy of the description so far that, in the synapse portion 103 of this embodiment, the voltage of the output signal can be set in a desired range by optimizing each resistance value as appropriate whether the resistor is connected to the drain or the source of the ferroelectric gate transistor 120.

Moreover, while this embodiment provides the NMISFET as the fixed resistance element 117, the same effect can also be exerted by implementing the fixed resistance element with another element.

In addition, while this embodiment has the ferroelectric gate transistor 120 comprised of the NMISFET 113 and the ferroelectric capacitor 115, the ferroelectric gate transistor of the present invention can also be constituted by a combination of the ferroelectric capacitor and the PMISFET. Even in the case of using the PMISFET, it is possible to implement the neuron element for, regarding the operation, functioning on the same operational principle as this embodiment even though there is a difference in polarity from the NMISFET.

In addition, while this embodiment was described as to the example of constituting the neuron portion 102 with the vMOS, the present invention is primarily characterized by the configuration of the synapse portion 103, and so almost the same effect as this embodiment can be obtained by placing in the neuron portion 102 the element for changing the output at a certain threshold or higher (or the threshold or lower) for a plurality of voltage inputs.

Embodiment 15

The neuron element of this embodiment is primarily characterized by using bismuth titanate (hereafter, BIT) as the ferroelectric material of the ferroelectric gate transistor (MFMIS) constituting the synapse portion 103 of the neuron element 101 shown in FIG. 25. Accordingly, the basic configuration of the neuron element is also as shown in FIG. 25 in this embodiment.

Figure 35:
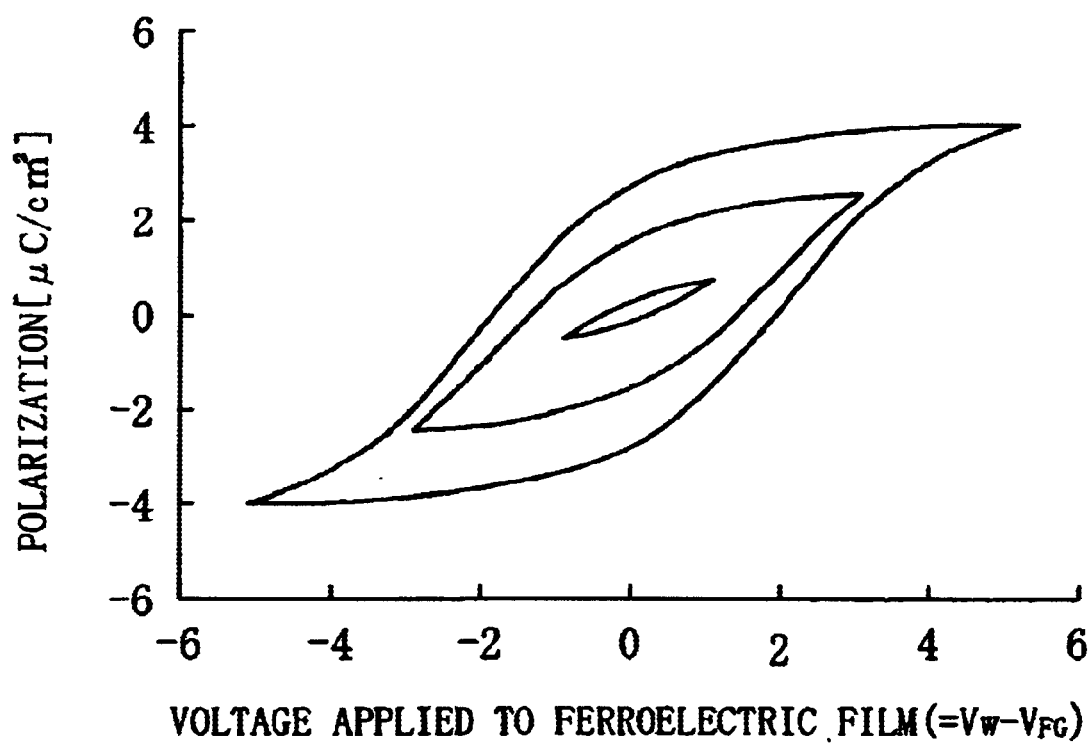
FIG. 35 is a diagram showing polarization hysteresis characteristics of BIT used in the fifteenth embodiment of the present invention.

FIG. 35 is a diagram showing the polarization hysteresis characteristics of the BIT used in the fifteenth embodiment of the present invention. As shown in FIG. 35, the bismuth titanate is characterized by having a smaller polarization value compared to the PLT used as the ferroelectric material in the fourteenth embodiment. The BIT of this embodiment has a residual polarization value of approximately 3 $\mu C/cm^2$ for instance.

Figure 36:
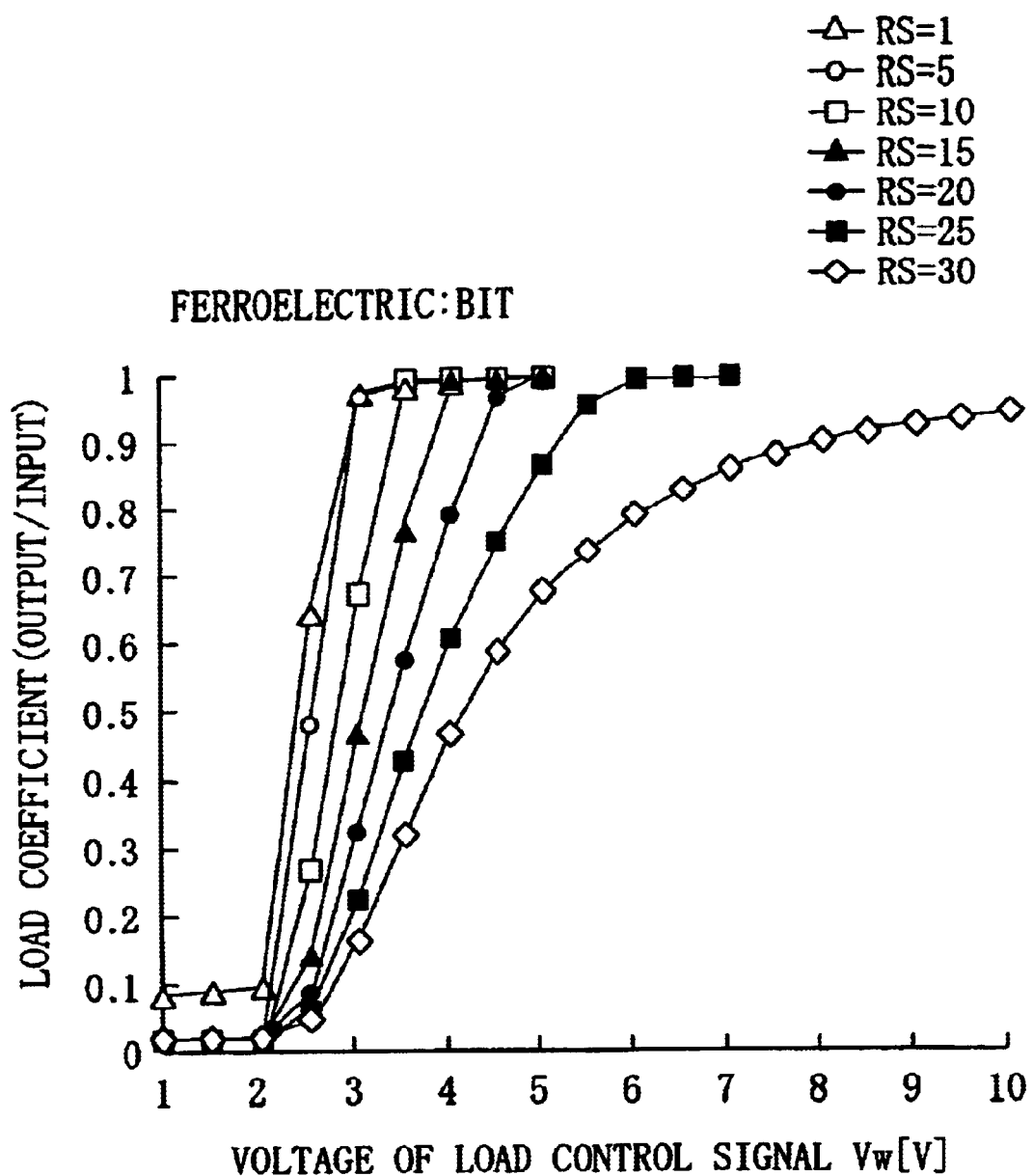
FIG. 36 is a diagram showing the correlation between the voltage of the load control signal in the synapse portion of the fifteenth embodiment and the load coefficient set thereby by rendering an area ratio RS as the parameter.

FIG. 36 is a diagram showing a correlation between the voltage of the load control signal in the synapse portion 103 of this embodiment and the load coefficient set thereby by rendering the area ratio RS as the parameter. While the synapse portion 103 of the fourteenth embodiment changed the load control coefficient from 0 to 1 in the range where the load control signal is 2 to 3 V, that is, to the extent that the difference from the resistance voltage low voltage is 1 V or so, this embodiment allows the change of the load coefficient to be moderate in the case where the area ratio RS (=SI/SF) which is the ratio between the channel area of the MISFET and the ferroelectric capacitor area in the ferroelectric gate transistor is rendered larger.

As shown in FIG. 36, if it is RS=25, the load coefficient changes moderately from 0 to 1 to the extent that the voltage of the load control signal changes from 2 V to 6 V. To be more specific, the load coefficient can be adjusted more delicately. According to this embodiment, in the case where control accuracy of the voltage of the load control signal is ±50 mV for instance, it is possible to set the load coefficient in approximately 40 stages with the load control signal. That is to say, this embodiment allows the load coefficient to be controlled more delicately than the synapse portion of the fourteenth embodiment.

In addition, while the synapse portion of the fourteenth embodiment shows a tendency that the load becomes stable when the area ratio RS is 5 or more, the synapse portion of this embodiment has the characteristic that inclination of the change in the load coefficient becomes moderate starting when the area ratio RS is 10 or more. Thus, the reason that the synapse circuit of this embodiment allows the load coefficient to be controlled delicately can be explained by a balance between a Vg–Id characteristic (correlation between the gate bias and the drain current) of the NMISFET 113 constituting the ferroelectric gate transistor 120 and the charge amount induced by the polarization of the ferroelectric capacitor 115. Consequently, it is possible, according to this embodiment, to obtain such a characteristic within the range of the area ratio RS described as to FIG. 35 by using the ferroelectric material of the small polarization value.

The synapse portion 103 of this embodiment operates according to the voltage distribution between the NMISFET 113 and the fixed resistance element 117. If electric resistance of the NMISFET 113 is R and that of the fixed resistance element 117 is RO, a load coefficient CW is given by the following formula (6).

$$CW=RO/(R+RO) \quad (6)$$

Here, when the modulation range of the load coefficient is set at 0.1 to 0.9, the value to which R should change is given by the following formula (7).

$$RO/9 \leq R \leq 9RO \quad (7)$$

To be more specific, R requires the modulation of approximately two digits.

Here, the change in the gate voltage required to generate a current change of two digits or more which is the threshold voltage or higher in the NMISFET 113 is ΔVg. ΔVg is 0.2 V in this embodiment for instance.

It is possible to set the load coefficient as nonvolatile by generating this current change amount ΔVg with the electric charge due to the polarization of the ferroelectric capacitor 115.

Here, the polarization value of the ferroelectric capacitor 115 after giving a certain load control signal is PW and the area of the ferroelectric capacitor 115 is SF, the charge amount QW induced to the floating gate shown in FIG. 30 can be calculated by the following formula (8).

$$QW=PW \cdot SF \quad (8)$$

On the other hand, when a capacitance of the gate portion of the NMISFET 113 constituting the ferroelectric gate transistor 120 is CI, the electric potential $V_{FG}$ of the floating gate generated by the load control signal in FIG. 30 can be calculated by the following formula (9).

$$V_{FG}=QW/CI \quad (9)$$

The load coefficient can be controlled most efficiently when twice the electric potential $V_{FG}$ of the floating gate represented by the formula (9) just coincides with ΔVg.

To be more specific, it is desirable to have the condition wherein the following formula (10) holds.

$$\Delta Vg=2V_{FG} \quad (10)$$

Here, if a specific inductive capacity of the gate dielectric film of the NMISFET 113 is ∈I, and the thickness is tI, CI is given by the following formula (11).

$$CI=\epsilon O \cdot \epsilon I \cdot SI/tI \quad (11)$$

The optimum area ratio RS (optimum RS) is obtained by the following formula (12) if the formulas (8), (9), (10) and (11) are put together and furthermore, the relationship of RS=SI/SF is used.

$$RS=2PW \cdot tI/(\Delta Vg \cdot \epsilon O \cdot \epsilon I) \quad (12)$$

Figure 37:
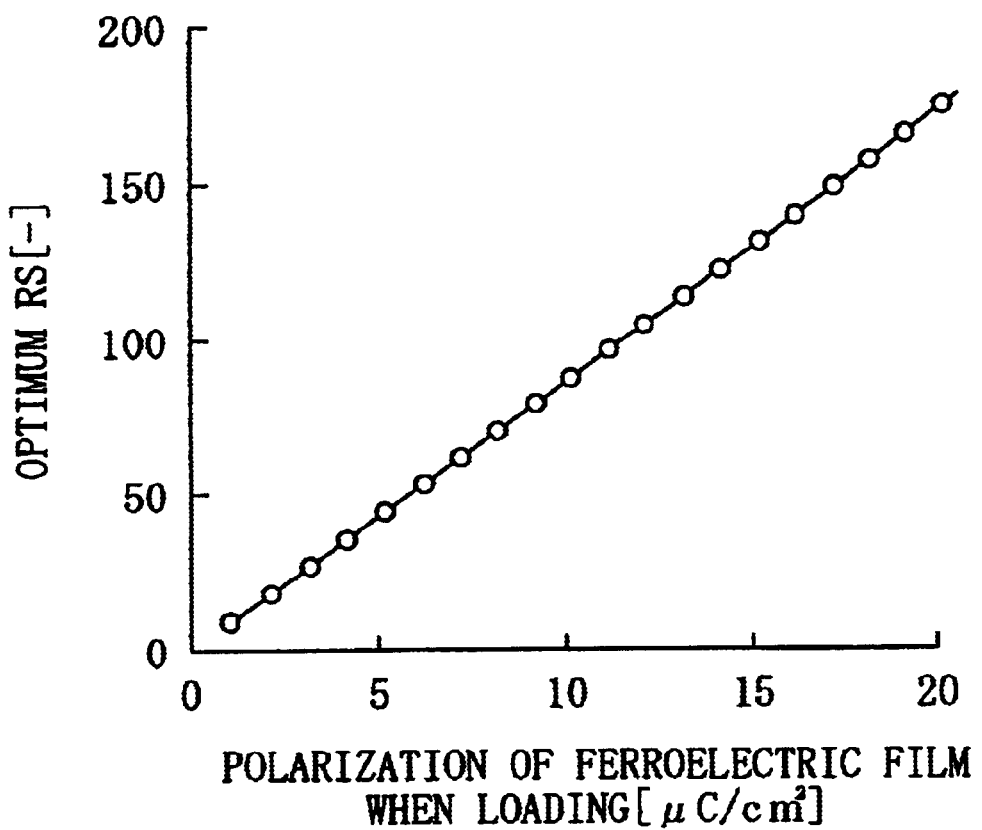
FIG. 37 is a diagram showing the correlation between an optimum RS acquired according to formula (12) and a polarization value of a ferroelectric film.

FIG. 37 is a diagram showing the correlation between the optimum RS acquired according to the formula (12) and the polarization value of the ferroelectric film. As is understandable from FIG. 37, the optimum RS becomes very large if the polarization value of the ferroelectric film becomes large. As for the BIT which is the ferroelectric material of this embodiment, the maximum value of the polarization value (saturation polarization value) is 3 $\mu C/cm^2$ for instance, and so the area ratio RS of 26 or so is optimum. This coincides very much with the results shown in FIG. 36. On the other hand, in the case of the ferroelectric material of which residual polarization is large such as the PLT described in the fourteenth embodiment, it is possible to obtain a small polarization value PW by driving in a state where the ferroelectric is not saturated as shown in FIG. 31, that is, it within the voltage range operating in a minor loop. To be more specific, it is not necessary to set it at an extremely large area ratio RS. It means that it is not necessary to render the channel area of the NMISFET 113 extremely large when forming the ferroelectric capacitor 115 in minimum working dimensions. That is to say, it is a very important finding in that the occupied area of the cell can be rendered as small as possible. Moreover, while the optimum area ratio of this embodiment reflects the optimum capacity ratio in practice, the area ratio is rendered as the parameter since it is important in designing the semiconductor.

As a result of review by the inventors hereof, however, such behavior of the minor loop has an aspect of unstable operation such as significant change in the polarization amount due to a slight change in the applied voltage, and so it is desirable to use the ferroelectric in the loop as close to saturation as possible. To be more specific, the method of stably modulating the load coefficient in a narrow voltage range as described as to the fourteenth embodiment is advantageous in the case of using the ferroelectric material of which polarization amount is large, and inversely it is advantageous to use the ferroelectric material of which polarization amount is small in the case where it is desirable to delicately modulate it in a wide voltage range. In this case, it is possible to perform load modulation most effectively by setting the optimum RS according to the relational expression shown in FIG. 37.

On the other hand, it is understood from the characteristic shown in FIG. 36 that the load coefficient hardly reaches 1 in the case where the area ratio RS is excessively larger than the optimum RS. Inversely, in the case where the area ratio RS is smaller than the optimum RS, it becomes closer to the operation of the synapse portion 103 of the fourteenth embodiment, so that the proper range of the voltage of the load control signal becomes narrower and the synapse operation (control) at the low voltage becomes implementable.

As described above, as for the synapse circuit of the neuron element of this embodiment, it is possible to lucidly design the optimum synapse circuit (synapse portion 103) by constituting the ferroelectric gate transistor 120 having the area ratio RS (optimum RS) optimized by the formula (12). And it is possible, by using the synapse circuit optimized by this method, to render the change according to the voltage of the load control signal of the load coefficient moderate. It is possible, due to this effect, to set the load coefficient in 40 stages with the load control signal, thus allowing the load coefficient to be set more delicately than the synapse circuit of the fourteenth embodiment.

Moreover, while the cases of using the PLT and using the BLT as the ferroelectric material were described in the fourteenth and fifteenth embodiments, it is also possible, by using other ferroelectric materials, to obtain the synapse circuit capable of setting the desired load coefficient through the optimization as in the fifteenth embodiment. As for the ferroelectric materials to be used for the present invention, the synapse circuit capable of setting the load coefficient in multiple stages can be implemented, as with the fourteenth and fifteenth embodiments, by the PZT (maximum residual polarization—20 $\mu C/cm^2$), the titanic acid lead zirconate/lanthanum (maximum residual polarization—30 $\mu C/cm^2$), the tantalic acid strontium bismuth (SBT: maximum residual polarization—10 $\mu C/cm^2$), barium titanate (BTO: maximum residual polarization—10 $\mu C/cm^2$), and barium titanate strontium (BST: maximum residual polarization—10 $\mu C/cm^2$) described in the past examples, and the ferroelectrics having solved therein Nb and so on and rare earth elements other than the fourteenth and fifteenth embodiments.

Embodiment 16

Figure 38:
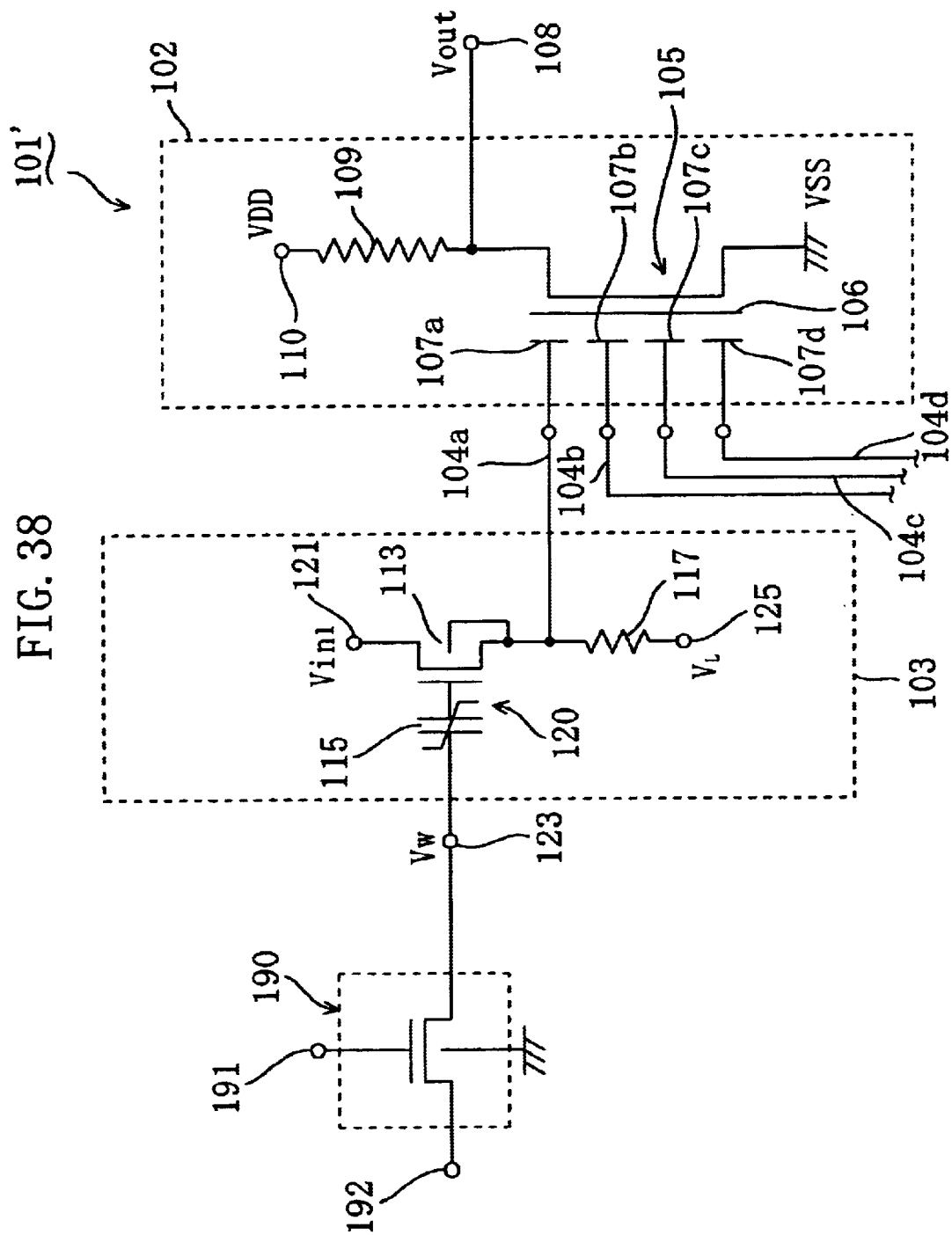
FIG. 38 is an equivalent circuit diagram of the neuron element related to the sixteenth embodiment of the present invention.

FIG. 38 is an equivalent circuit diagram of the neuron element related to the sixteenth embodiment of the present invention.

As shown in this diagram, the neuron element 101' of this embodiment has the structure wherein a selective transistor 190 is connected to the load signal terminal 123 of the synapse portion 103 in addition to the neuron element 101' of the fourteenth embodiment shown in FIG. 25. A control signal terminal 191 is connected to the gate of the selective transistor 190, the substrate area is connected to the ground, the load signal terminal 123 of the synapse portion 103 is connected to the source, and a load input terminal 192 is connected to the drain.

According to this embodiment, it is possible, by providing such a selective transistor 190 to the neuron element 101' in the case of arranging the neuron elements 101' like the array as shown in FIG. 21, to efficiently control the load coefficient of each neuron element 101' while constituting a neural network by using the control signal line (the first control signal line 83 shown in FIG. 21) extending along the row and the control signal line (the second control signal line 84 shown in FIG. 21) extending along the line.

In addition, even if fluctuation of the voltages of the input wirings 104a to 104d occurs, the voltage fluctuation is distributed among the ferroelectric capacitor 115, the gate capacity of the NMISFET 113 and the drain/source capacity of the selective transistor 190 due to existence of the selective transistor 190, and so it is possible to curb the fluctuation of the polarization of the ferroelectric capacitor 115.

Figure 39:
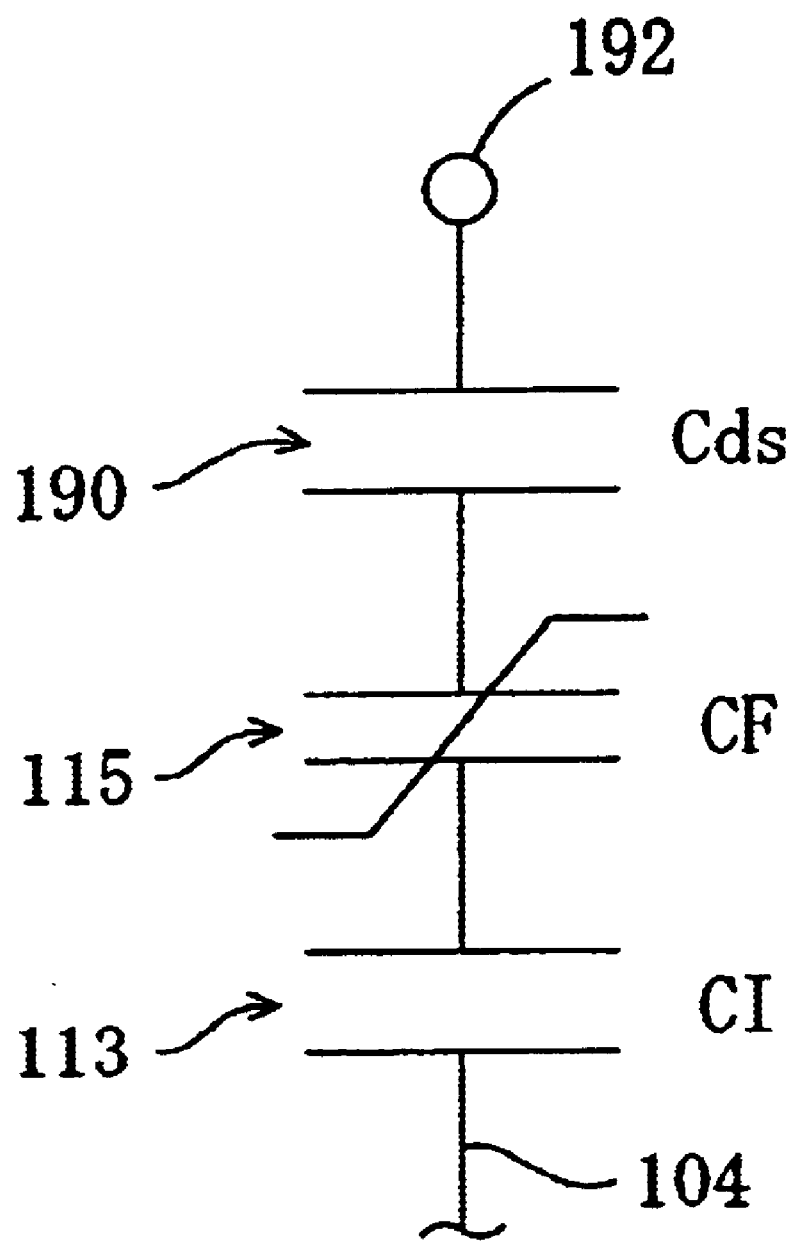
FIG. 39 is an equivalent circuit diagram wherein only capacitor components of a ferroelectric gate transistor and a selective transistor in the fifteenth embodiment are taken out.
Figure 40:
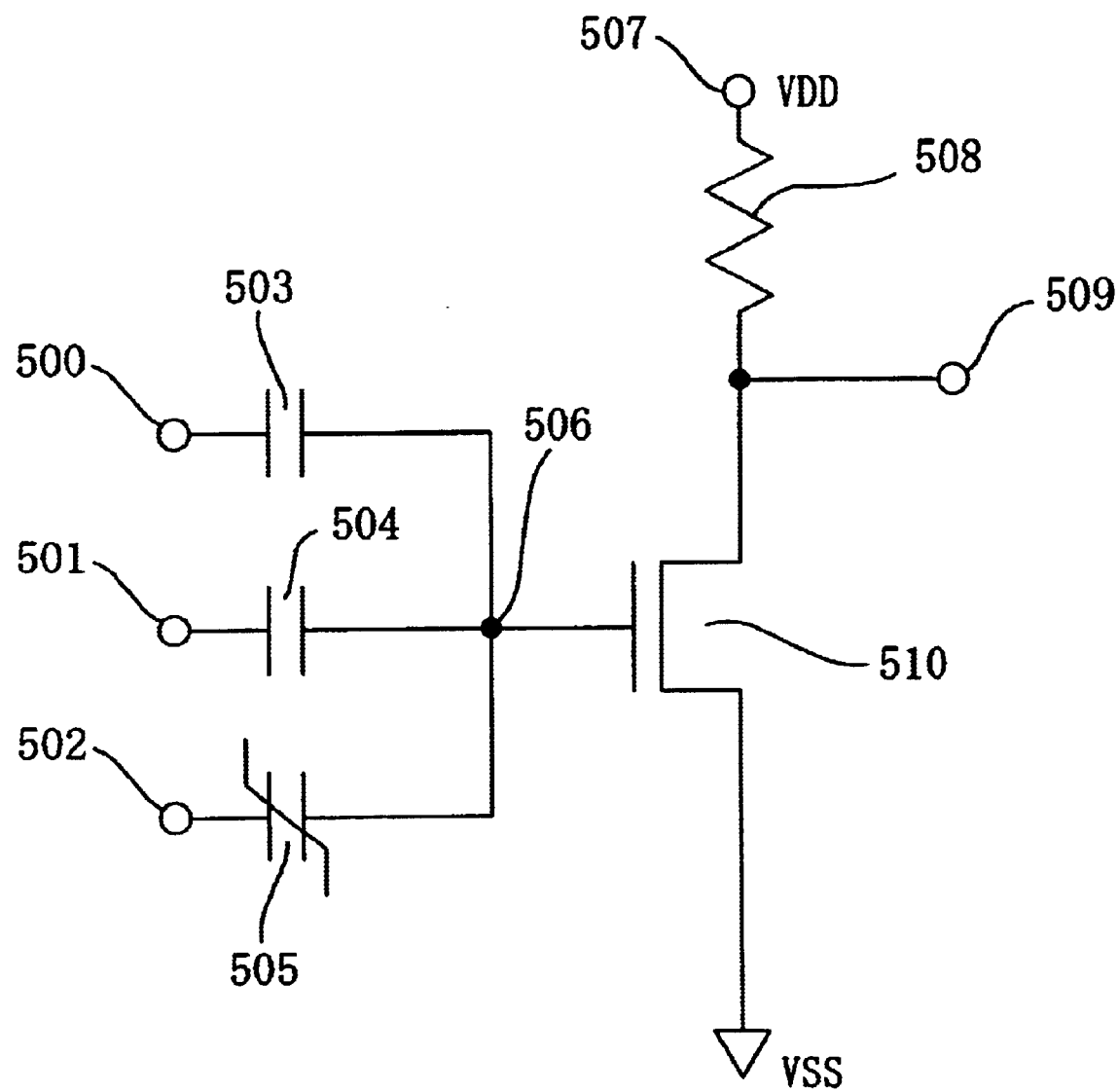
FIG. 40 is an equivalent circuit diagram of the neuron element related to a second past example described in a past patent journal.
Figure 43A:
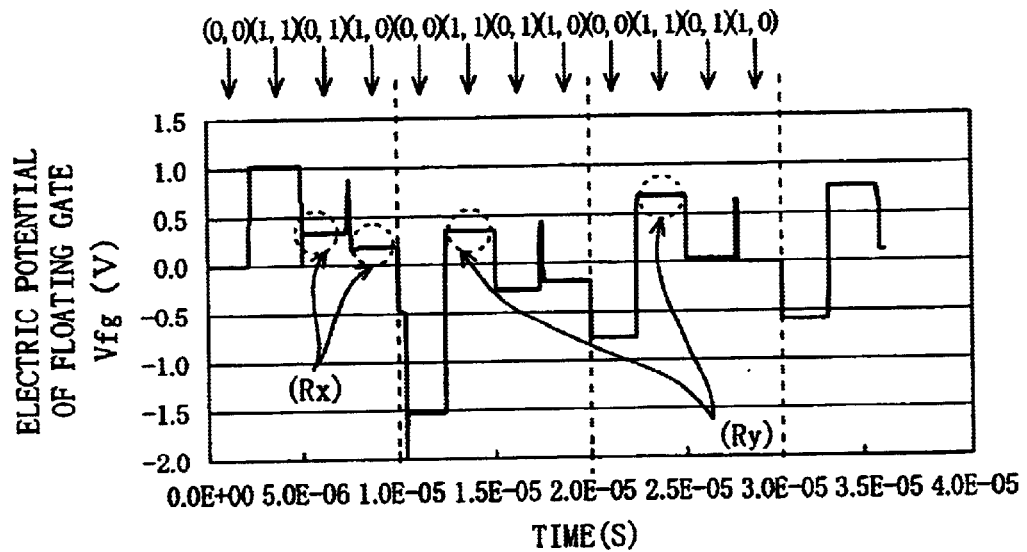
FIGS. 43A and B are a timing chart showing the time variation of the electric potential of the floating gate of the neuron element related to the past example and a timing chart showing the time variation of the voltage applied to the ferroelectric film in order respectively.
Figure 43B:
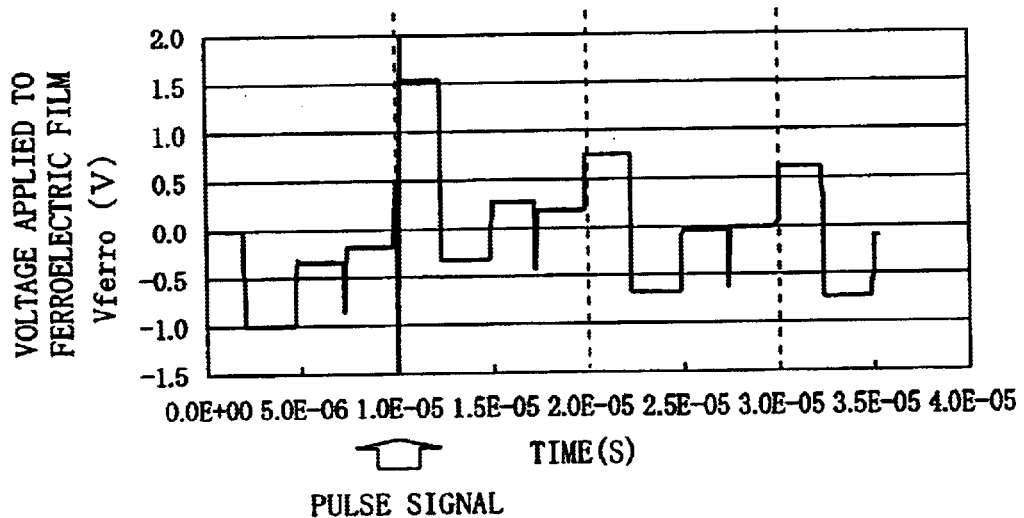
Figure 44:
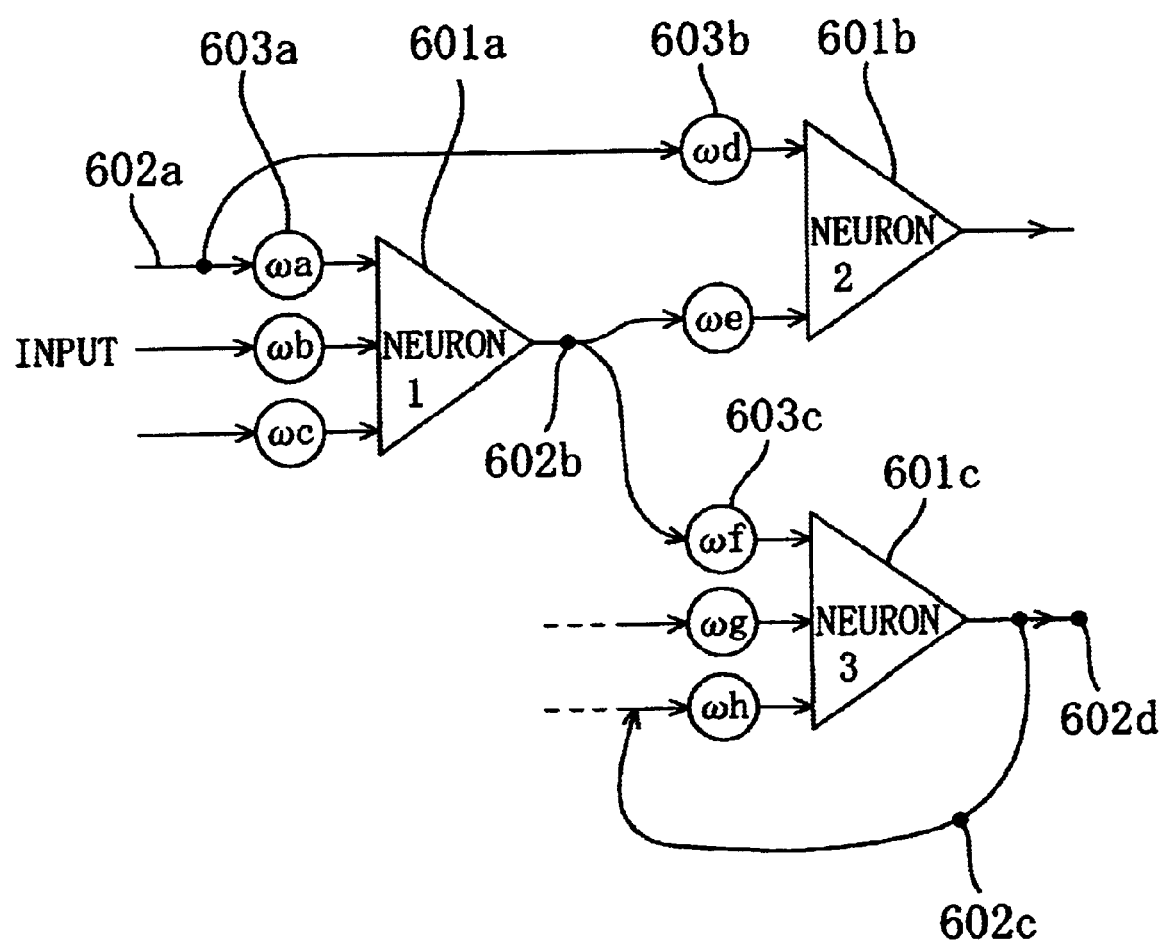
FIG. 44 is a block circuit diagram showing the configuration of a basic unit of the brains which is simplified.
Figure 45:
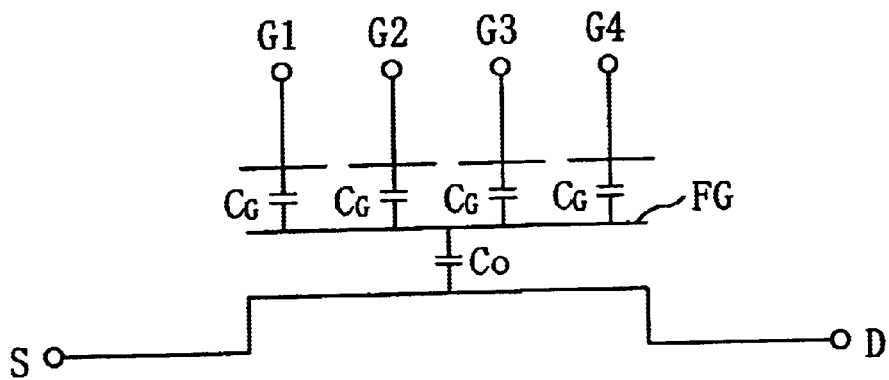
FIG. 45 is a schematic diagram showing the structure of the vMOS related to the past example which is simplified.
Figure 46:
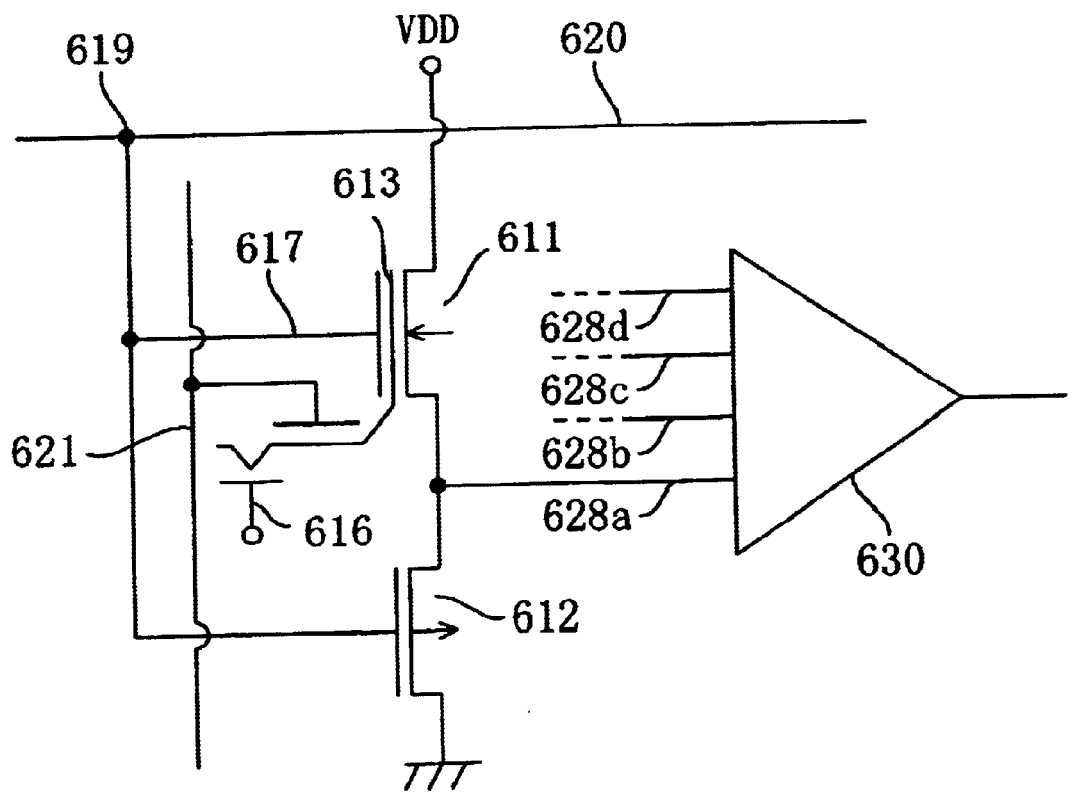
FIG. 46 is a schematic diagram showing the configuration of the neuron element of the past example described in the patent journal.
Figure 47:
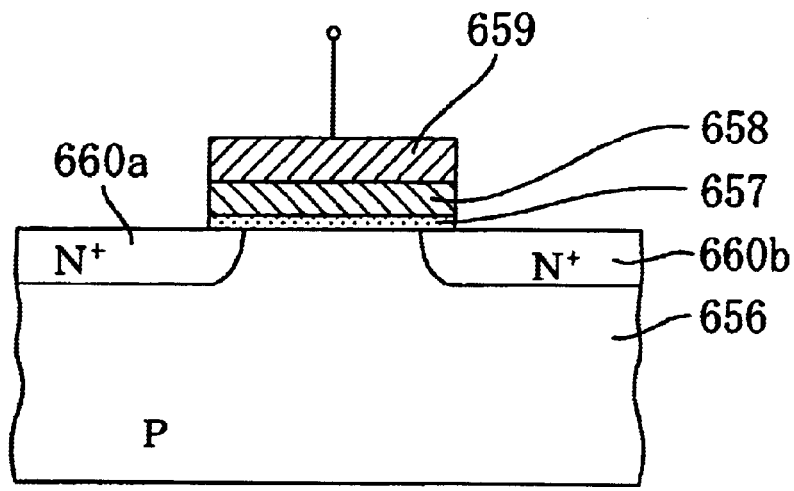
FIG. 47 is a sectional view showing the ferroelectric gate transistor structure described in the above patent journal.
Figure 48:
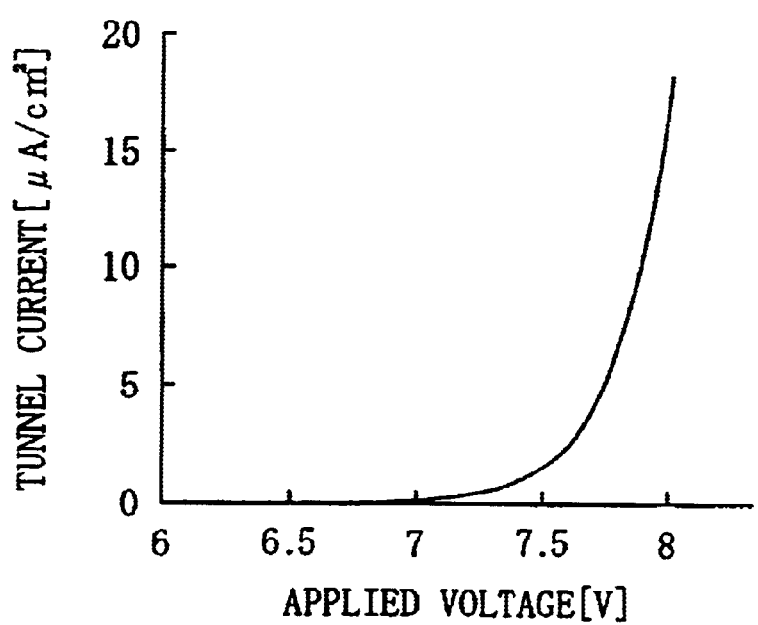
FIG. 48 is a diagram showing a correlation between an applied voltage and a tunnel current when an electron tunnels a thermal oxidation silicon film of 10 nm thickness.

FIG. 39 is an equivalent circuit diagram wherein only capacitor components of the ferroelectric gate transistor 120 and the selective transistor 190 are taken out. As shown in this diagram, when the capacity of the gate portion of the NMISFET 113 is CI, the capacity of the ferroelectric capacitor 115 is CF, and the drain/source capacity of the selective transistor 190 is Cds, it is a circuit configuration wherein the capacities CI, Cds and CF are serially connected between the input wiring 104 and the load input terminal 192.

As for the ferroelectric gate transistor, it is desirable, for the sake of writing to the ferroelectric capacitor 115, that the capacity CF of the ferroelectric capacitor 115 and the capacity CI of the gate portion of the NMISFET 113 are about the same. When both capacities are the same, however, the voltage fluctuation of the input wiring 104 connected to the substrate of the NMISFET 113 influences the polarization state of the ferroelectric capacitor 115. At that time, if the selective transistor 190 is OFF, the drain/source capacity Cds is small, and so the voltage is hardly distributed to the ferroelectric capacitor 115 and a large portion of it is distributed to the drain/source capacity Cds. As a result of it the polarization state of the ferroelectric capacitor 115 is hardly disturbed and is maintained.

What is claimed is:

1. A semiconductor device comprising:

a first semiconductor layer;

a first MISFET having a first dielectric film formed on said first semiconductor layer, a first gate electrode formed on said first gate dielectric film, first and second P type diffusion regions formed in the areas located at both sides of said first gate electrode in said first semiconductor layer;

a second semiconductor layer;

a second MISFET having a second dielectric film formed on said second semiconductor layer, a second gate electrode formed on said second gate dielectric film, first and second N type diffusion regions formed in the areas located at both sides of said second gate electrode in said second semiconductor layer;

a ferroelectric capacitor having a first electrode connected to said first and second gate electrodes in common, a second electrode opposite the first electrode, and a ferroelectric film intervening between said first and second electrodes;

a first voltage supply portion for supplying the first voltage to the first N type diffusion region of said second MISFET;

a first voltage supply portion for supplying the second voltage which is lower than said first voltage to the first P type diffusion region of said first MISFET; and a voltage output portion connected in common to the second P type and N type diffusion regions of each of said MISFETs for outputting the output voltage according to the voltage inputted to said second electrode of said ferroelectric capacitor, and functioning as an electric potential generating device.

2. The semiconductor device according to claim 1, wherein said second gate electrode is electrically connected to the first P type diffusion region of said first MISFET.

3. The semiconductor device according to claim 1, wherein said first gate electrode is electrically connected to the first N type diffusion region of said second MISFET.

4. The semiconductor device according to claim 1, wherein said first P type diffusion region and a part of the area excluding said first and second N type diffusion regions in said second semiconductor layer are mutually electrically connected, and said first N type diffusion region and a part of the area excluding said first and second P type diffusion regions in said first semiconductor layer are mutually electrically connected, and said semiconductor device functions as a source follower circuit.

5. The semiconductor device according to claim 4, wherein said first and second MISFETs are enhancement type (normally-off) transistors.

6. The semiconductor device according to claim 1, further having a side wall formed on at least one side of said first and second gate electrodes.

7. The semiconductor device according to claim 1, further comprising a path transistor connected to said second electrode of said ferroelectric capacitor.

8. The semiconductor device according to claim 1, further comprising:

a third semiconductor layer;

a third MISFET having a third gate dielectric film provided on said third semiconductor layer, a third gate electrode provided on said third gate dielectric film, first and second diffusion regions formed in the areas located at both sides of said third gate electrode in said third semiconductor layer;

at least one fourth gate electrode provided opposite said third gate electrode to receive the input signal;

at least one first dielectric film intervening between said third gate electrode and at least one said fourth gate electrode;

a fifth gate electrode provided opposite said third gate electrode and electrically connected to said voltage output portion;

a second dielectric film intervening between said third gate electrode and said fifth gate electrode; and a signal output portion connected to said first diffusion region in said third semiconductor layer for outputting an output signal according to the input signal inputted to said at least one fourth gate electrode, and said semiconductor device functions as a logic transformation circuit.

9. The semiconductor device according to claim 8, further comprising the first and second voltage supply portions, connected to said first and second diffusion regions in said third semiconductor layer, for supplying first and second voltages having a difference in height respectively, wherein a resistor intervenes between said signal output portion and said first voltage supply portion.

10. The semiconductor device according to claim 8, wherein said third MISFET is an NMISFET, is connected to said first and second diffusion regions in said third semiconductor layer, further has the first and second voltage supply portions for supplying the first and second voltages having a difference in height, and there intervenes a fourth MISFET which is a PMISFET having the gate electrode connected to said third gate electrode between said signal output portion and said first voltage supply portion so as to constitute an inverter circuit.

11. The semiconductor device according to claim 10, wherein the threshold voltage of said inverter circuit is between a maximum value and a minimum value of the electric potential induced by the ferroelectric film of said ferroelectric capacitor to the third gate electrode of said third MISFET and the gate electrode of the fourth MISFET.

12. The semiconductor device according to claim 8, wherein the same number, that is, a plurality of at least one said fourth gate electrode and at least one said first dielectric film are provided so that, if a pulse-like voltage having a negative amplitude is applied to the second electrode of said ferroelectric capacitor, a logical relationship between the input signals inputted to a plurality of said fourth gate electrodes and the output signals outputted from said output portion is transformed from NOR to NAND.

13. The semiconductor device according to claim 8, wherein a plurality of semiconductor devices are placed like an array via a switch element.

* * * * *

UNITED STATES PATENT AND TRADEMARK OFFICE
CERTIFICATE OF CORRECTION

PATENT NO. : 6,847,071 B2
DATED : January 25, 2005
INVENTOR(S) : Michihito Ueda et al.

It is certified that error appears in the above-identified patent and that said Letters Patent is hereby corrected as shown below:

Title page,
Item [56], References Cited, FOREIGN PATENT DOCUMENTS, remove "EP 07106528  4/1995"

Signed and Sealed this

Twenty-first Day of June, 2005

JON W. DUDAS
*Director of the United States Patent and Trademark Office*